United States Patent [19]
Shinohe et al.

[11] Patent Number: 5,969,400
[45] Date of Patent: *Oct. 19, 1999

[54] HIGH WITHSTAND VOLTAGE SEMICONDUCTOR DEVICE

[75] Inventors: Takashi Shinohe, Yokohama; Yoshihiro Minami, Tokyo; Ichiro Omura, Yokohama, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/614,340

[22] Filed: Mar. 12, 1996

[30] Foreign Application Priority Data

Mar. 15, 1995  [JP]  Japan ................................ 7-083434
Apr. 20, 1998  [JP]  Japan ................................ 7-095499

[51] Int. Cl.$^6$ ........................................ H01L 23/58
[52] U.S. Cl. .................. 257/492; 257/493; 257/495; 257/170; 257/173
[58] Field of Search .................... 257/497, 493, 257/495, 170, 173, 492, 496

[56] References Cited

U.S. PATENT DOCUMENTS 4,377,816  3/1983  Sittig .............................. 357/13
5,101,244  3/1992  Mori et al. ...................... 357/15
5,162,876  11/1992  Kitagawa et al. .

FOREIGN PATENT DOCUMENTS 63-209161  8/1988  Japan .
1-138759   5/1989  Japan .

*Primary Examiner*—Olik Chaudhuri
*Assistant Examiner*—Douglas A. Wille
*Attorney, Agent, or Firm*—Oblon, Spivak, McClelland, Maier & Neustadt, P.C.

[57] ABSTRACT

A semiconductor device includes a first semiconductor layer of a first conductivity type having first and second main surfaces, a second semiconductor layer of a second conductivity type selectively formed on the first main surface of the first semiconductor layer, the second semiconductor layer including a first region having a relatively high injection efficiency and a second region having a relatively low injection efficiency and the first region being surrounded by the second region, a third semiconductor layer of the first conductivity type formed on the second main surface of the first semiconductor layer, a first electrode selectively formed on the second semiconductor layer of the second conductivity type and connected to at least the first region, and a second electrode formed on the third semiconductor layer of the first conductivity type.

5 Claims, 48 Drawing Sheets

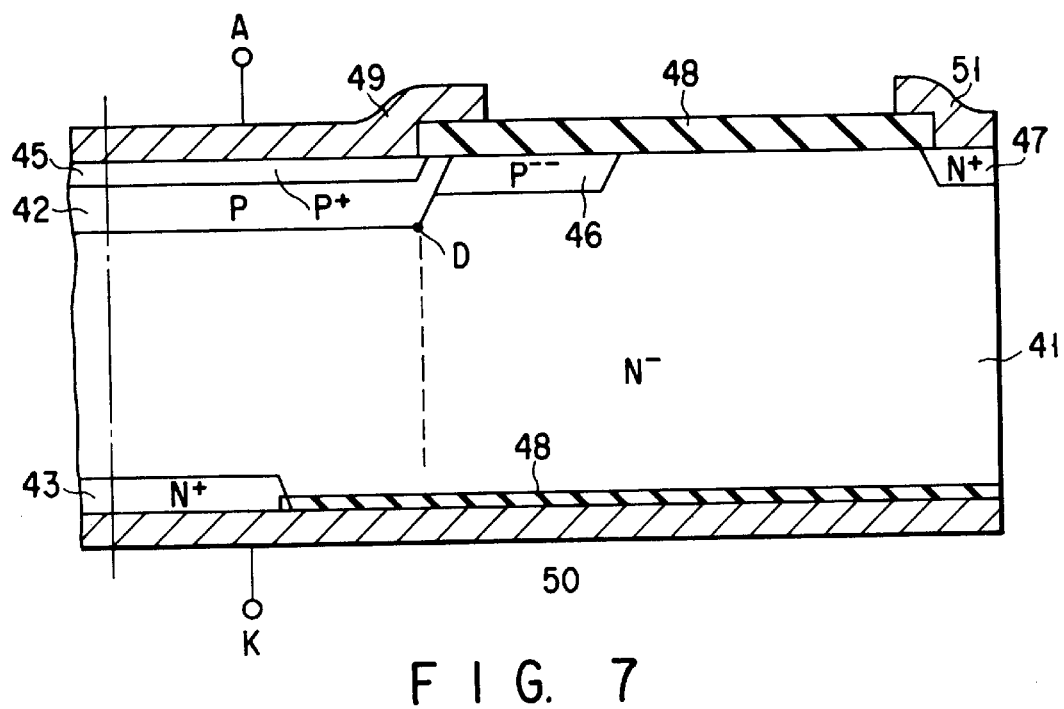
F I G. 7
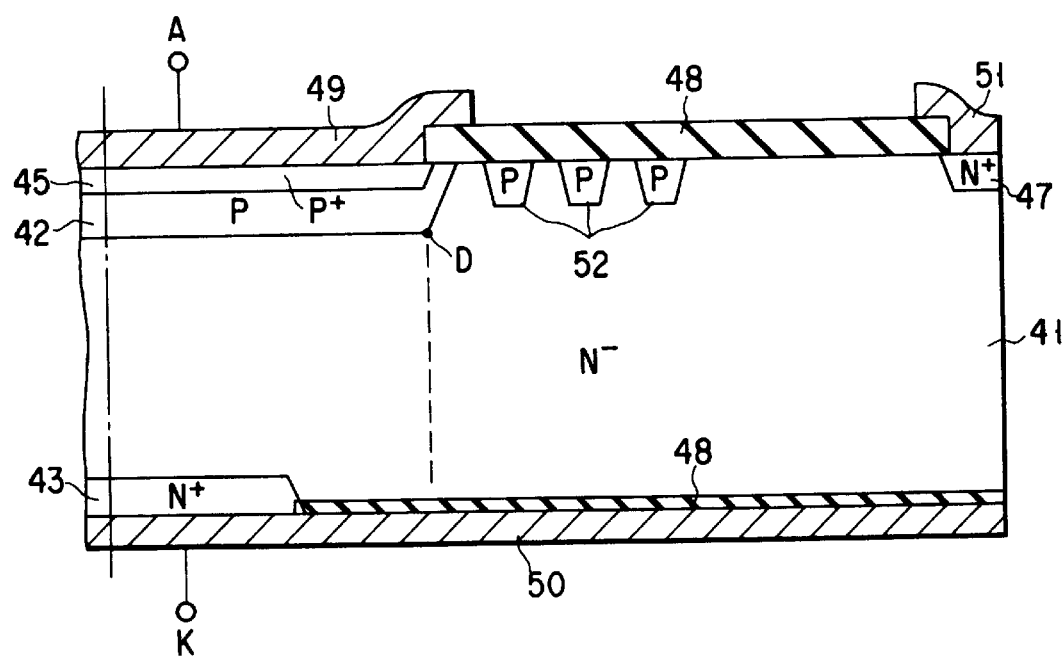
F I G. 8

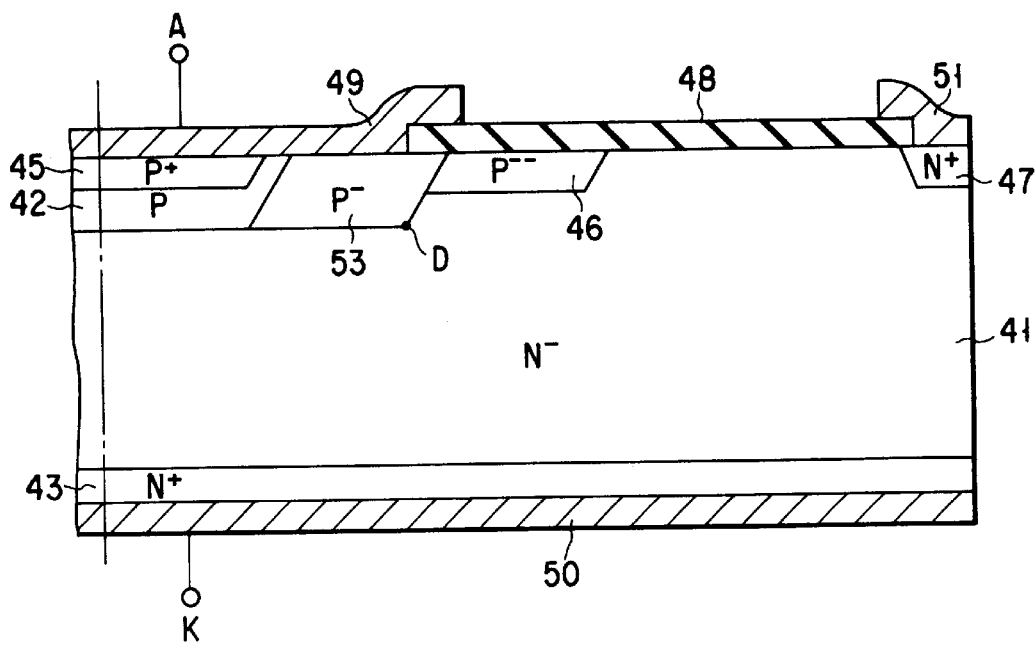
F I G. 9
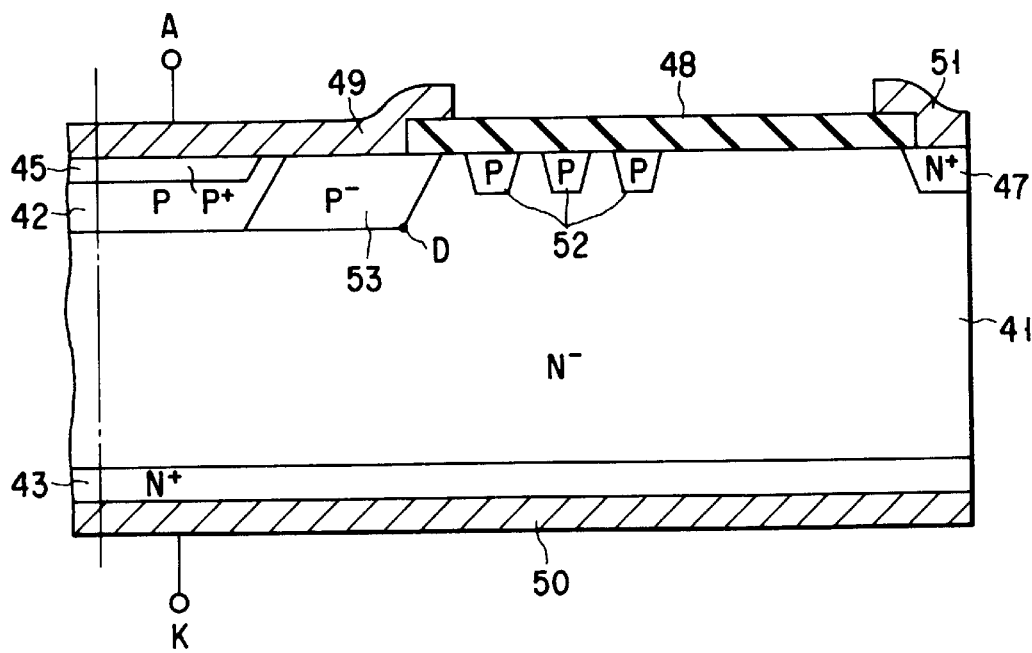
F I G. 10

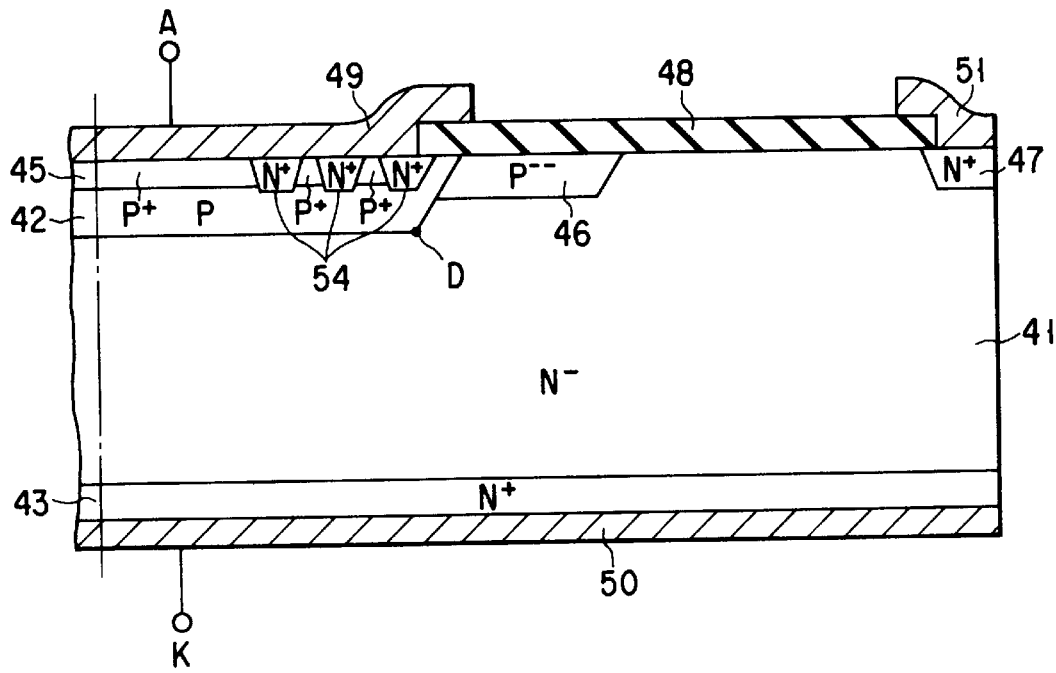
F I G. 11
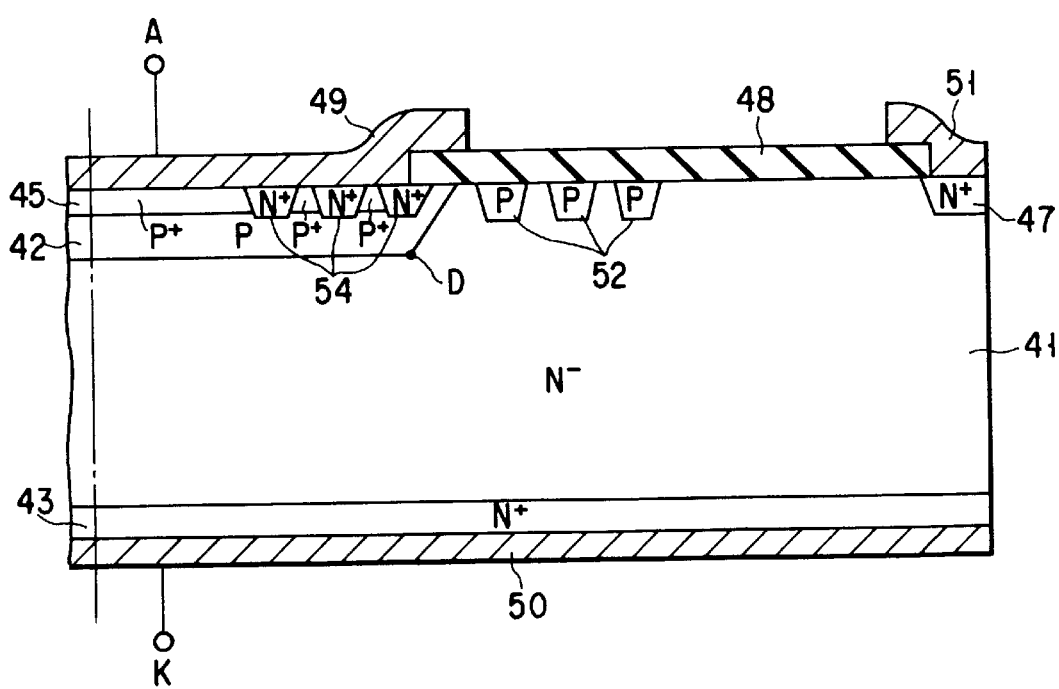
F I G. 12

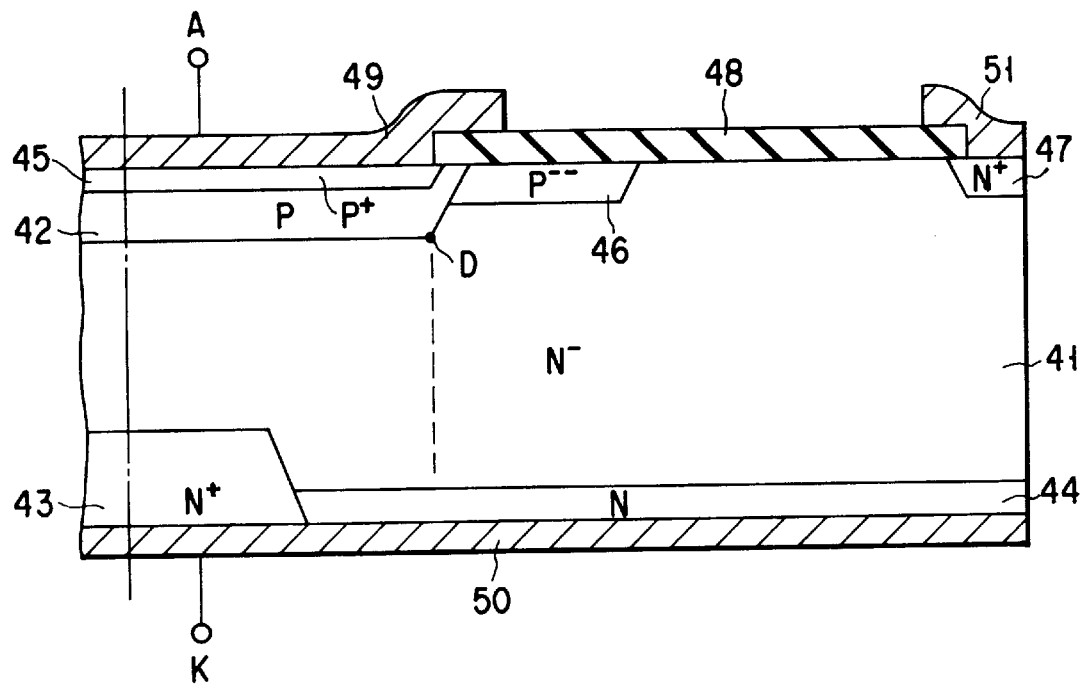
F I G. 25
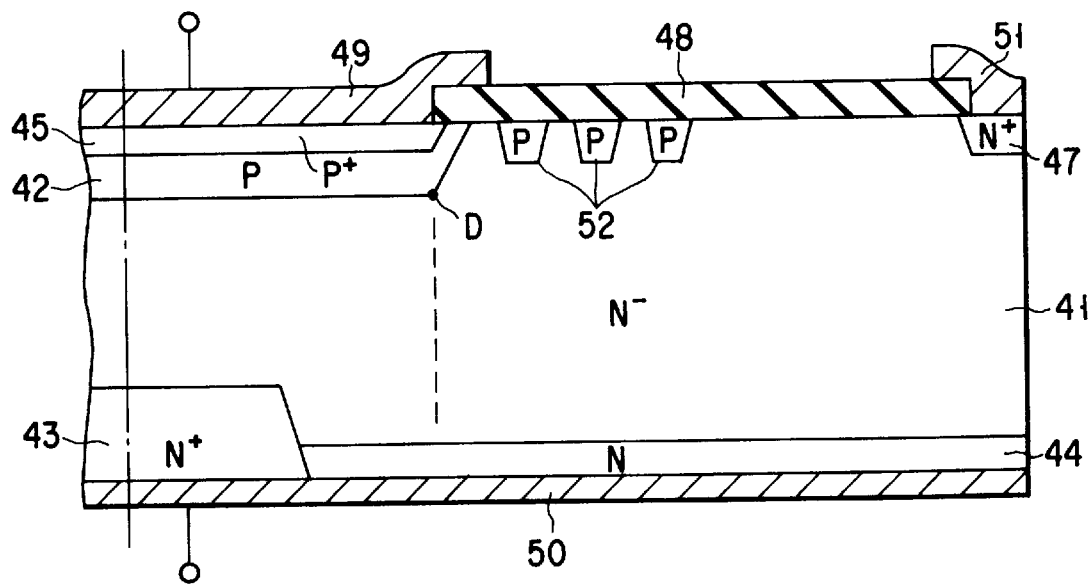
F I G. 26

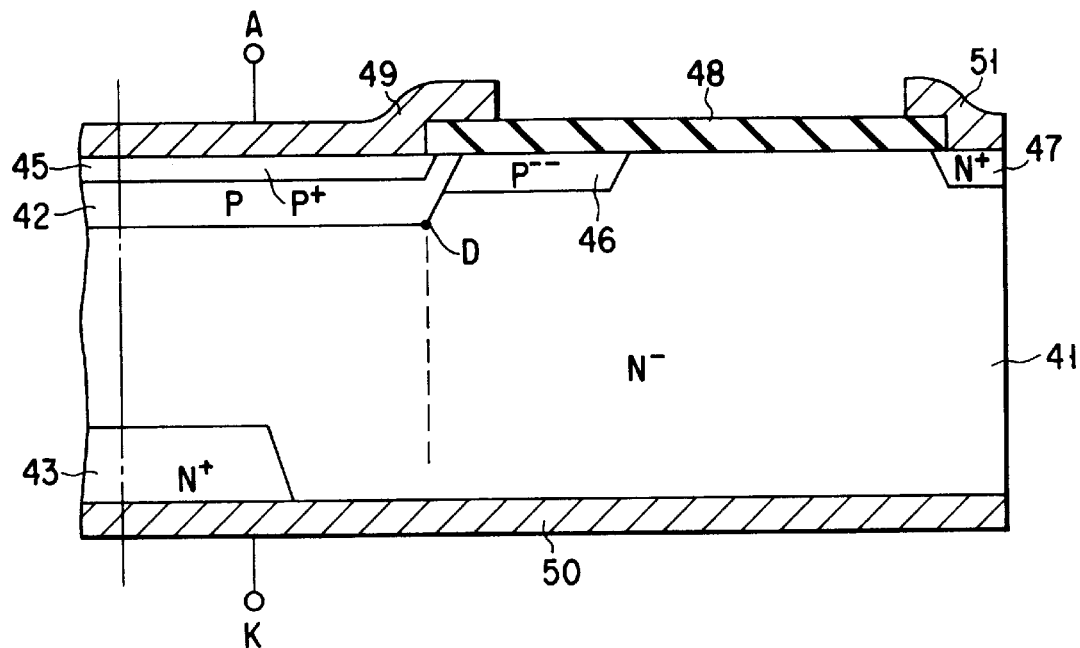
F I G. 27
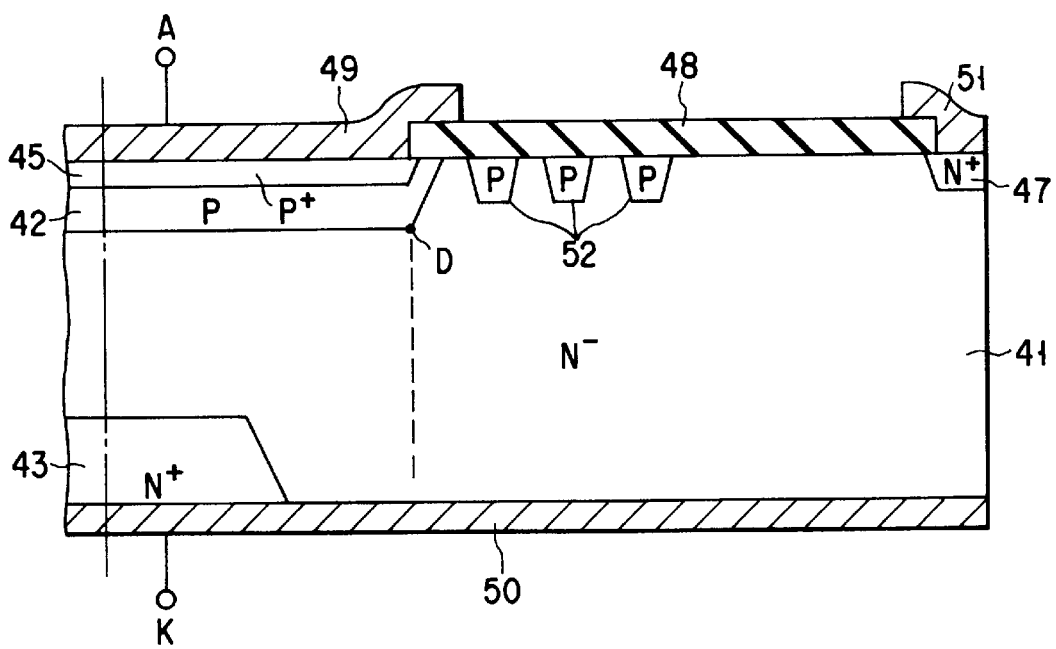
F I G. 28

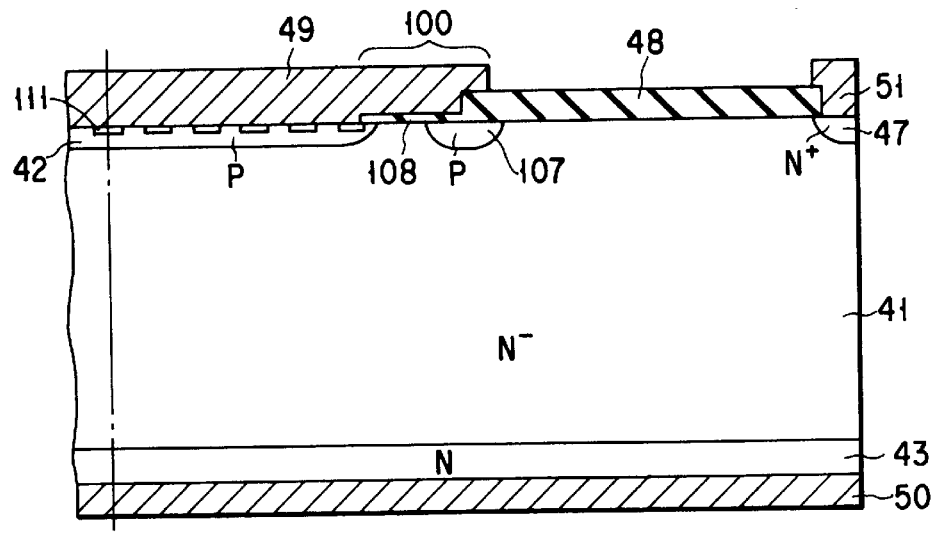
F I G. 34
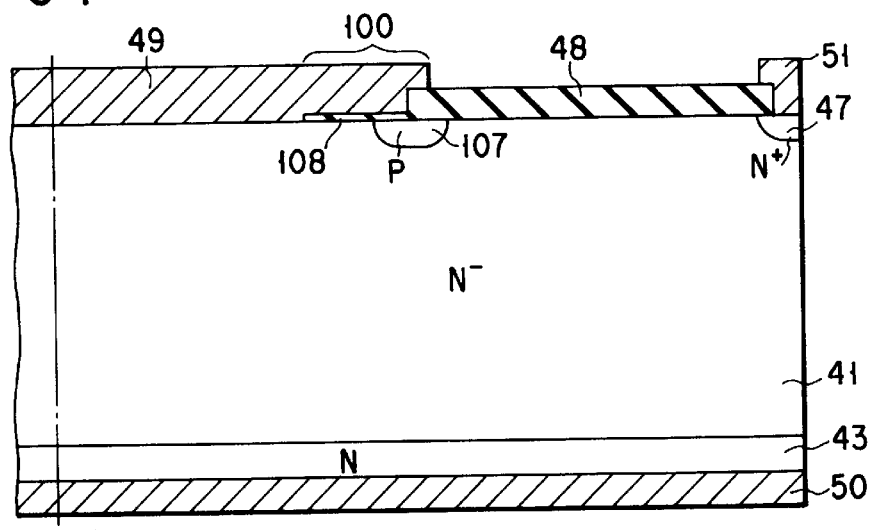
F I G. 35
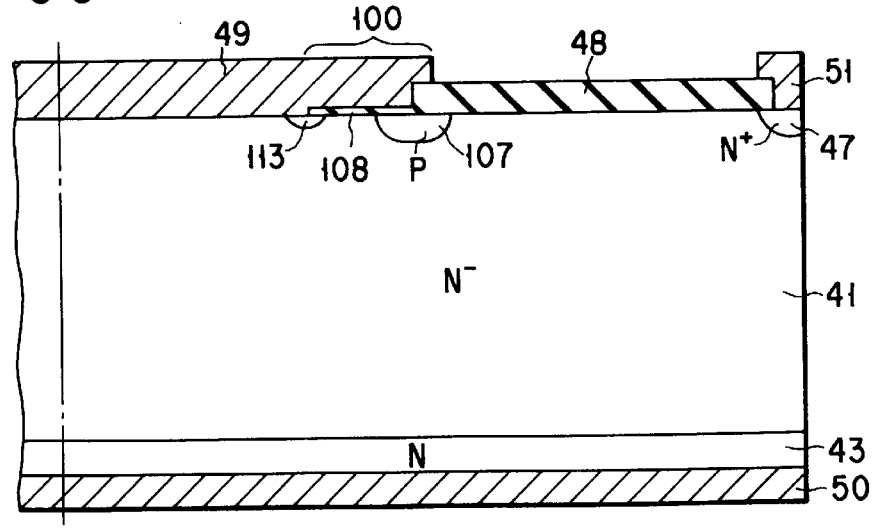
F I G. 36

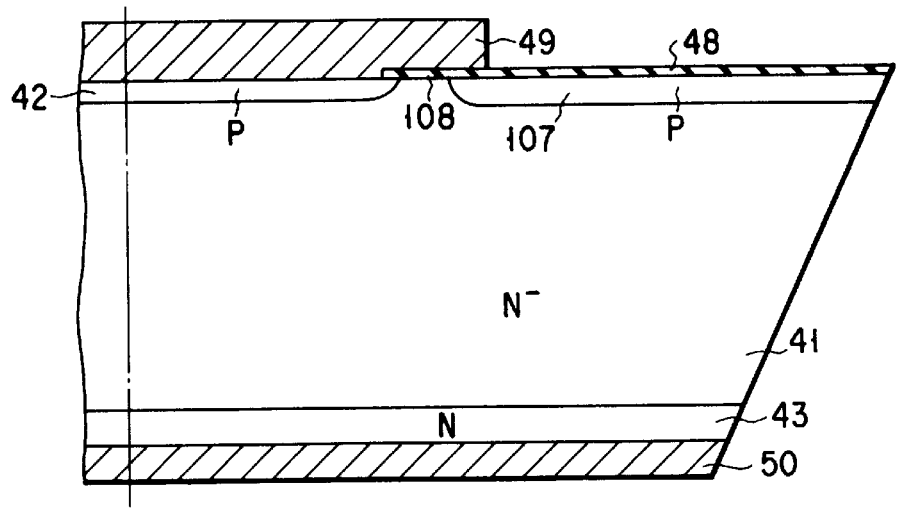
F I G. 39
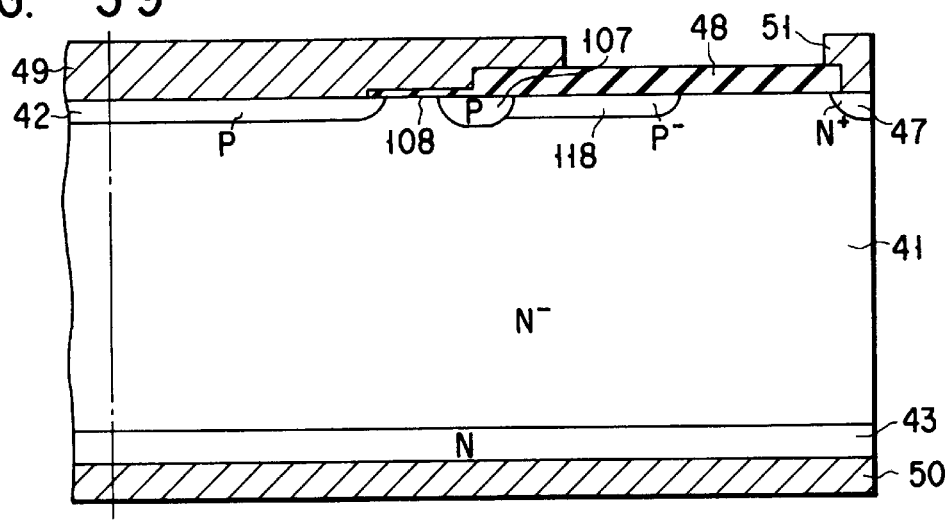
F I G. 40
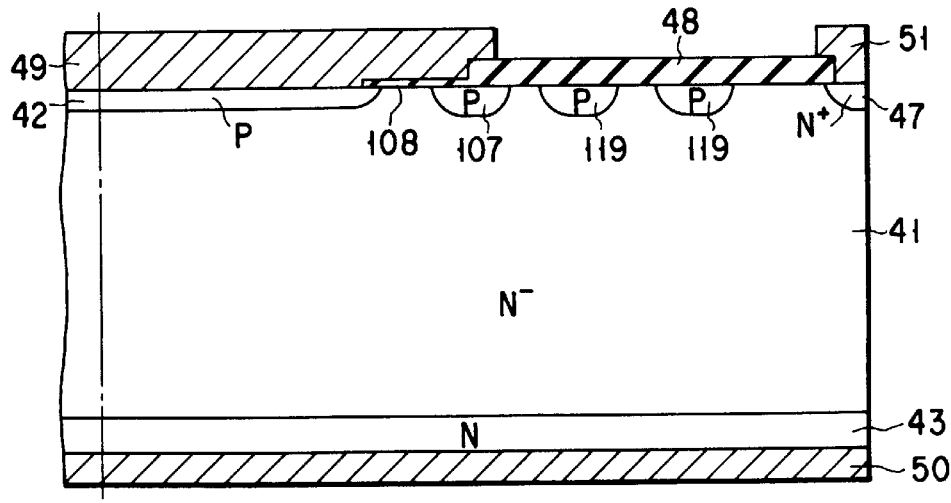
F I G. 41

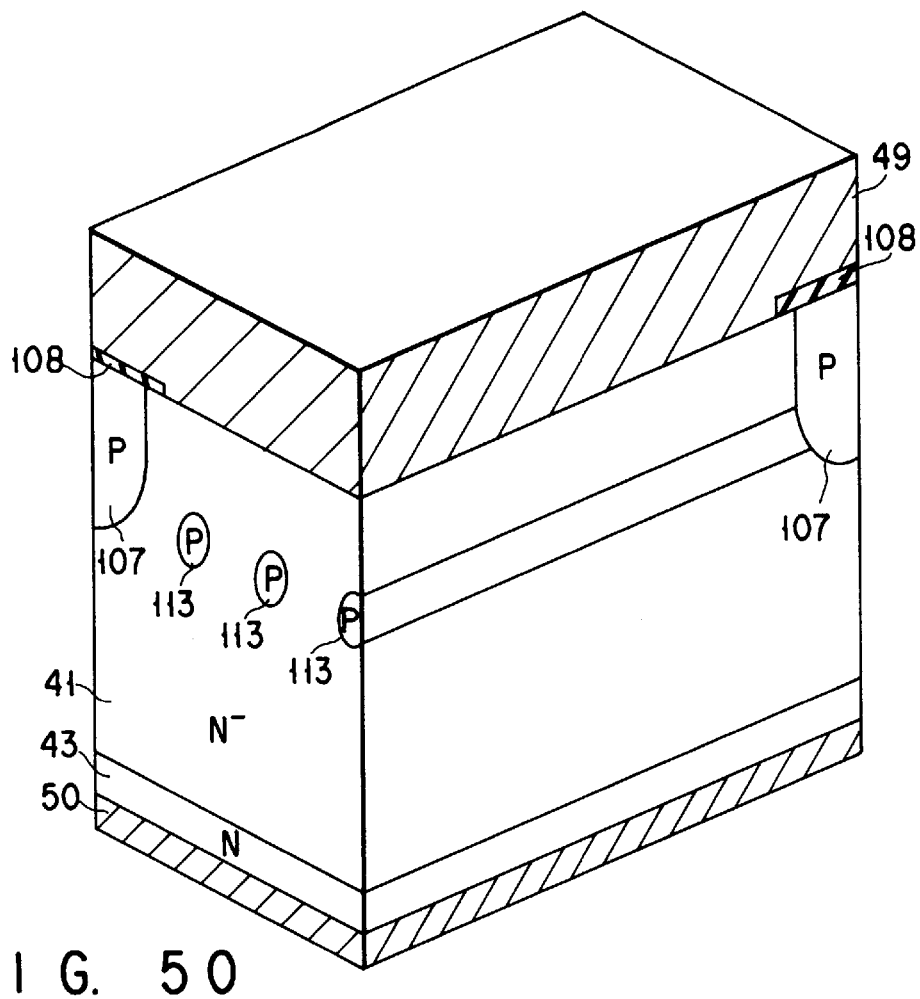
F I G. 50
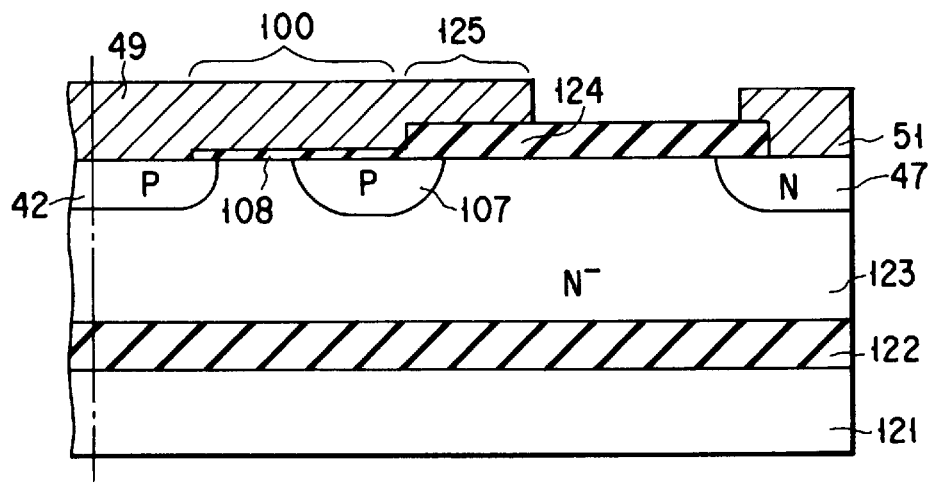
F I G. 51

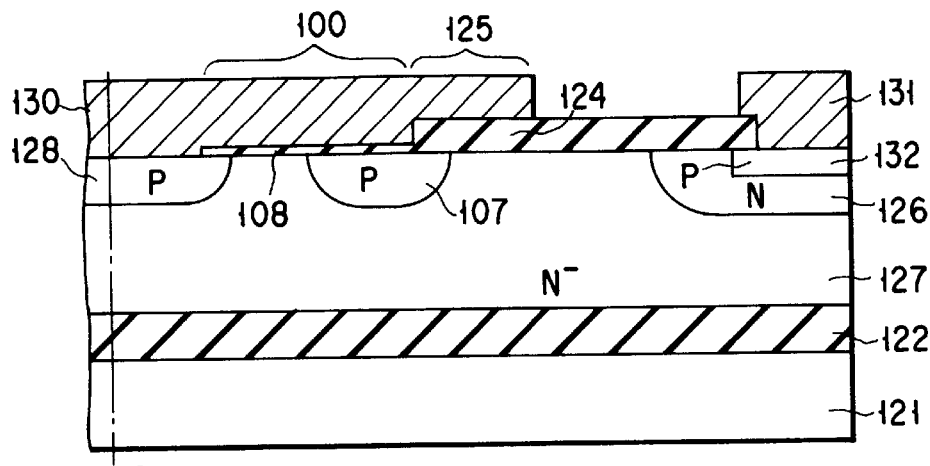
F I G. 52A
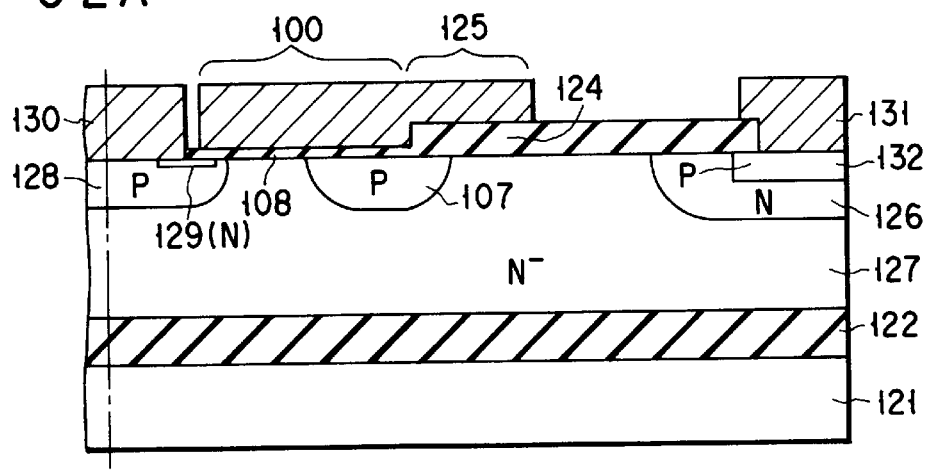
F I G. 52B
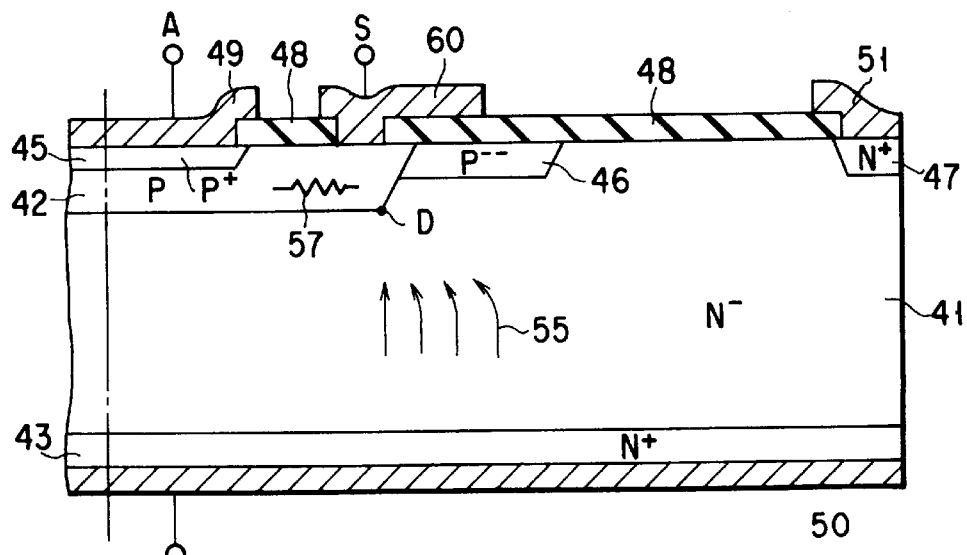
F I G. 53

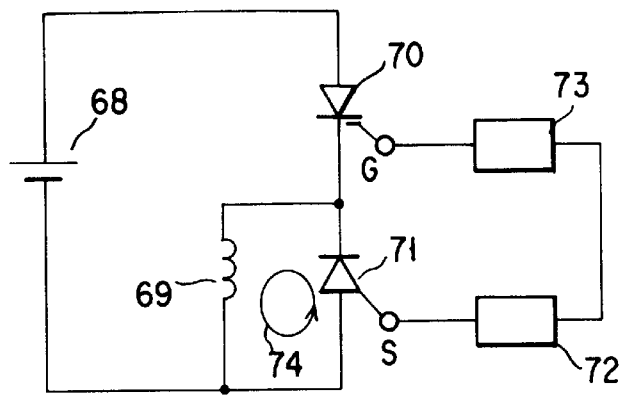
F I G. 54
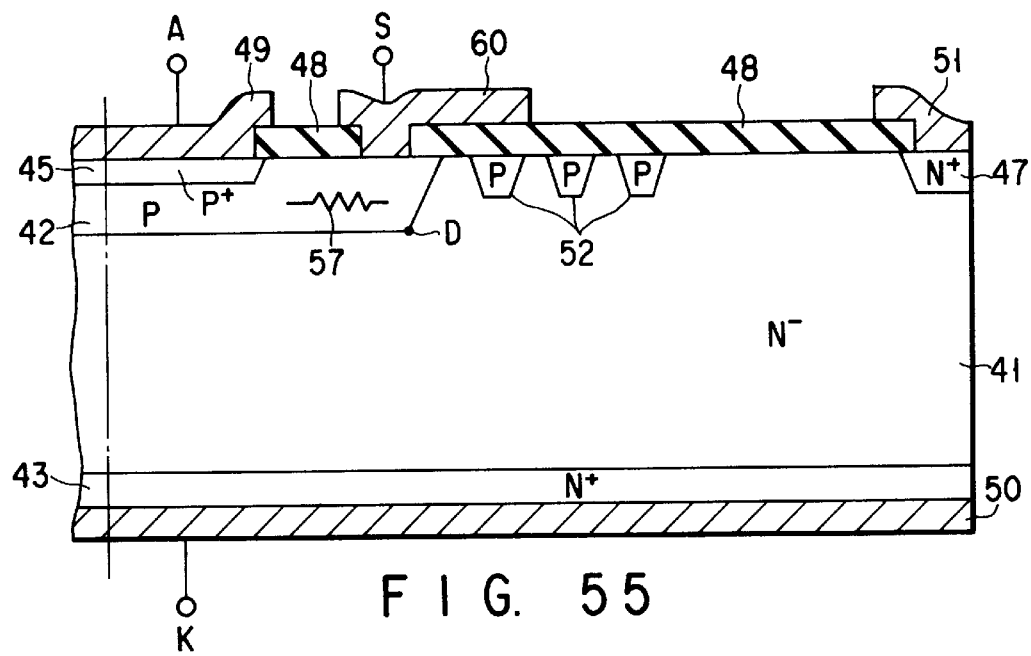
F I G. 55
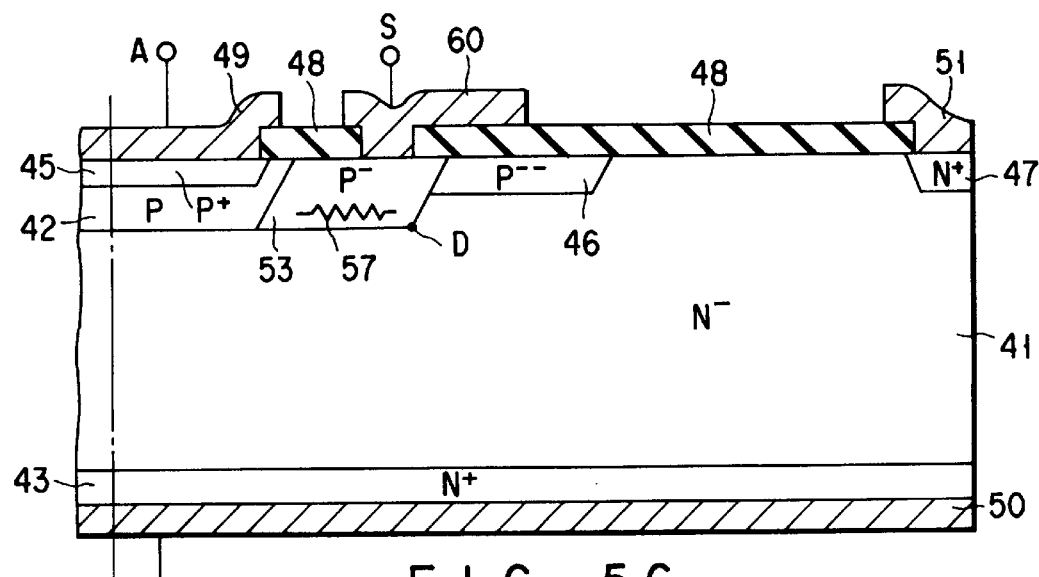
F I G. 56

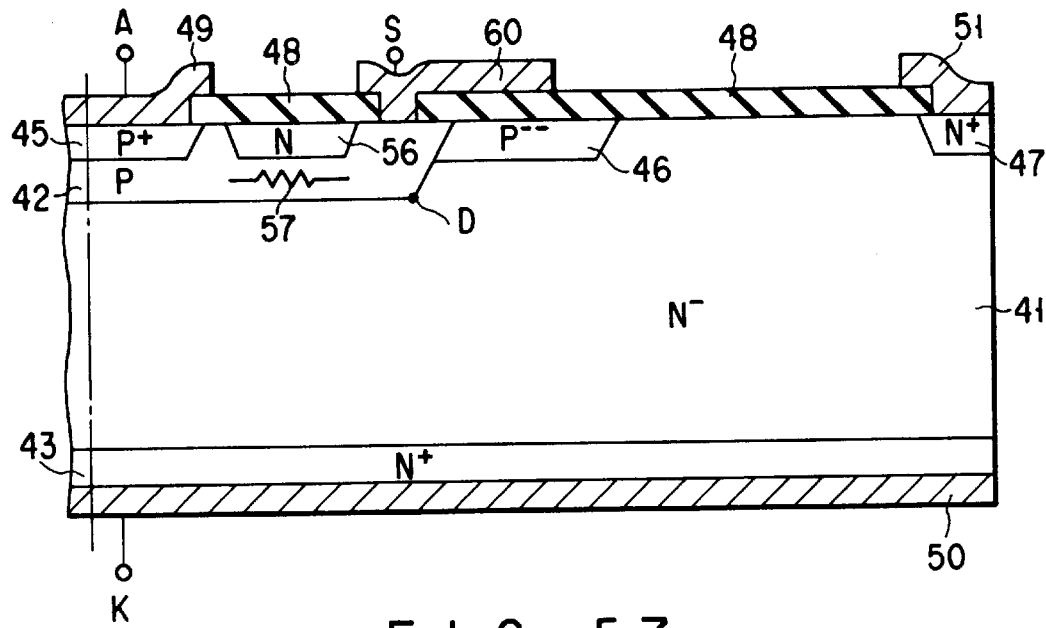
F I G. 57
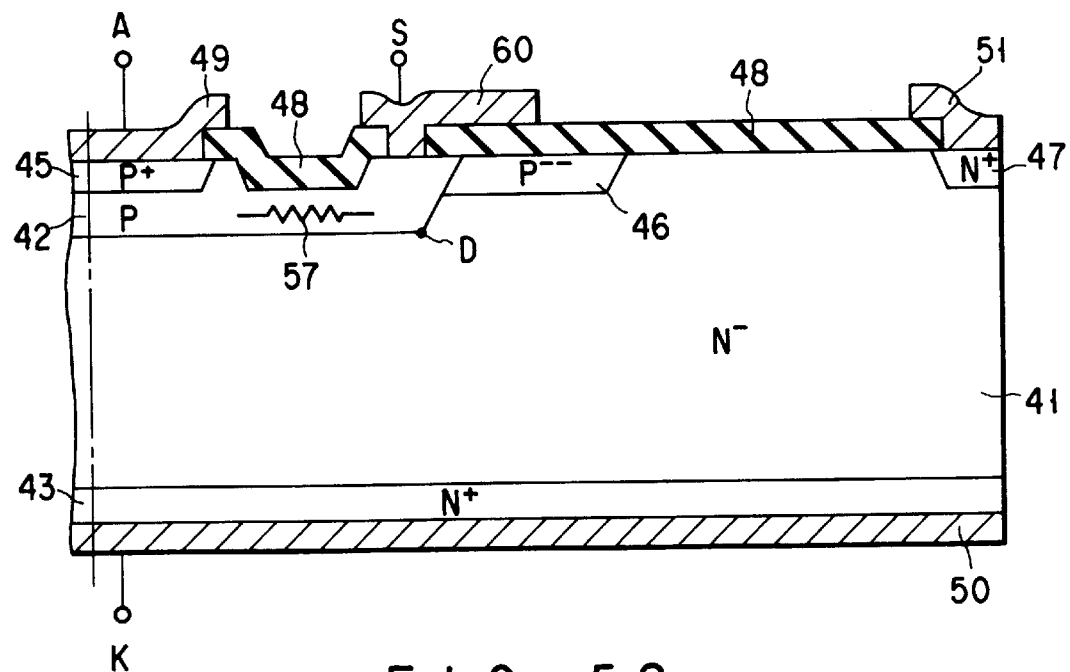
F I G. 58

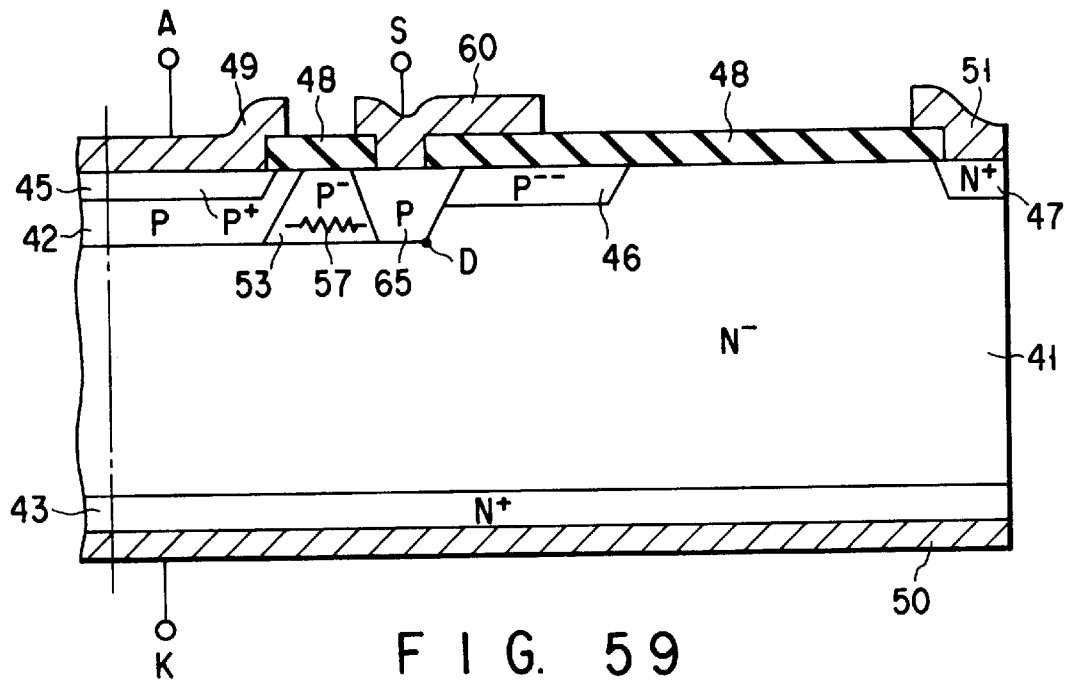
F I G. 59
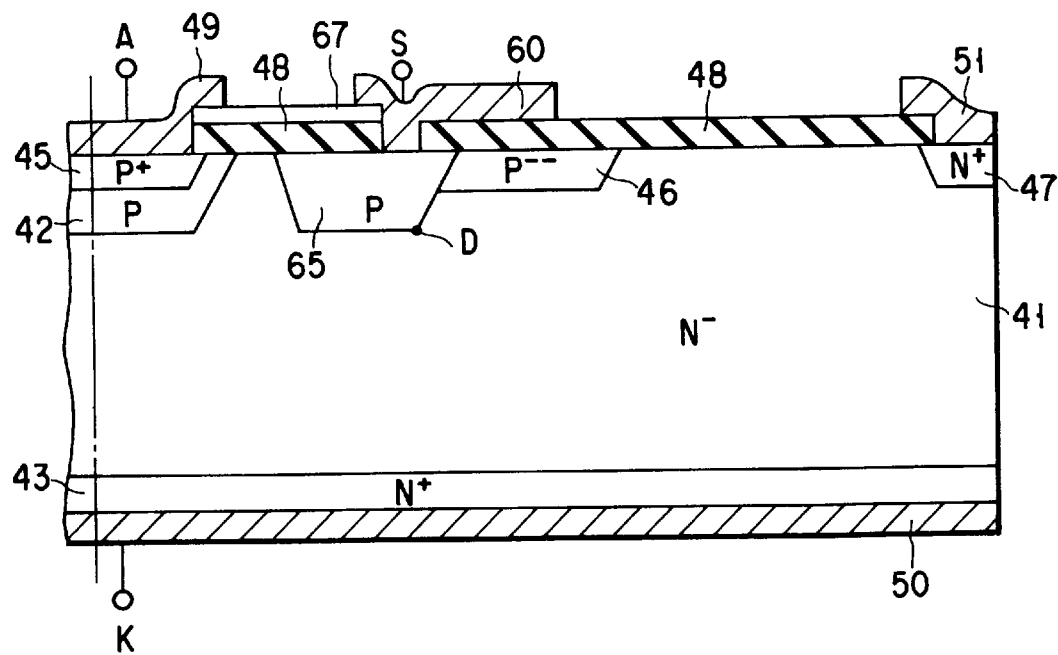
F I G. 60

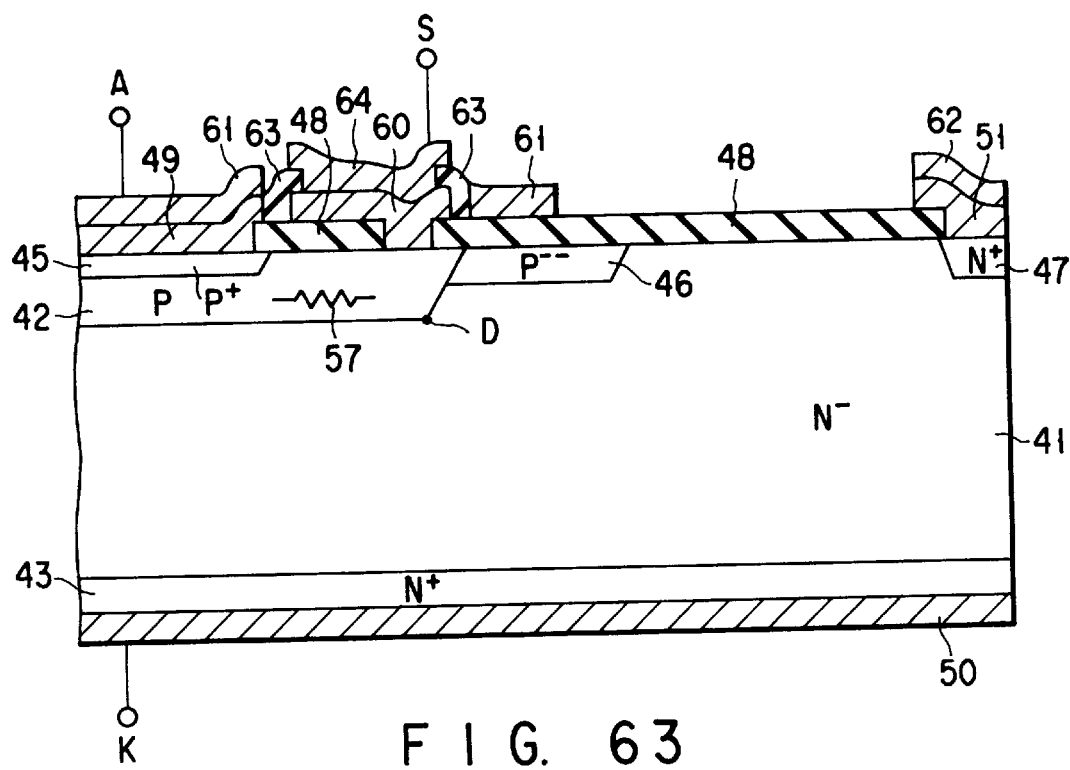
F I G. 63
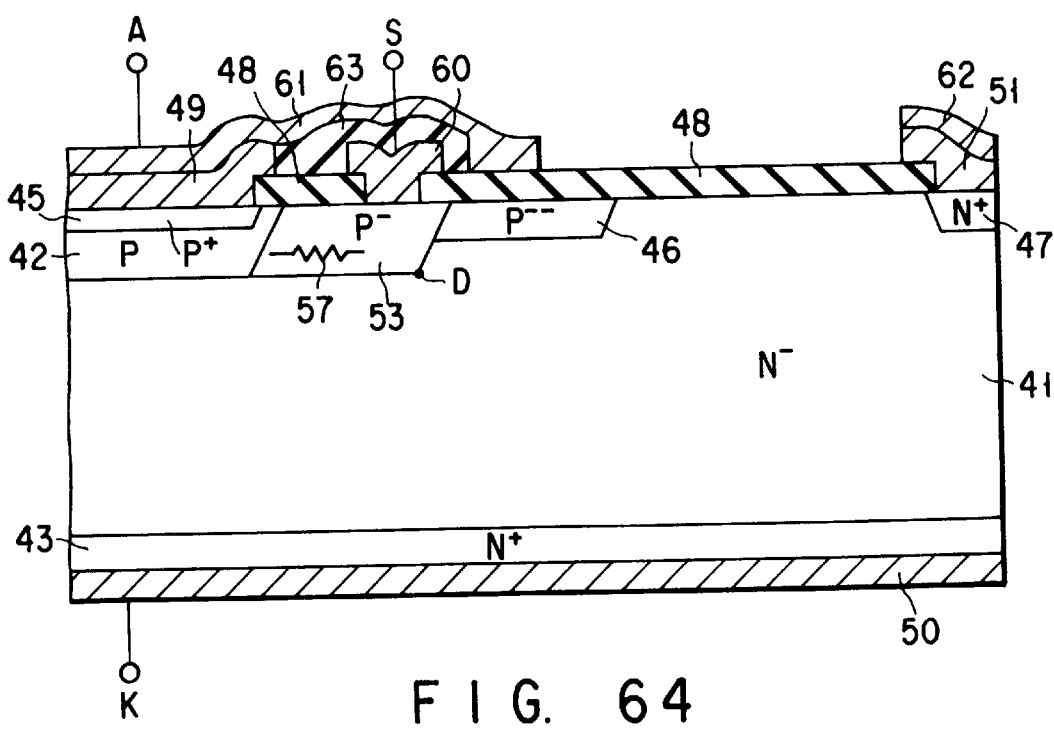
F I G. 64

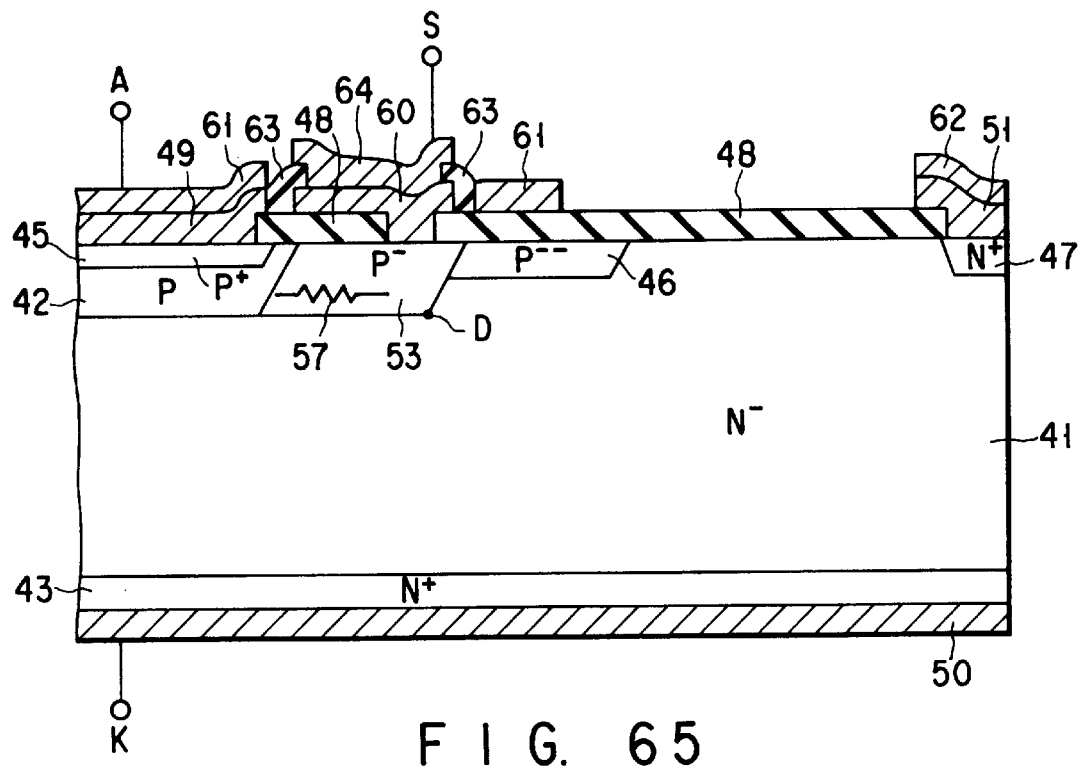
F I G. 65
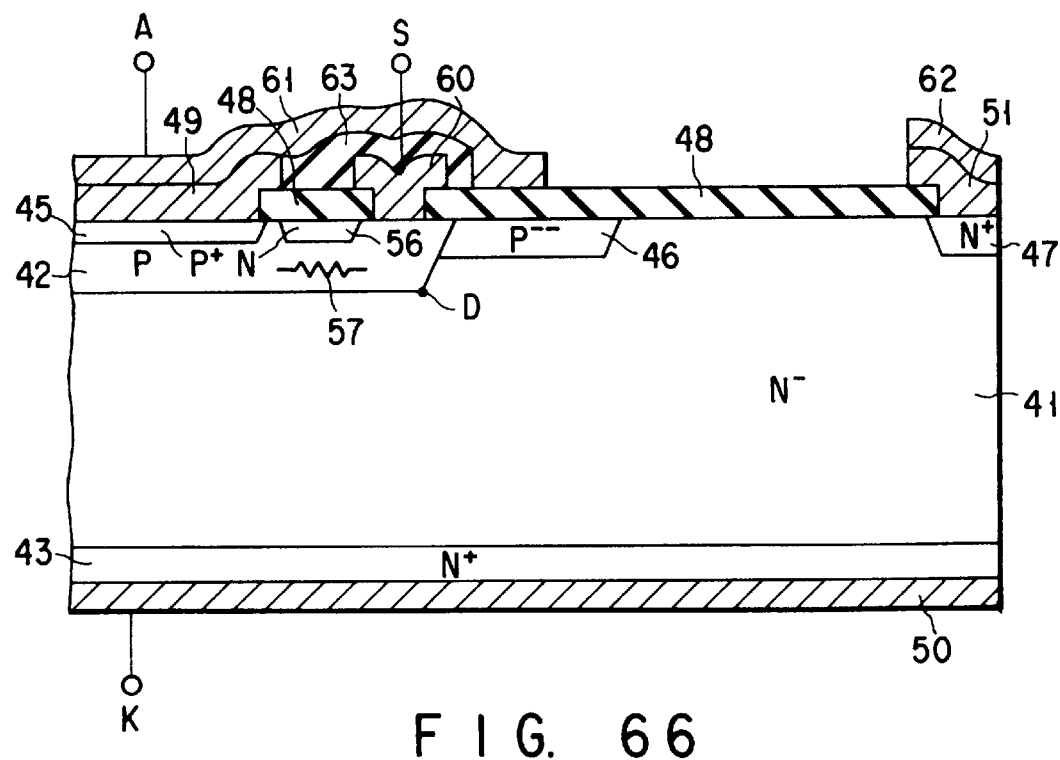
F I G. 66

IMPURITY CONCENTRATION ALONG 75B–75B

CARRIER DISTRIBUTION IN N⁻ LAYER AT "ON" STATE ALONG 75B–75B

IMPURITY CONCENTRATION ALONG 77B-77B

IMPURITY CONCENTRATION ALONG 77C-77C

CARRIER DISTRIBUTION IN N⁻ LAYER AT "ON" STATE (P=N)

IMPURITY CONCENTRATION ALONG 81B-81B

IMPURITY COCENTRATION ALONG 81C-81C

CARRIER DISTRIBUTION IN N⁻ LAYER AT "ON" STATE (P=N)

IMPURITY CONCENTRATION ALONG 83B-83B

IMPURTY CONCENTRATION ALONG 83C-83C

CARRIER DISTRBUTION IN N⁻ LAYER AT "ON" STATE (P=N)

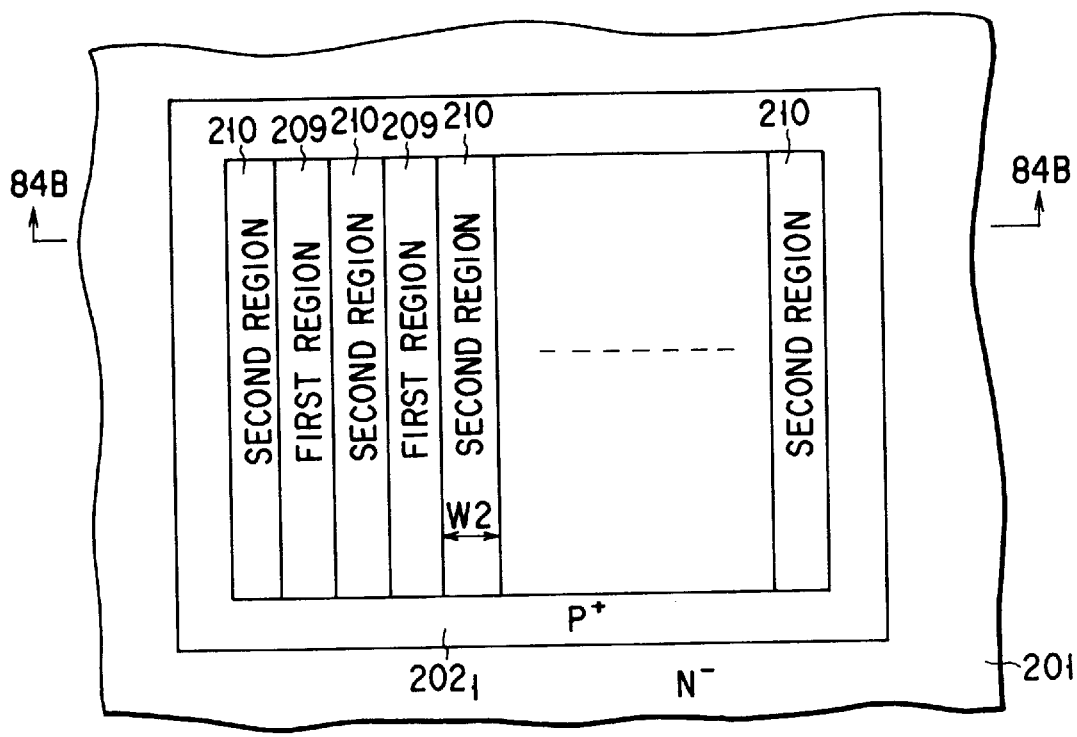
F I G. 84A
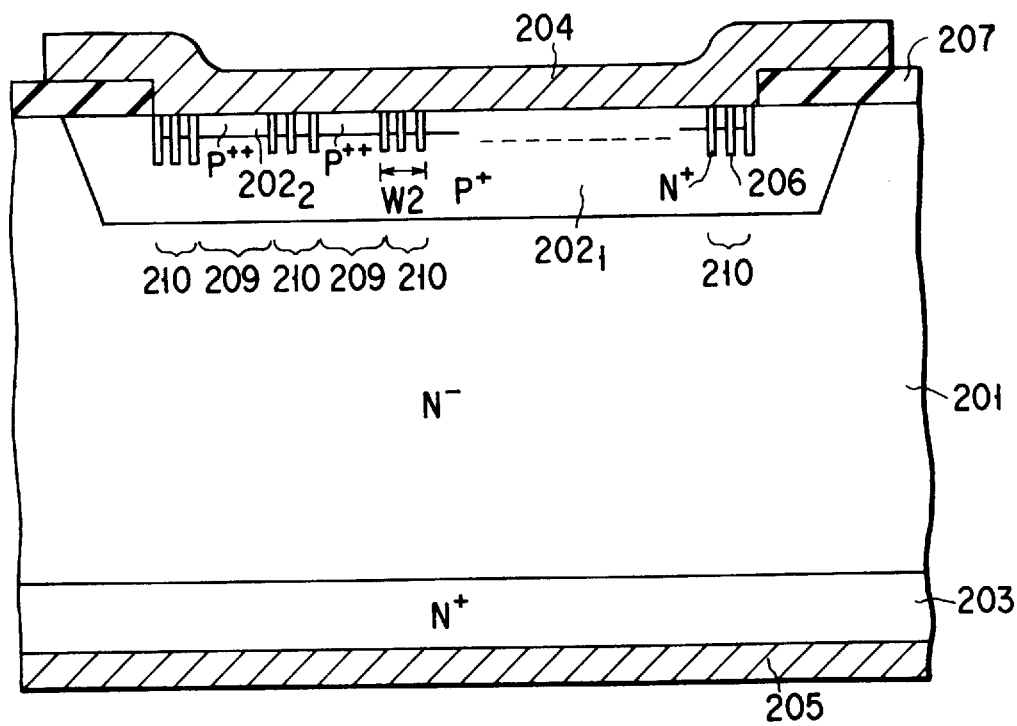
F I G. 84B

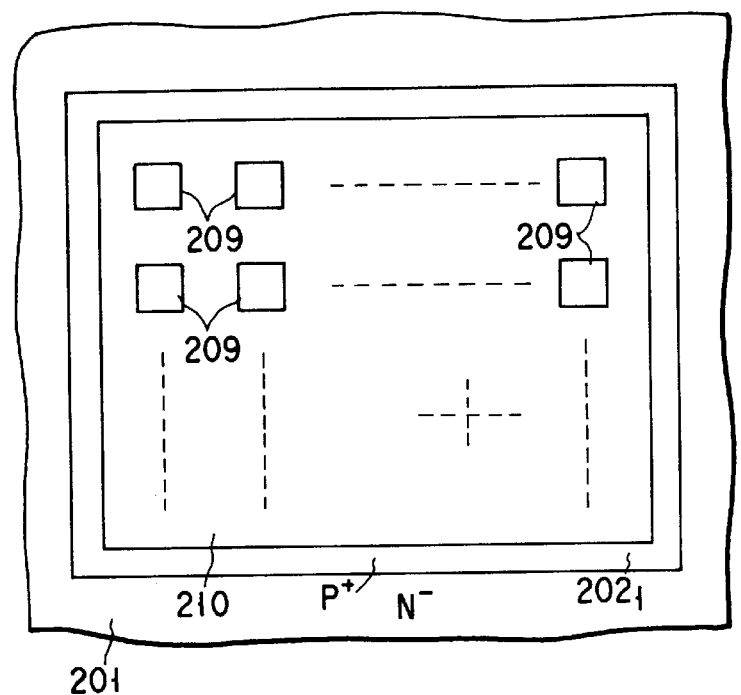
F I G. 89
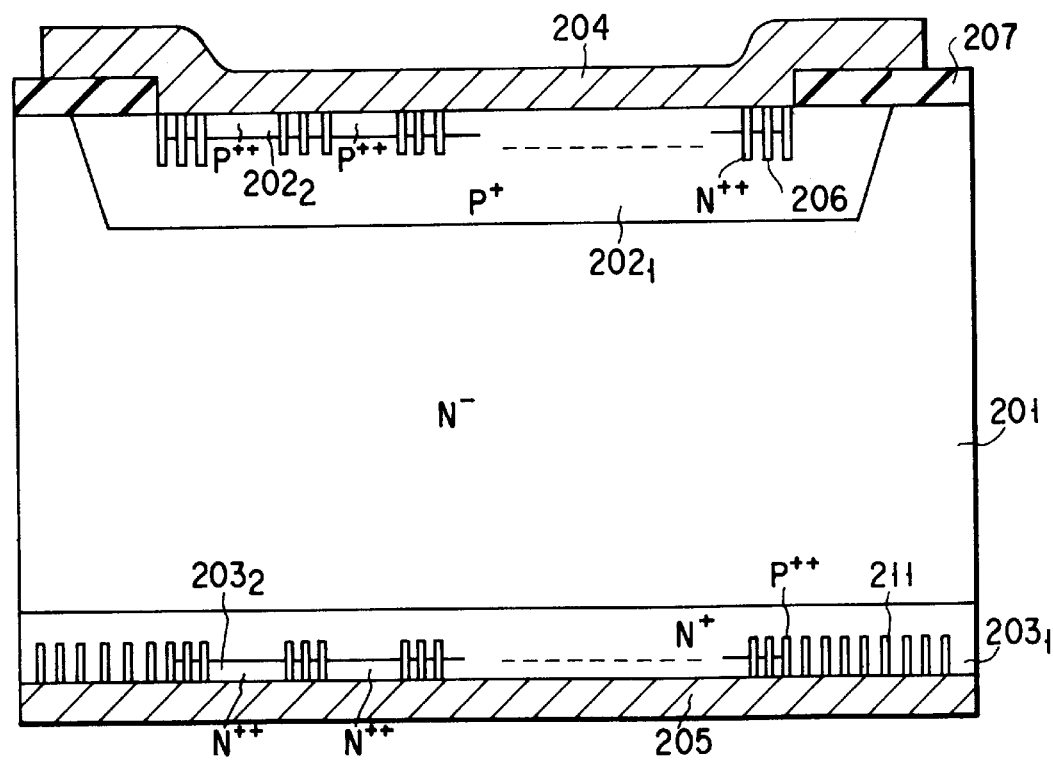
F I G. 90

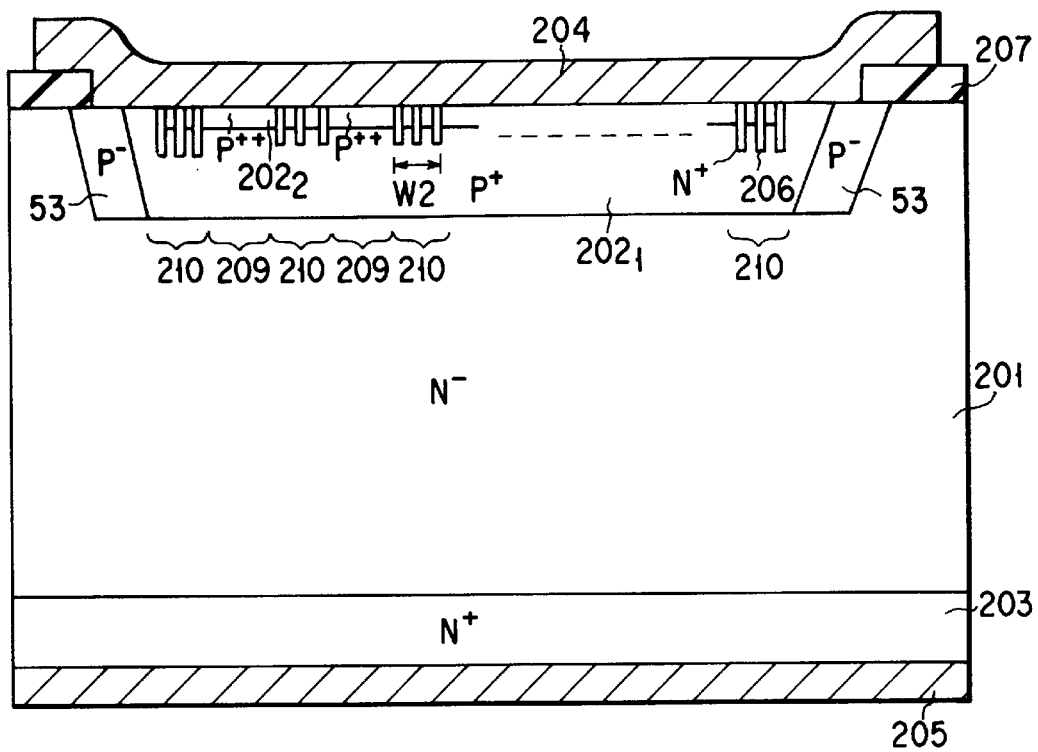
F I G. 91
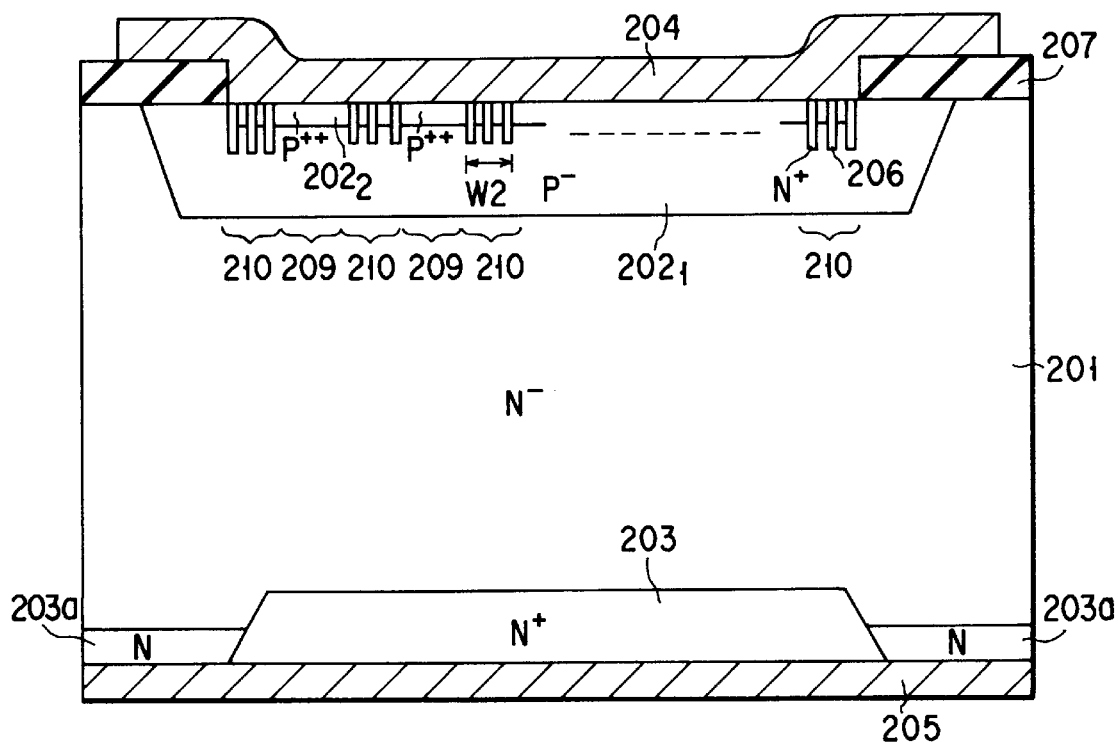
F I G. 92

HIGH WITHSTAND VOLTAGE SEMICONDUCTOR DEVICE

BACKGROUND OF THE INVENTION

1. Field of the Invention

This invention relates to a semiconductor device such as a high-withstand voltage diode, IGBT, thyristor, and more particularly to a high-withstand voltage semiconductor device in which the breakdown strength and power loss are improved.

2. Description of the Related Art

In recent years, a high-withstand voltage semiconductor device such as a high-withstand voltage diode, IGBT, thyristor is widely used and the performance thereof is required to be further enhanced as the performance of devices in the power electronics field such as the inverter- or motor-control is further enhanced and the systemization thereof is further advanced.

For example, the high-withstand voltage diode is formed of a high-resistance $N^-$-type base layer which is formed of $N^-$-type silicon, an anode electrode formed on one surface of the base layer with a $P^+$-type anode layer disposed therebetween, and a cathode electrode formed on the other surface of the base layer with an $N^+$-type cathode layer disposed therebetween.

In the case of a high-withstand voltage diode with a blocking voltage of 4500 V class, the impurity concentrations and the dimensions of the respective portions are set such that the impurity concentration of the $N^-$-type base layer is set to $1.0 \times 10^{13}$ to $1.8 \times 10^{13}/cm^3$ and the thickness thereof is set to 450 to 900 μm, and the surface impurity concentration of each of the $P^+$-type anode layer and $N^+$-type cathode layer is set to $1.0 \times 10^{19}/cm^3$ and the thickness thereof is set to 14 and 70 μm, respectively.

With the above high-withstand voltage diode, an ON-voltage of approx. 2.6 V can be obtained by a current of approx. 100 A/cm$^2$. The high-withstand voltage characteristic is attained by forming the junction edge portion in a bevel structure.

In the high-withstand voltage diode with the above structure, a large amount of carriers are stored in the $N^-$-type base layer in a highly injected state. The carrier concentration becomes high in portions near the $N^+$-type cathode layer and $P^+$-type anode layer from which electrons and holes are injected.

Since a large amount of carriers are thus stored, a large reverse recovery current flows when a reverse bias voltage is applied to set an OFF state. For example, in a case where the above-described device parameters are used, a large reverse recovery current of approx. 100 A/cm$^2$ flows when the OFF state is set by a reverse bias voltage of 1000 V and current variation rate di/dt=−200 A/cm$^2$. Therefore, large electric power is consumed by the reverse recovery current and a large amount of heat is generated. This may prevent the high-speed switching.

As a method for improving the reverse recovery characteristic of the high-withstand voltage diode, it is well known in the art that it is effective to lower the surface impurity concentration of the $P^+$-type anode layer and reduce the thickness thereof (for example, refer to IEEE TRANSACTIONS OF ELECTRON DEVICES. VOL-23, NO.8 pp. 945–949, 1976, M. Naito et al., "High Current Characteristics of Asymmetrical P-i-N Diodes Having Low Forward Voltage Drops"). This is considered to be because that the carriers in a portion near the junction whose depletion layer extends at the initial time of the reverse recovery process can be suppressed to a small amount by lowering the hole injection efficiency on the $P^+$-type anode layer side.

However, if the surface impurity concentration of the $P^+$-type anode layer is lowered, it becomes difficult to sufficiently lower the ohmic contact with the anode electrode, thereby degrading ON characteristic. In order to attain a good ohmic contact which is required to be used for large electric power, it is required to set the surface impurity concentration of the $P^+$-type anode layer to approx. $1 \times 10^{19}/cm^3$.

Further, if the impurity concentration of the $P^+$-type anode layer is lowered and the thickness thereof is reduced, the depletion layer which extends into the $P^+$-type anode layer at the time of application of the reverse bias voltage may almost reach the anode electrode, thereby making it impossible to attain a sufficiently high-withstand voltage characteristic.

Thus, the high-withstand voltage diode has a problem that a large reverse recovery current is caused to flow at the OFF time by the carriers stored in the high-resistance $N^-$-type base layer to generate a great power loss and heat, thereby destroying the device at the worst case. If an attempt is made to improve the reverse recovery characteristic, a problem that the ON and high-withstand voltage characteristics are deteriorated occurs.

On the other hand, in a field in which a withstand voltage of 2000 V class is required, a planar type high-withstand voltage diode in which the end portion of the junction is formed on the substrate surface by use of a thin anode layer (P-type anode layer) is used instead of the conventional high-withstand voltage diode with bevel structure. This is because the high-withstand voltage diode which is used together with an IGBT with MOS structure may be set in the same package together with the IGBT in some cases and it is required to permit the method for connection of the lead wires or terminals and the electrode structure to be commonly used for those of the IGBT. In the planar type structure, a current is concentrated on the junction edge portion (the bent portion of the junction) and the junction edge portion is set into the high electric field/high current density state at the time of change from the ON state to the OFF state (at the reverse recovery time). At this time, there occurs a problem that the remaining carriers in the periphery (rim) portion of the main element are concentrated in a portion near the end portion of the P-type anode layer so as to cause an avalanche current to partially flow, thereby destroying the device. Further, the withstand voltage of the IGBT is further rapidly enhanced and it is strongly required to enhance the reverse recovery characteristic of the planar type high-withstand voltage diode.

SUMMARY OF THE INVENTION

An object of this invention is to provide a high-withstand voltage semiconductor device capable of preventing destruction by the remaining carriers in the periphery portion of the device at the reverse recovery time.

Further, another object of this invention is to provide a high-withstand voltage semiconductor device with low power loss in which the ON voltage can be suppressed to a low level.

In order to attain the above object, a high-withstand voltage semiconductor device according to a first aspect of this invention comprises a first semiconductor layer of a first conductivity type having a first and a second main surface; a second semiconductor layer of a second conductivity type selectively formed on the first main surface of the first semiconductor layer, the second semiconductor layer having a first region having a relatively high injection efficiency and a second region having a relatively low injection efficiency and the first region being surrounded by the second region; a third semiconductor layer of the first conductivity type formed on the second main surface of the first semiconductor layer; a first electrode formed on the second semiconductor layer of the second conductivity type and connected to at least the first region; and a second electrode formed on the third semiconductor layer of the first conductivity type.

It is preferable to form the first electrode in contact with the first and the second region of the second semiconductor layer.

The semiconductor device is constructed such that the second region of the second semiconductor layer has an impurity concentration lower than that of the first region.

Alternatively, the semiconductor device may be so constructed such that the second region of the second semiconductor layer is connected to the first region through a high resistivity region.

The second semiconductor layer of the semiconductor device is so formed such that the first region having a relatively high injection efficiency is surrounded by the second region having a relatively low injection efficiency. With this structure, the amount of carriers injected from the second region in the forward conductive state is reduced than in the conventional case and the carrier density in a portion near the end portion of the second region in the forward conductive state becomes lower than in the conventional case. Therefore, even if the highest electric field is set up in a portion near the end portion of the second region at the reverse recovery time, there occurs no problem that the device will be destroyed by the partial avalanche current caused by carrier concentration.

A high-withstand voltage semiconductor device according to a second aspect of this invention comprises a first semiconductor layer of a first conductivity type having a first and a second main surface; a second semiconductor layer of a second conductivity type selectively formed on the first main surface of the first semiconductor layer; a third semiconductor layer of the first conductivity type having a relatively high injection efficiency and formed on the second main surface of the first semiconductor layer, the third semiconductor layer being contained in an area obtained by projecting the second semiconductor layer on the second main surface; a first electrode formed on the second semiconductor layer of the second conductivity type; and a second electrode formed on the third semiconductor layer of the first conductivity type.

The semiconductor device may further comprise a fourth semiconductor layer of the first conductivity type formed to surround the third semiconductor layer on the second main surface of the first semiconductor layer.

Alternatively, the semiconductor device may further comprise an insulating film to surround the third semiconductor layer on the second main surface of the first semiconductor layer.

In the high-withstand voltage semiconductor device according to the second aspect of this invention, since the third semiconductor layer of the first conductivity type having a relatively high injection efficiency and formed on the second main surface of the first semiconductor layer is contained in an area obtained by projecting the second semiconductor layer on the second main surface, the carrier density in a portion near the end portion of the second semiconductor layer in the forward conductive state is lower than in the conventional case. Therefore, since the amount of remaining carriers in a portion near the end portion is reduced, there occurs no problem that the device will be destroyed by the partial avalanche current due to carrier concentration even if the highest electric field is set up in a portion near the end portion of the anode layer of the second conductivity type at the reverse recovery time.

Further, a semiconductor device according to a third aspect of this invention comprises a first semiconductor layer of a first conductivity type having a first and a second main surface; a second semiconductor layer of a second conductivity type selectively formed on the first main surface of the first semiconductor layer; a third semiconductor layer of the second conductivity type formed at a preset distance from the second semiconductor layer to surround the second semiconductor layer; a fourth semiconductor layer of the first conductivity type formed on the second main surface of the first semiconductor layer; a first electrode formed on the second semiconductor layer; a second electrode formed on the fourth semiconductor layer; and a third electrode insulatively formed on the first main surface of the first semiconductor layer which lies between the second and the third semiconductor layer.

It is preferable to integrally form the first and the third electrode.

The semiconductor device may further comprise a plurality of semiconductor regions of the first conductivity type selectively formed on the surface of the second semiconductor layer in contact with the first electrode.

The third electrode may be formed of a semi-insulative material.

According to this invention, in a case where a forward bias voltage is applied between the first and second electrodes to set the device into the ON state, no voltage is applied to the third semiconductor layer if a voltage which does not induce a channel in the surface area of the first semiconductor layer below the third electrode (e.g. the same potential as that of the first electrode) is applied to the third electrode.

As a result, since no carriers are injected from the third semiconductor layer in the ON state, the carrier density at the end portion of the second semiconductor layer becomes high, and that of the end portion of the third semiconductor layer becomes low.

On the other hand, in a case where a reverse bias voltage is applied between the first and second electrodes to change the state from the ON state to the OFF state, the potential of the third semiconductor layer is fixed to the threshold voltage of a MOSFET formed of the third electrode, third semiconductor layer and second semiconductor layer if a voltage which induces a channel in the surface area of the first semiconductor layer below the third electrode, that is, a voltage which causes the second and third semiconductor layers to be short-circuited (e.g. the same potential as that of the first electrode) is applied to the third electrode. The threshold voltage is lower than a voltage between the first and second electrodes.

Therefore, the lateral electric field across the end portion of the second semiconductor layer is shielded by the third semiconductor layer and is not influenced by the intense electric field set up outside the third semiconductor layer and the lateral electric field set up on the end portion of the second semiconductor layer becomes weak. Therefore, on the end portion of the second semiconductor layer where the carrier density increases in the ON state, a high electric field is not set in the OFF state, and only on the end portion of the third semiconductor layer where the carrier density is low in the ON state, a high electric field is set in the OFF state.

Thus, according to this invention, the junction edge portion will not be set to the high voltage/high current density state when the state is changed from the ON state to the OFF state (at the time of reverse recovery time), and therefore, the device will not be destroyed and the stable operation region is widened.

A high-withstand voltage semiconductor device according to a fourth aspect of this invention comprises a first semiconductor layer of a first conductivity type having a first and a second main surface; a second semiconductor layer of a second conductivity type selectively formed on the first main surface of the first semiconductor layer, the second semiconductor layer having a plurality of first regions of stripe form having a relatively high injection efficiency and a plurality of second regions of stripe form having a relatively low injection efficiency and the plurality of first regions and the plurality of second regions being alternately arranged; a third semiconductor layer of the first conductivity type formed on the second main surface of the first semiconductor layer; a first electrode formed on the second semiconductor layer of the second conductivity type; and a second electrode formed on the third semiconductor layer of the first conductivity type.

Each of the plurality of second regions has a plurality of third regions of the first conductivity type and a plurality of fourth regions of the second conductivity type and the plurality of third regions and the plurality of fourth regions are arranged at regular intervals.

Further, each of the plurality of second regions may have a plurality of third regions of the first conductivity type of stripe form and a plurality of fourth regions of the second conductivity type of stripe form and the plurality of third regions and the plurality of fourth regions may be alternately arranged.

It is preferable that the third semiconductor layer has a plurality of third regions of stripe form having a relatively high injection efficiency and a plurality of fourth regions of stripe form having a relatively low injection efficiency and the plurality of third regions and the plurality of fourth regions are alternately arranged. At this time, it is more preferable that a portion of the third semiconductor layer which lies below the edge portion of the junction constructed by the first and second semiconductor layers is formed of only the plurality of fourth regions.

In this case, the injection efficiency refers to the injection efficiency of carriers having the same polarity as the majority carriers of the second semiconductor layer and injected from the second semiconductor layer of the second conductivity type into the first semiconductor layer of the first conductivity type.

The first region may be formed with the same structure as the second region and the second region may be formed to have a lower injection efficiency than the first region by adjusting the dimensions thereof or the like.

Further, it is preferable to set the size of the second region less than three times the carrier diffusion length in the first semiconductor layer in the highly injected state. With this structure, since the carrier injected from the first region flows and spreads in the first semiconductor layer, a rise in the ON voltage can be effectively suppressed. This is the fact which the inventors of this application first found.

In this case, since the central portion of the first region is further separated from the second region by increasing the size of the first region, the injection efficiency is enhanced, thereby increasing the injection efficiency of the entire device. Therefore, when the current density becomes high, carriers are stored in the first injection region having a high injection efficiency so that a lower ON voltage than in the conventional case can be obtained and the ON characteristic can be improved.

Further, since the ON voltage can be thus lowered, it is not necessary to increase the carrier life time, thereby preventing occurrence of a problem that a tail current flows for a long time to cause large power loss.

By increasing the size of the first and second regions, the two-dimensional re-distribution of a current occurs between the first and second regions at the reverse recovery time and the reverse recovery current can be kept small, and therefore, the reverse recovery characteristic can be improved.

A semiconductor device according to a fifth aspect of this invention comprises a first semiconductor layer of a first conductivity type having a first and a second main surface; a second semiconductor layer of a second conductivity type selectively formed on the first main surface of the first semiconductor layer; a third semiconductor layer of the first conductivity type formed on the second main surface of the first semiconductor layer; a first electrode selectively formed on the second semiconductor layer; a second electrode formed on the third semiconductor layer; and a third electrode formed on part of an end region of the second semiconductor layer and disposed apart from the first electrode to detect a potential of the end region.

The second semiconductor layer has a first region having a relatively high injection efficiency and a second region having a relatively low injection efficiency, the first region is surrounded by the second region, and the third electrode is connected to the second region.

The second region of the second semiconductor layer may be formed to have an impurity concentration lower than that of the first region.

The second region of the second semiconductor layer may be connected to the first region through a high resistivity region, and the third electrode may be connected to a portion of the second region which lies at a portion remote from the first region with the high resistivity region disposed therebetween.

With the above structure, since the potential of the end portion of the second semiconductor layer can be always monitored, the reverse recovery speed can be controlled and the diode can be prevented from being destroyed by feeding back the potential rise to the gate circuit of a main element (such as an IGBT) if the potential rise due to the current concentration at the reverse recovery time is detected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a cross sectional view showing the right half portion of a high-withstand voltage diode according to a third embodiment of this invention;

FIG. 8 is a cross sectional view showing the right half portion of a high-withstand voltage diode according to a modification of the third embodiment of this invention;

FIG. 9 is a cross sectional view showing the right half portion of a high-withstand voltage diode according to a fourth embodiment of this invention;

FIG. 10 is a cross sectional view showing the right half portion of a high-withstand voltage diode according to a modification of the fourth embodiment of this invention;

FIG. 11 is a cross sectional view showing the right half portion of a high-withstand voltage diode according to a fifth embodiment of this invention;

FIG. 12 is a cross sectional view showing the right half portion of a high-withstand voltage diode according to a modification of the fifth embodiment of this invention;

FIG. 25 is a cross sectional view showing the right half portion of a high-withstand voltage diode according to an eleventh embodiment of this invention;

FIG. 26 is a cross sectional view showing the right half portion of a high-withstand voltage diode according to a first modification of the eleventh embodiment of this invention;

FIG. 27 is a cross sectional view showing the right half portion of a high-withstand voltage diode according to a second modification of the eleventh embodiment of this invention;

FIG. 28 is a cross sectional view showing the right half portion of a high-withstand voltage diode according to a third modification of the eleventh embodiment of this invention;

FIG. 34 is a cross sectional view showing the right half portion of a high-withstand voltage diode according to a thirteenth embodiment of this invention;

FIG. 35 is a cross sectional view showing the right half portion of a high-withstand voltage diode according to a fourteenth embodiment of this invention;

FIG. 36 is a cross sectional view showing the right half portion of a high-withstand voltage diode according to a fifteenth embodiment of this invention;

FIG. 39 is a cross sectional view showing the right half portion of a high-withstand voltage diode according to a eighteenth embodiment of this invention;

FIG. 40 is a cross sectional view showing the right half portion of a high-withstand voltage diode according to a nineteenth embodiment of this invention;

FIG. 41 is a cross sectional view showing the right half portion of a high-withstand voltage diode according to a twentieth embodiment of this invention;

FIG. 50 is a perspective view showing the cross section taken along the line 50—50 of FIG. 49 together with the cross section of FIG. 49;

FIG. 51 is a cross sectional view showing the right half portion of a high-withstand voltage diode according to a twenty-seventh embodiment of this invention;

FIGS. 52A, 52B are cross sectional views of a lateral IGBT according to a twenty-eighth embodiment of this invention, respectively showing a non-IGBT section and IGBT section;

FIG. 53 is a cross sectional view showing the right half portion of a high-withstand voltage diode according to a twenty-ninth embodiment of this invention;

FIG. 54 is a circuit diagram showing an example of application of the diode of FIG. 53;

FIG. 55 is a cross sectional view showing the right half portion of a high-withstand voltage diode according to a modification of the twenty-ninth embodiment of this invention;

FIG. 56 is a cross sectional view showing the right half portion of a high-withstand voltage diode according to a thirtieth embodiment of this invention;

FIG. 57 is a cross sectional view showing the right half portion of a high-withstand voltage diode according to a thirty-first embodiment of this invention;

FIG. 58 is a cross sectional view showing the right half portion of a high-withstand voltage diode according to a thirty-second embodiment of this invention;

FIG. 59 is a cross sectional view showing the right half portion of a high-withstand voltage diode according to a thirty-third embodiment of this invention;

FIG. 60 is a cross sectional view showing the right half portion of a high-withstand voltage diode according to a thirty-fourth embodiment of this invention;

FIG. 63 is a cross sectional view taken along the line 63—63 of FIG. 61;

FIG. 64 is a cross sectional view showing a high-withstand voltage diode according to a thirty-sixth embodiment of this invention and corresponding to the cross sectional view taken along the line 62—62 of FIG. 61;

FIG. 65 is a cross sectional view showing the high-withstand voltage diode according to the thirty-sixth embodiment of this invention and corresponding to the cross sectional view taken along the line 63—63 of FIG. 61;

FIG. 66 is a cross sectional view showing a high-withstand voltage diode according to a thirty-seventh embodiment of this invention and corresponding to the cross sectional view taken along the line 62—62 of FIG. 61;

FIGS. 84A and 84B are a plan view of a high-withstand voltage diode according to a forty-second embodiment of this invention and a cross sectional view taken along the line 84B—84B of FIG. 84A;

FIG. 89 is a plan view showing another layout pattern of the first and second regions of the high-withstand voltage diode of the forty-second embodiment;

FIG. 90 is a cross sectional view showing the element structure of a high-withstand voltage diode according to a forty-third embodiment of this invention;

FIG. 91 is a cross sectional view showing the element structure of a high-withstand voltage diode according to a forty-fourth embodiment of this invention;

FIG. 92 is a cross sectional view showing the element structure of a high-withstand voltage diode according to a forty-fifth embodiment of this invention.

DETAILED DESCRIPTION OF THE PREFERRED EMBODIMENTS

In order to make it easier to understand this invention, the problem of the conventional high-withstand voltage diode is explained before explaining the embodiments.

Figure 1:
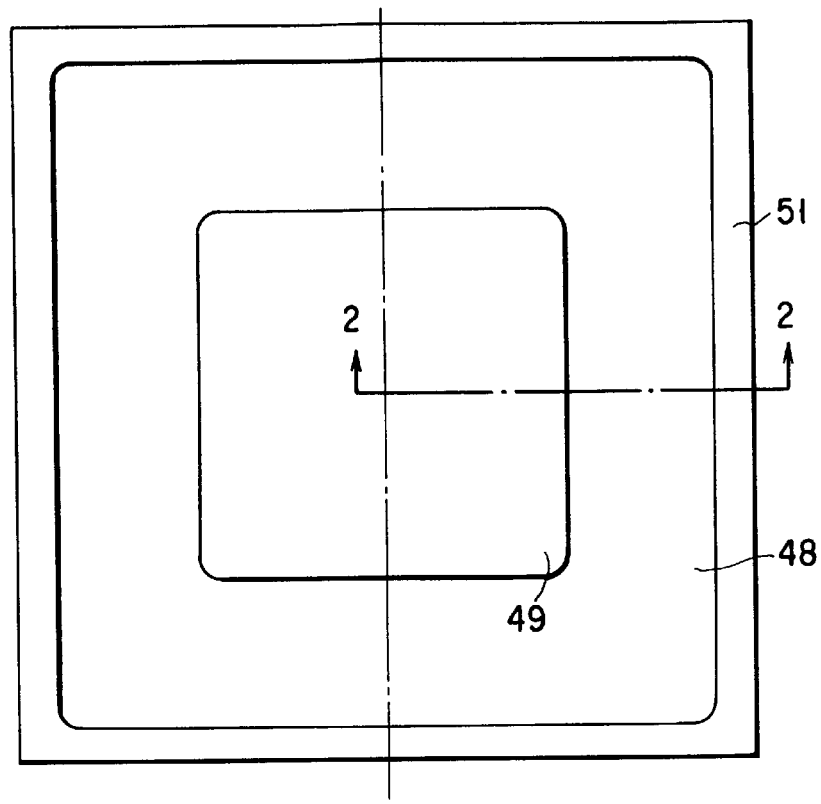
FIG. 1 is a plan view showing a general high-withstand voltage diode.
Figure 2:
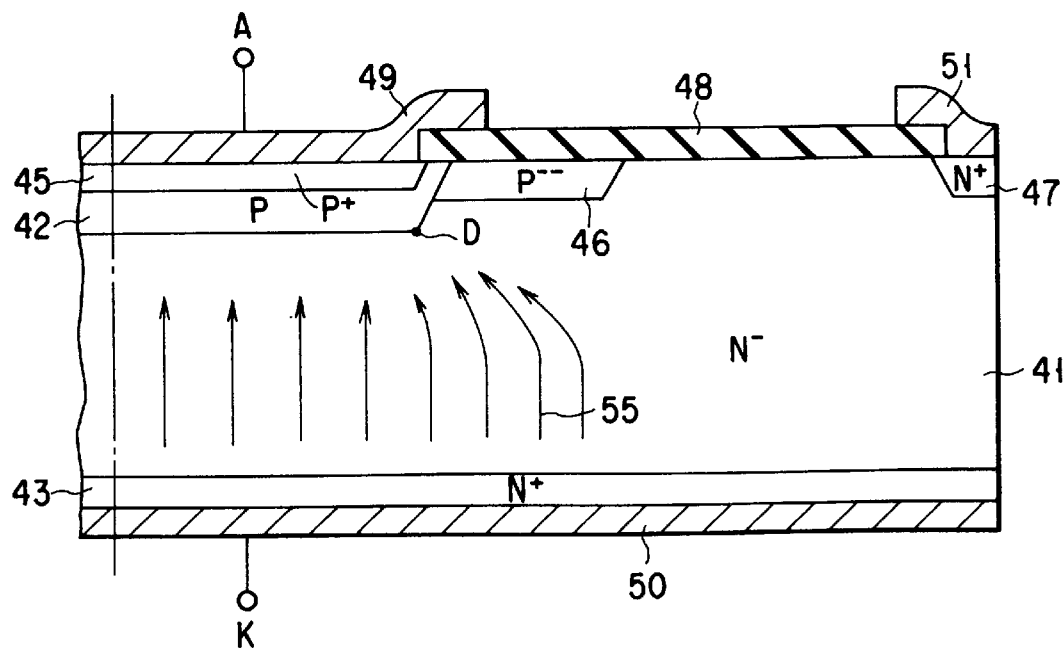
FIG. 2 is a cross sectional view corresponding to a cross sectional view taken along the line 2—2 of FIG. 1, for illustrating the problem of a conventional high-withstand voltage diode.

FIG. 1 is a plan view showing a general high-withstand voltage diode. FIG. 2 is a cross sectional view taken along the line 2—2 of FIG. 1 and corresponding to the cross section of the right half portion of FIG. 1 and showing the element structure of the high-withstand voltage diode according to the prior art technique. In the drawing, 41 denotes an N⁻-type substrate of high resistance, a P-type emitter layer 42 is formed on the surface of the N⁻-type substrate 41, and a P⁺-type contact layer 45 having an anode electrode 49 formed thereon is formed on the surface of the P-type emitter layer 42. Further, an N⁺-type emitter layer 43 having a cathode electrode 50 formed thereon is formed on the rear surface of the N⁻-type substrate 41. A P⁻³¹-type RESURF layer 46 is formed in contact with the P-type emitter layer 42 on the surface of the N⁻-type substrate 41 to attain the high-withstand voltage characteristic. Further, an N⁺-type stopper layer 47 is formed outside the P⁻³¹-type RESURF layer 46 and a stopper electrode 51 is formed on the N⁺-type stopper layer 47. In the drawing, 48 denotes an insulating film.

However, the above conventional high-withstand voltage diode has the following problem. That is, if an attempt is made to rapidly recover the blocking state by applying a reverse voltage in the forward conductive state, the remaining carriers lying in the periphery portion of the device are concentrated in a portion near a D point of the end portion of the P-type emitter layer 42 in which the highest electric field is set up when the depletion layer extends. As a result, a problem that an avalanche current partially flows to destroy the device occurs.

As described above, in the conventional high-withstand voltage diode, there occurs a problem that a large reverse recovery current flows at the OFF time due to storage of carriers in the N⁻-type base layer of high resistance to generate a great power loss and heat, thereby destroying the device at the worst case. A first object of this invention is to provide a high-withstand voltage semiconductor device capable of preventing destruction by the remaining carriers in the periphery portion of the main element at the OFF time.

There will now be described embodiments of this invention in which a measure against destruction at the reverse recovery time is taken with reference to the accompanying drawings.

FIRST EMBODIMENT

Figure 3:
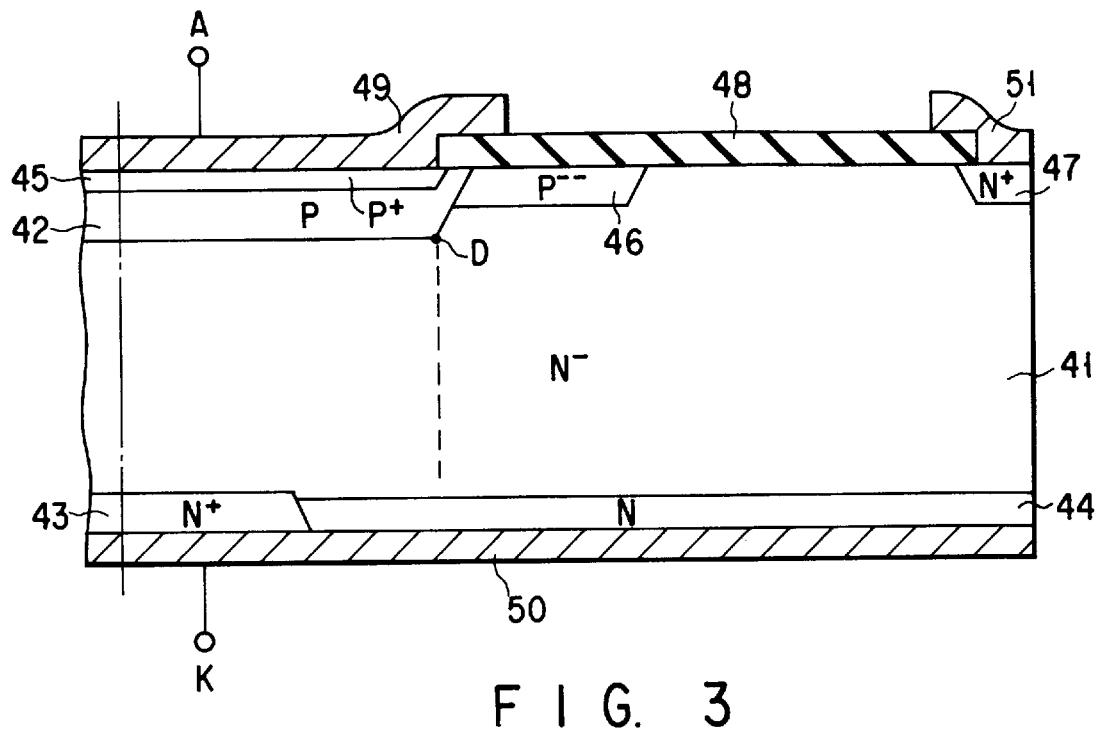
FIG. 3 is a cross sectional view corresponding to a cross sectional view taken along the line 2—2 of FIG. 1 and showing the right half portion of a high-withstand voltage diode according to a first embodiment of this invention.

FIG. 3 is a cross sectional view showing the right half portion of a high-withstand voltage diode according to a first embodiment of this invention. The plan view is the same as the plan view of FIG. 1 if no specific comment is made in the following embodiments of the high-withstand voltage diode and portions corresponding to those of the high-withstand voltage diode of FIG. 2 are denoted by the same reference numerals and the repetitive explanation therefor is omitted.

The feature of this embodiment is that the end portion of an N⁺-type emitter layer 43 is disposed nearer to the center than the end portion (indicated by broken lines) of a P-type emitter layer 42. Further, an N-type buffer layer 44 formed outside the end portion of the N⁺-type emitter layer 43 prevents the depletion layer from reaching a cathode electrode 50 (causing the punchthrough) at the time of application of a reverse voltage.

With the above element structure, since the electron injection from the cathode side is mainly caused only from the N⁺-type emitter layer 43 in the forward conductive state where the current density is high, the carrier density in a portion near the D point of the end portion of the P-type emitter layer 42 becomes low.

Therefore, even if the highest electric field point appears in a portion near the D point at the reverse recovery time, a problem that an avalanche current due to carrier concentration partially flows to destroy the device will not occur. Further, deterioration of the reverse recovery characteristic by carrier concentration can be prevented. It is also possible to set the end portion of the N+-type emitter layer 43 in position corresponding to the end portion of the P+-type emitter layer 42.

Figure 4:
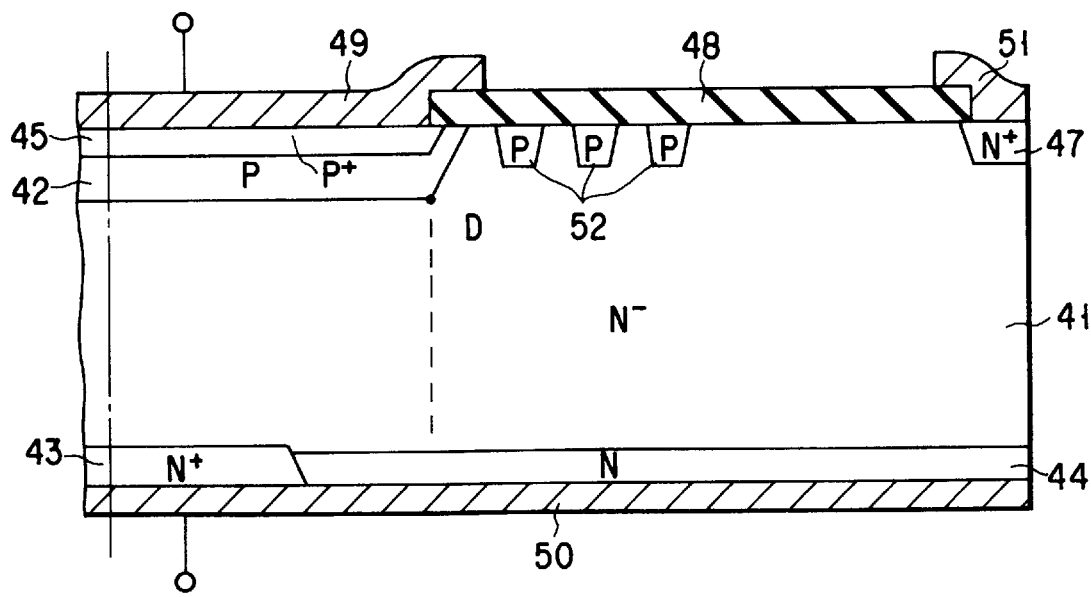
FIG. 4 is a cross sectional view showing the right half portion of a high-withstand voltage diode according to a modification of the first embodiment of this invention.

FIG. 4 is a cross sectional view showing the right half portion of a high-withstand voltage diode according to a modification of the first embodiment. In this modification, P-type guard ring layers 52 are used instead of the $P^{-31}$-type RESURF layer 46 so as to attain the high-withstand voltage characteristic. Also, in this modification, since the carrier density in a portion near the D point of the end portion of the P-type emitter layer 42 becomes low, the same effect as that obtained in the former embodiment can be attained.

SECOND EMBODIMENT

Figure 5:
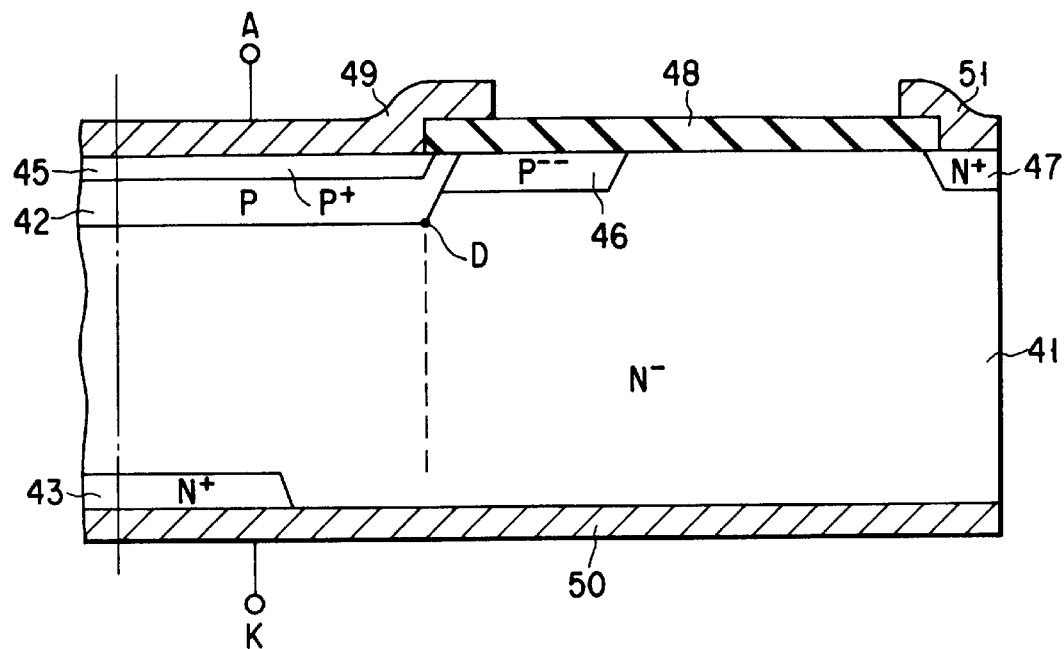
FIG. 5 is a cross sectional view showing the right half portion of a high-withstand voltage diode according to a second embodiment of this invention.

FIG. 5 is a cross sectional view showing the right half portion of a high-withstand voltage diode according to a second embodiment of this invention.

The high-withstand voltage diode of this embodiment is different from that of the first embodiment in that the N-type buffer layer 44 is not formed. By using a thick N⁻-type layer (substrate) 41 having no possibility of punchthrough, the high-withstand voltage diode with the above structure can be realized without causing any problem.

Figure 6:
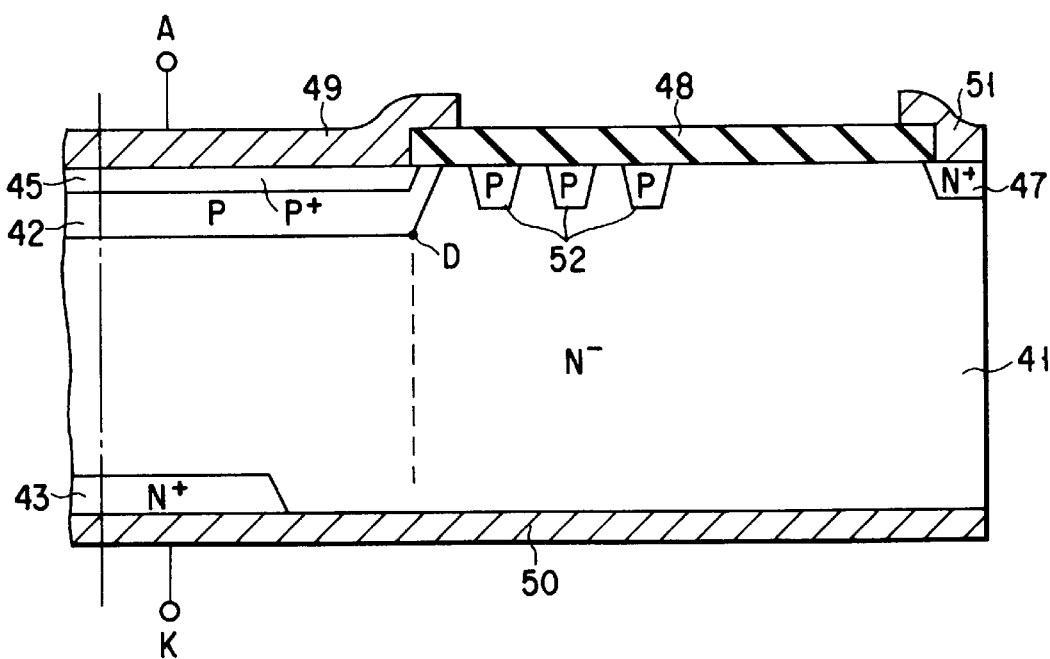
FIG. 6 is a cross sectional view showing the right half portion of a high-withstand voltage diode according to a modification of the second embodiment of this invention.

FIG. 6 is a cross sectional view showing the right half portion of a high-withstand voltage diode according to a modification of the second embodiment. In this modification, P-type guard ring layers 52 are used instead of the $P^{-31}$-type RESURF layer 46 so as to attain the high-withstand voltage characteristic. In this embodiment, since the carrier density in a portion near the D point of the end portion of the P-type emitter layer 42 becomes low, the same effect as that obtained in the former embodiments can be attained.

THIRD EMBODIMENT

FIG. 7 is a cross sectional view showing the right half portion of a high-withstand voltage diode according to a third embodiment of this invention. The high-withstand voltage diode of this embodiment is similar to that of the first embodiment except that an insulating film 48 is used instead of the N-type buffer layer 44 to prevent occurrence of the punchthrough. Also, in this embodiment, since the carrier density in a portion near the D point of the end portion of the P-type emitter layer 42 becomes low, the same effect as that obtained in the former embodiment can be attained.

FIG. 8 is a cross sectional view showing the right half portion of a high-withstand voltage diode according to a modification of the third embodiment of this invention. In this modification, P-type guard ring layers 52 are used instead of the $P^{-31}$-type RESURF layer 46 so as to attain the high-withstand voltage characteristic. Also, in this modification, since the carrier density in a portion near the D point of the end portion of the P-type emitter layer 42 becomes low, the same effect as that obtained in the former embodiment can be attained.

FOURTH EMBODIMENT

FIG. 9 is a cross sectional view showing the right half portion of a high-withstand voltage diode according to a fourth embodiment of this invention. The feature of this embodiment is that a second P⁻-type emitter layer 53 of low impurity concentration is formed between the first P-type emitter layer 42 and the $P^{-31}$-type RESURF layer 46, that is, around the first P⁻-type emitter layer 42.

In the second P⁻-type emitter layer 53, the impurity concentration is suppressed to a low value in a range in which a depletion layer will not be fully formed at the time of application of a reverse voltage and the injection efficiency is lowered. In this respect, it is basically different from the $P^{-31}$-type RESURF layer 46. With the above structure, since the carrier injection amount in the P⁻-type emitter layer 53 is small, the carrier density in a portion near the D point is lowered in the forward conductive state. Therefore, even if the highest electric field point appears in a portion near the D point at the reverse recovery time, a problem that an avalanche current due to carrier concentration partially flows to destroy the device will not occur.

It is also possible to set the depth of the second P⁻-type emitter layer 53 smaller than that of the P-type emitter layer 42.

FIG. 10 is a cross sectional view showing the right half portion of a high-withstand voltage diode according to a modification of the fourth embodiment. In this modification, P-type guard ring layers 52 are used instead of the $P^{-31}$-type RESURF layer 46 so as to attain the high-withstand voltage characteristic. Also, in this modification, since the carrier density in a portion near the D point becomes low, the same effect as that obtained in the former embodiment can be attained.

FIFTH EMBODIMENT

FIG. 11 is a cross sectional view showing the right half portion of a high-withstand voltage diode according to a fifth embodiment of this invention. The feature of this embodiment is that N+-type layers 54 for discharging electrons are formed in a portion of the P-type emitter layer 42 near the end portion thereof.

With the above element structure, since electrons lying near the D point are discharged from the N+-type layer 54 to the exterior of the main element in the forward conductive state, the carrier density in a portion near the end portion thereof becomes low. Therefore, even if the highest electric field point appears in a portion near the D point at the reverse recovery time, a problem that an avalanche current due to carrier concentration partially flows to destroy the device will not occur.

FIG. 12 is a cross sectional view showing the right half portion of a high-withstand voltage diode according to a modification of the fifth embodiment. In this modification, P-type guard ring layers 52 are used instead of the $P^{-31}$-type RESURF layer 46 so as to attain the high-withstand voltage characteristic. Also, in this modification, since the carrier density in a portion near the D point of the end portion of the P-type emitter layer 42 becomes low, the same effect as that obtained in the former embodiment can be attained.

SIXTH EMBODIMENT

Figure 13:
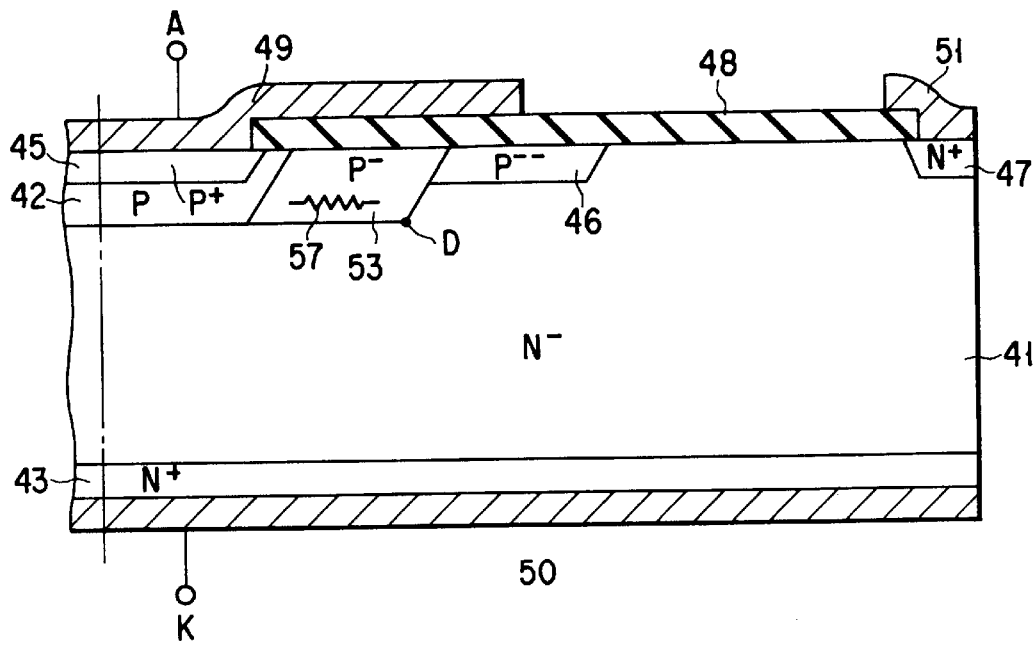
FIG. 13 is a cross sectional view showing the right half portion of a high-withstand voltage diode according to a sixth embodiment of this invention.

FIG. 13 is a cross sectional view showing the right half portion of a high-withstand voltage diode according to a sixth embodiment of this invention. In this example, a $P^{-31}$-type RESURF layer 46 for alleviation of electric field which is designed to be completely depleted at the time of application of a reverse voltage is formed to attain the high-withstand voltage characteristic. The feature of this structure is that a P⁻-type emitter layer 53 of low injection efficiency which is designed not to be completely depleted at the time of application of a reverse voltage is formed between the P-type emitter layer 42 and the $P^{-31}$-type RESURF layer 46 and an anode electrode 49 is formed in contact with only the P-type emitter layer 42 and is not formed in contact with the P⁻-type emitter layer 53.

With the above structure, the carrier density in a portion near the D point becomes low in the forward conductive state by the double effects that the carrier injection amount is reduced by the low impurity concentration of the P⁻-type emitter layer 53 and the carrier injection in a portion near the D point is limited by the lateral resistance 57 of the P⁻-type emitter layer 53. Therefore, an avalanche current due to carrier concentration will not occur even if the highest electric field point appears in the D point at the reverse recovery time, thereby making the structure highly resistant to destruction.

As described above, according to this embodiment, the breakdown strength can be enhanced, with having the good forward characteristic.

Figure 14:
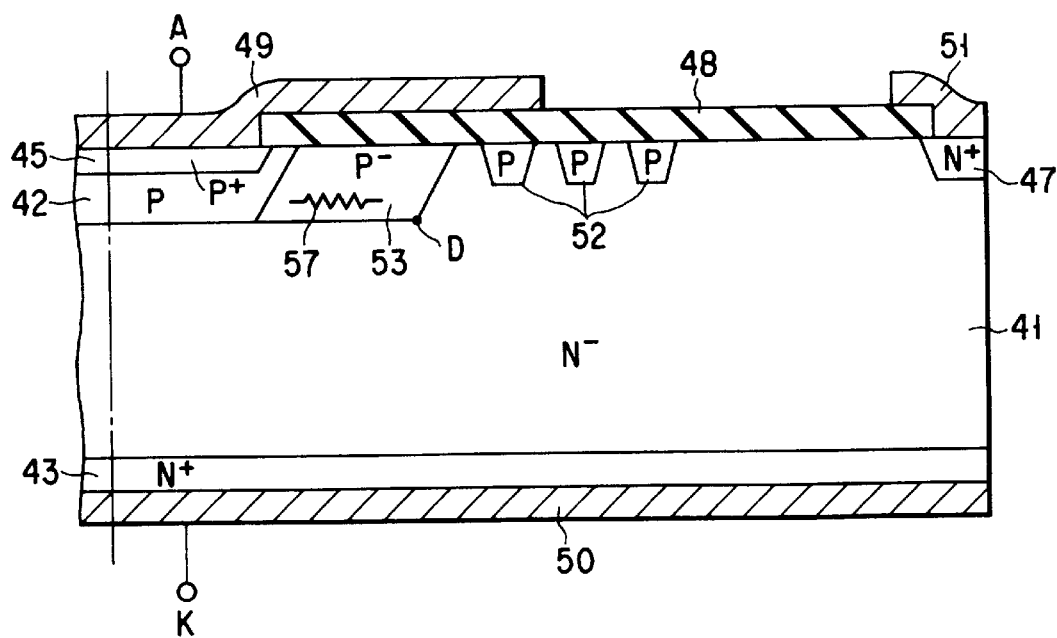
FIG. 14 is a cross sectional view showing the right half portion of a high-withstand voltage diode according to a first modification of the sixth embodiment of this invention.

FIG. 14 is a cross sectional view of a high-withstand voltage diode according to a first modification of the above embodiment. The modification is similar to the above embodiment except that P-type guard ring layers 52 for alleviation of electric field are formed instead of the $P^{-31}$-type RESURF layer 46.

Figure 15:
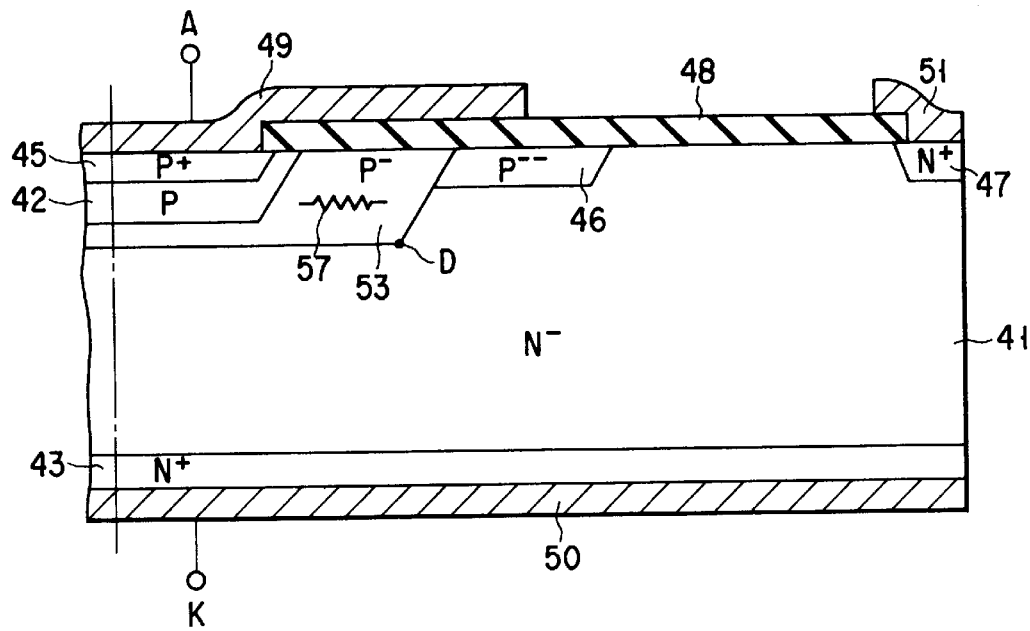
FIG. 15 is a cross sectional view showing the right half portion of a high-withstand voltage diode according to a second modification of the sixth embodiment of this invention.

FIG. 15 is a cross sectional view showing the element structure of a high-withstand voltage diode according to a second modification of the above embodiment. In this modification, a P⁻-type emitter layer 53 is formed to surround the P-type emitter layer 42. Also, in this case, the same effect as that in the case of FIG. 13 can be attained.

Figure 16:
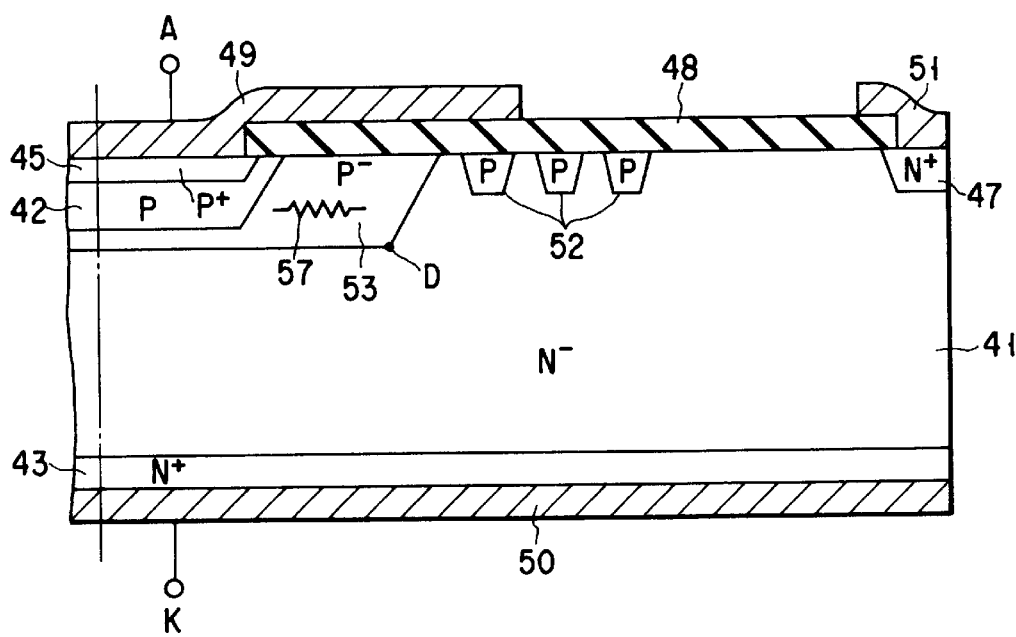
FIG. 16 is a cross sectional view showing the right half portion of a high-withstand voltage diode according to a third modification of the sixth embodiment of this invention.

FIG. 16 is a cross sectional view of a high-withstand voltage diode according to a third modification of the above embodiment. This modification is similar to the second modification except that P-type guard ring layers 52 for alleviation of electric field are formed instead of the $P^{-31}$-type RESURF layer 46.

SEVENTH EMBODIMENT

Figure 17:
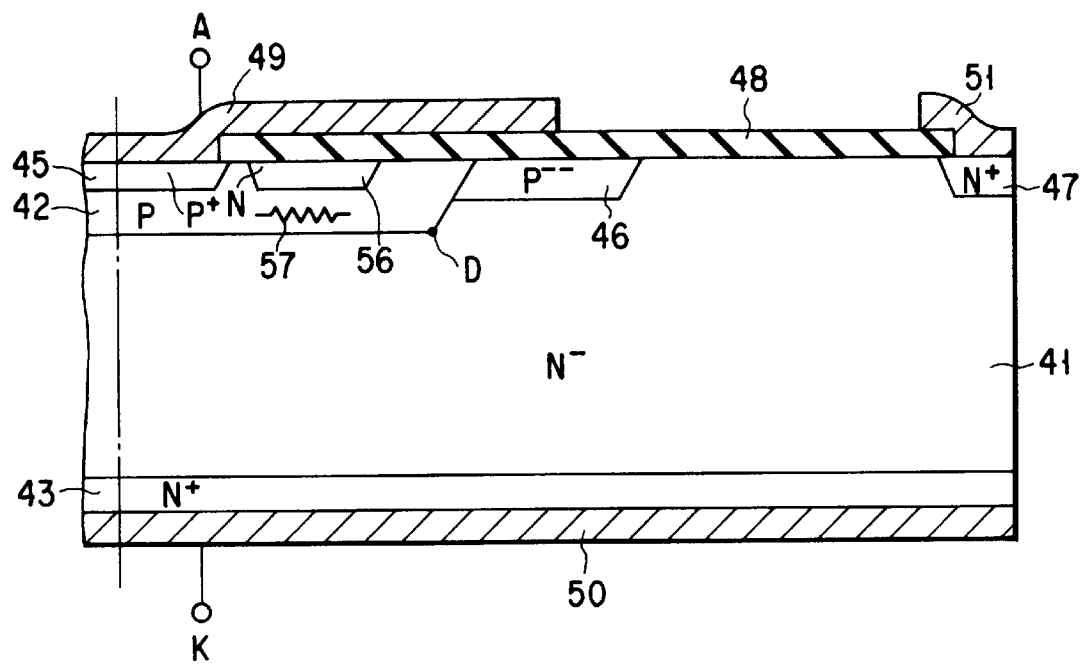
FIG. 17 is a cross sectional view showing the right half portion of a high-withstand voltage diode according to a seventh embodiment of this invention.

FIG. 17 is a cross sectional view showing the right half portion of a high-withstand voltage diode according to a seventh embodiment of this invention. In this example, a $P^{-31}$-type RESURF layer 46 is formed to attain the high-withstand voltage characteristic. The feature of this structure is that an N-type layer 56 for adjustment of injection efficiency is formed on the surface of a peripheral portion of a P-type emitter layer 42 and an anode electrode 49 is formed in contact with only the P-type emitter layer 42. The P-type emitter layer 42 is so designed that a portion of the P-type emitter layer which lies directly under the N-type layer 56 will not be completely depleted at the time of application of a reverse voltage.

With the above structure, since the impurity amount of the P-type emitter layer 42 lying directly under the N-type layer 56 can be adjusted by adjusting the diffusion depth of the N-type layer 56, it becomes possible to lower the carrier injection efficiency. Also, in this case, the carrier density in a portion near the D point is made low in the forward conductive state by the effect that the carrier injection in the portion near the D point is limited by the lateral resistance 57 of the P-type emitter layer 42 in addition to the above effect. For this reason, even if the highest electric field point occurs in the D point at the reverse recovery time, no avalanche current due to carrier concentration occurs and the structure which is highly resistant to destruction can be obtained. As the N-type layer 56, a plurality of N-type layers may be linearly arranged.

Figure 18:
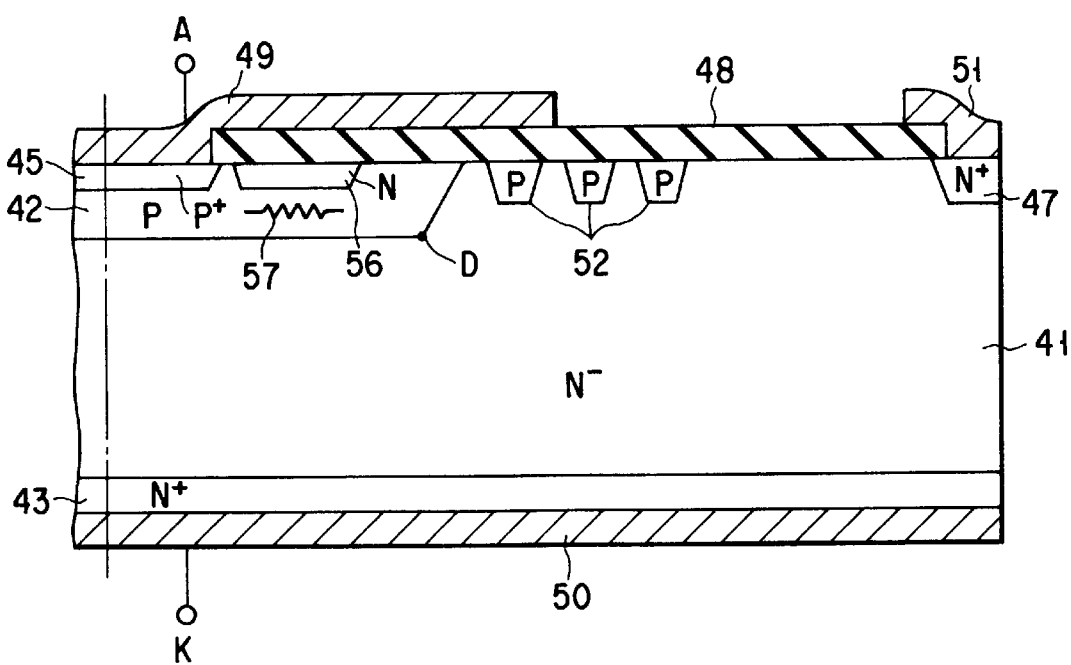
FIG. 18 is a cross sectional view showing the right half portion of a high-withstand voltage diode according to a modification of the seventh embodiment of this invention.

FIG. 18 is a cross sectional view of a high-withstand voltage diode according to a modification of the above embodiment. This modification is similar to the above embodiment except that P-type guard ring layers 52 for alleviation of electric field are formed instead of the $P^{-31}$-type RESURF layer 46.

EIGHTH EMBODIMENT

Figure 19:
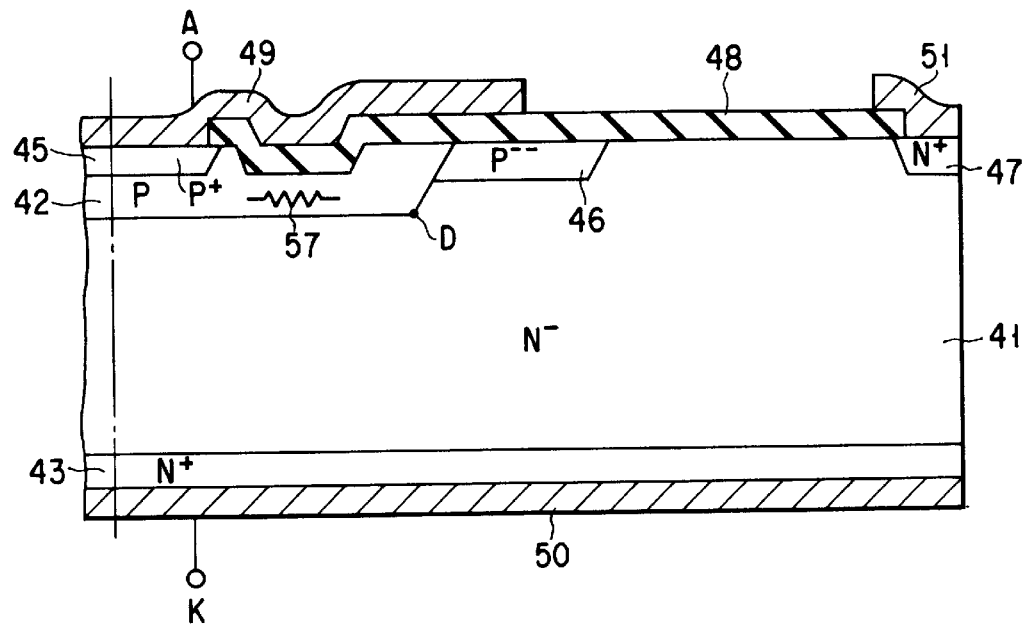
FIG. 19 is a cross sectional view showing the right half portion of a high-withstand voltage diode according to an eighth embodiment of this invention.

FIG. 19 is a cross sectional view showing the right half portion of a high-withstand voltage diode according to an eighth embodiment of this invention. In this example, a $P^{-31}$-type RESURF layer 46 is formed to attain the high-withstand voltage characteristic. The feature of this structure is that the surface portion of a peripheral portion of a P-type emitter layer 42 is removed by a preset amount by a process such as RIE and an anode electrode 49 is formed in contact with only the P-type emitter layer 42. The P-type emitter layer 42 is so designed that a portion of the P-type emitter layer which lies directly under the removed portion will not be completely depleted at the time of application of a reverse voltage.

With the above structure, since the impurity amount of the P-type emitter layer 42 lying directly under the removed portion can be adjusted by adjusting the depth of the removed portion, it becomes possible to lower the carrier injection efficiency. Also, in this case, the carrier density in a portion near the D point is made low in the forward conductive state by the effect that the carrier injection in the portion near the D point is limited by the lateral resistance 57 of the P-type emitter layer 42 in addition to the above effect. For this reason, even if the highest electric field point occurs in the D point at the reverse recovery time, no carrier concentration occurs and the structure which is highly resistant to the destruction can be obtained.

Figure 20:
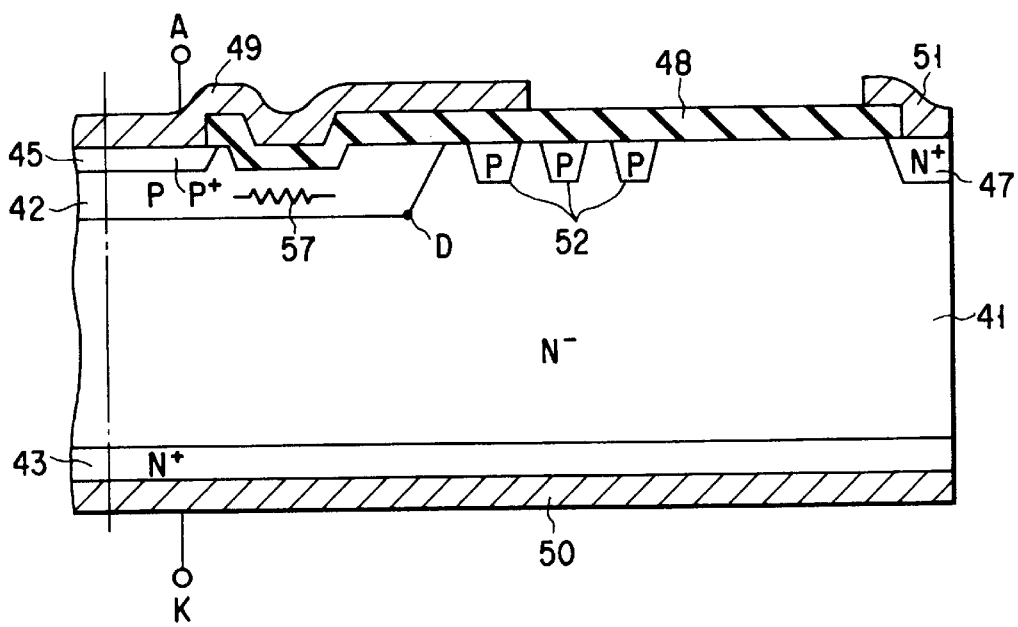
FIG. 20 is a cross sectional view showing the right half portion of a high-withstand voltage diode according to a modification of the eighth embodiment of this invention.

FIG. 20 is a cross sectional view of a high-withstand voltage diode according to a modification of the above embodiment. This modification is similar to the above embodiment except that P-type guard ring layers 52 for alleviation of electric field are formed instead of the $P^{-31}$-type RESURF layer 46.

NINTH EMBODIMENT

Figure 21:
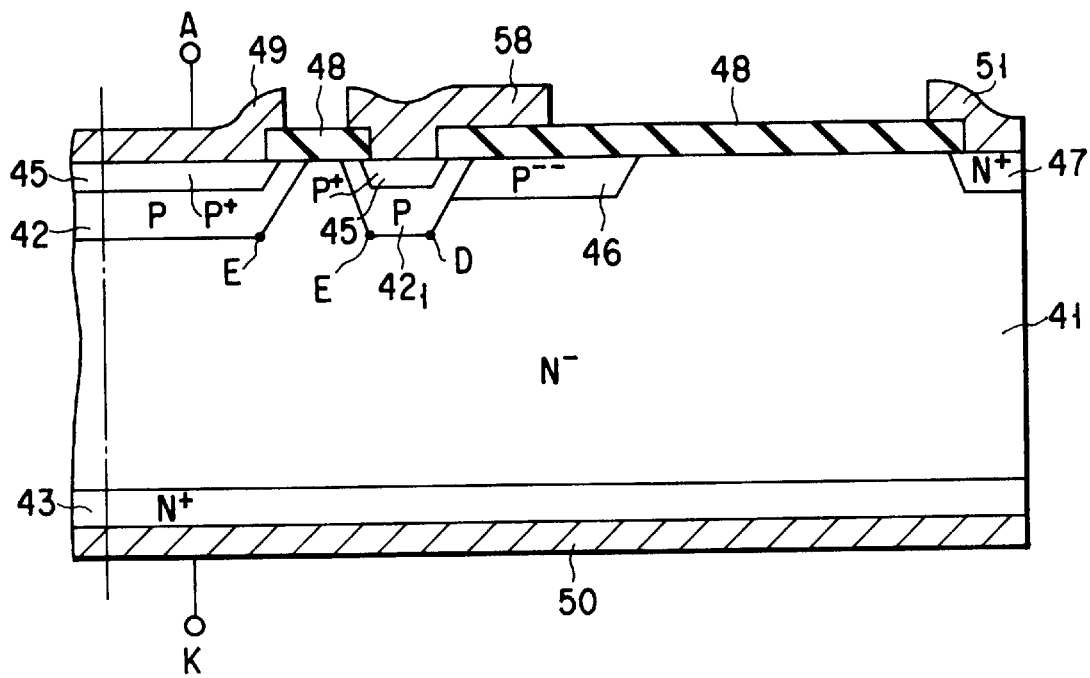
FIG. 21 is a cross sectional view showing the right half portion of a high-withstand voltage diode according to a ninth embodiment of this invention.

FIG. 21 is a cross sectional view showing the right half portion of a high-withstand voltage diode according to a ninth embodiment of this invention. In this example, a $P^{-31}$-type RESURF layer 46 is formed to attain the high-withstand voltage characteristic. The feature of this structure is that a P-type emitter layer $42_1$ on the peripheral portion of the element is separated, an anode electrode 49 is also separated, and a field plate electrode 58 is provided. With this structure, since the P-type emitter layer $42_1$ is separated and carriers are not injected from the P-type emitter layer $42_1$ on the peripheral portion of the element, the carrier density in a portion near the D point can be suppressed at the forward bias time. For this reason, even if the highest electric field point occurs in the D point at the reverse recovery time, no avalanche current due to carrier concentration occurs and the structure which is highly resistant to the destruction can be obtained. The electric field in the E point becomes intense because of separation of the layer, but if the separation distance is short, the influence thereof can be suppressed into a permissible range.

Figure 22:
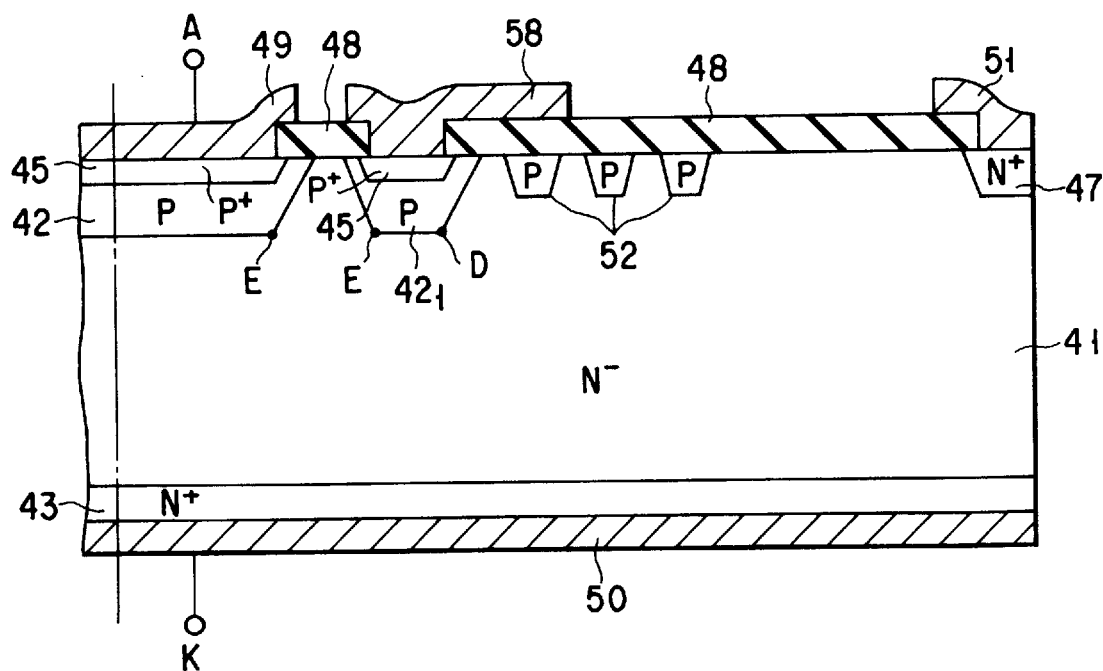
FIG. 22 is a cross sectional view showing the right half portion of a high-withstand voltage diode according to a modification of the ninth embodiment of this invention.

FIG. 22 is a cross sectional view of a high-withstand voltage diode according to a modification of the above embodiment. This modification is similar to the above embodiment except that P-type guard ring layers 52 for alleviation of electric field are formed instead of the $P^{-31}$-type RESURF layer 46.

TENTH EMBODIMENT

Figure 23:
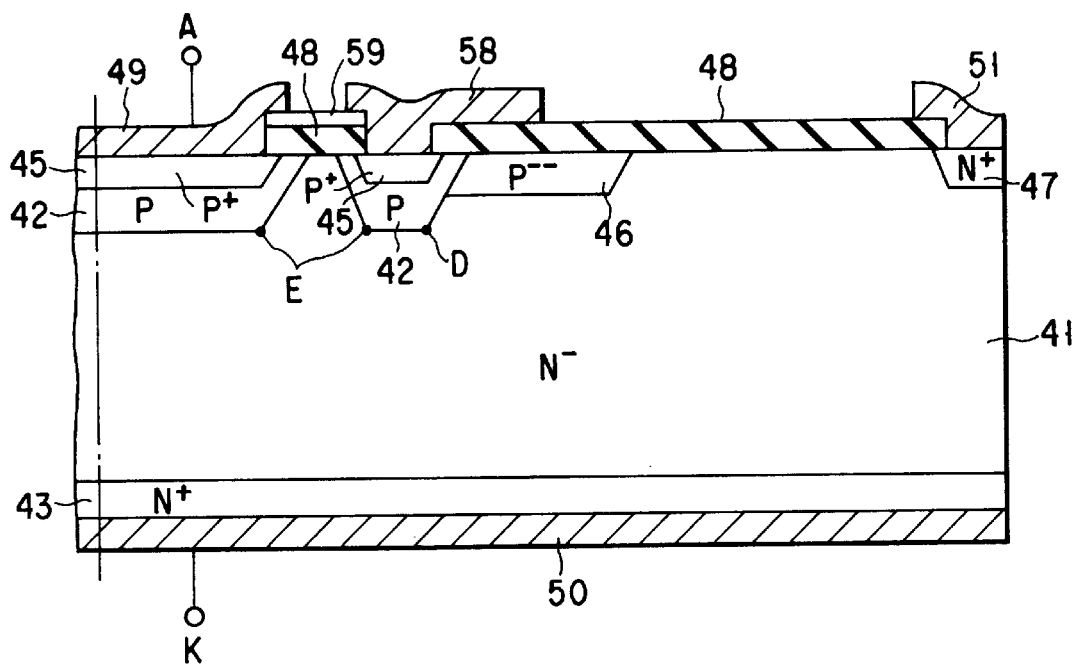
FIG. 23 is a cross sectional view showing the right half portion of a high-withstand voltage diode according to a tenth embodiment of this invention.

FIG. 23 is a cross sectional view showing the right half portion of a high-withstand voltage diode according to a tenth embodiment of this invention. In this example, a $P^{-31}$-type RESURF layer 46 is formed to attain the high-withstand voltage characteristic. The feature of this structure is that a high-resistance film (polysilicon film or the like) 59 is formed to connect the anode electrode 49 which is separated as shown in FIG. 21 with the field plate electrode 58. With this structure, since the potential of the field plate electrode 58 is fixed to the same potential as that of the anode electrode 49 by the presence of the high-resistance film 59, the an electric field at the E point is lowered, and since carriers are not injected from the P-type emitter layer 42 lying in the peripheral portion of the element by the presence of the high-resistance film 59, the carrier density in a portion near the D point at the forward bias time can be suppressed. Therefore, an avalanche current due to carrier concentration will not occur even if the highest electric field point occurs in the D point at the reverse recovery time, thereby making the structure highly resistant to destruction.

Figure 24:
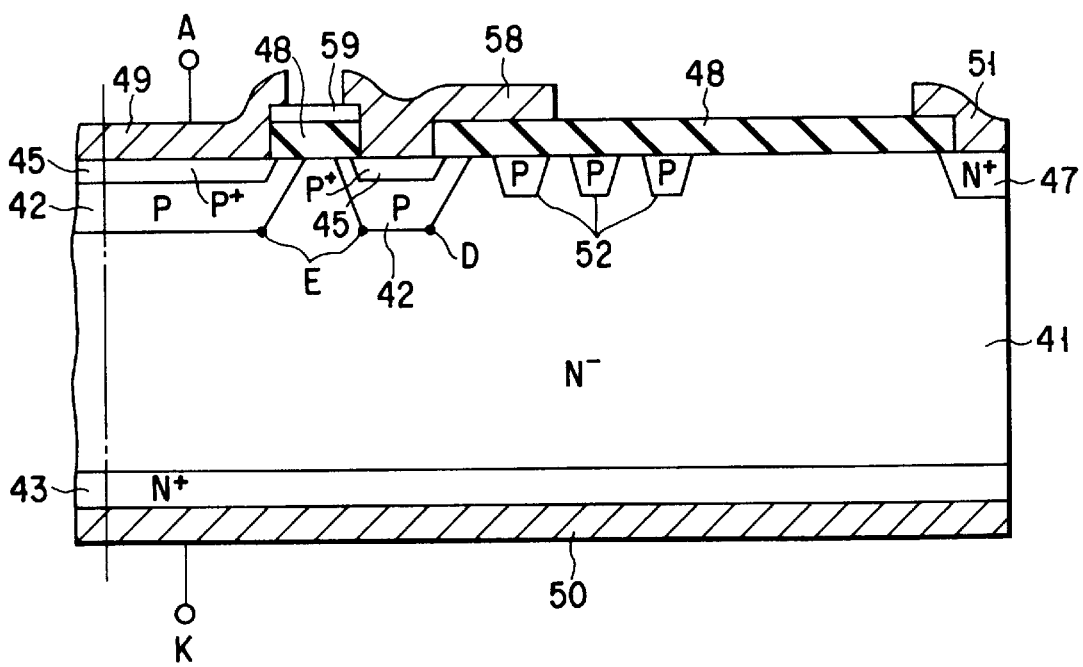
FIG. 24 is a cross sectional view showing the right half portion of a high-withstand voltage diode according to a modification of the tenth embodiment of this invention.

FIG. 24 is a cross sectional view of a high-withstand voltage diode according to a modification of the above embodiment. This modification is similar to the above embodiment except that a P-type guard ring layer 52 for alleviation of electric field is formed instead of the $P^{-31}$-type RESURF layer 46.

ELEVENTH EMBODIMENT

FIG. 25 is a cross sectional view showing the right half portion of a high-withstand voltage diode according to an eleventh embodiment of this invention. In this example, $P^{-31}$-type RESURF layer 46 are formed to attain the high-withstand voltage characteristic. The feature of this structure is that the end portion of an $N^+$-type emitter layer 43 is disposed nearer to the center than the end portion (indicated by broken lines) of a P-type emitter layer 42. Further, an N-type buffer layer 44 formed outside the end portion of the $N^+$-type emitter layer 43 prevents the depletion layer from reaching a cathode electrode 50 (causing the punchthrough) at the time of application of a reverse voltage. Further, the $N^+$-type emitter layer 43 is formed deeper than the N-type buffer layer 44. With the above element structure, the end portion of the $N^+$-type emitter layer 43 is disposed nearer to the center than the end portion of the P-type emitter layer 42 and the $N^+$-type emitter layer 43 is deeply formed. As a result, the distance through which a main current flows across the $N^-$-type substrate 41 and the spreading degree of the main current can be suppressed, thereby making it possible to increase the thickness of the $N^-$-type substrate 41 near a portion directly under the point D. Therefore, the electric field in a portion near the D point is so lowered that the high breakdown strength is realized, since a depletion layer near the D point is widened at the reverse recovery time and the reduction effect of the carrier injection amount by N-type buffer 44 is added.

FIG. 26 is a cross sectional view showing the right half portion of a high-withstand voltage diode according to a first modification of the above embodiment. This modification is similar to the above embodiment except that P-type guard ring layers 52 for alleviation of electric field are formed instead of the RESURF layer 46.

FIG. 27 is a cross sectional view showing the right half portion of a high-withstand voltage diode according to a second modification of the above embodiment. This modification is basically the same as the above embodiment of FIG. 25, but in this example, the N-type buffer layer 44 is omitted. If a sufficiently thick substrate having no possibility of punchthrough is used, this structure can be made.

FIG. 28 is a cross sectional view showing the right half portion of a high-withstand voltage diode according to a third modification of the above embodiment. This modification is similar to the second modification except that P-type guard ring layers 52 for alleviation of electric field are formed instead of the $P^{-31}$-type RESURF layer 46 of the second modification.

Figure 29:
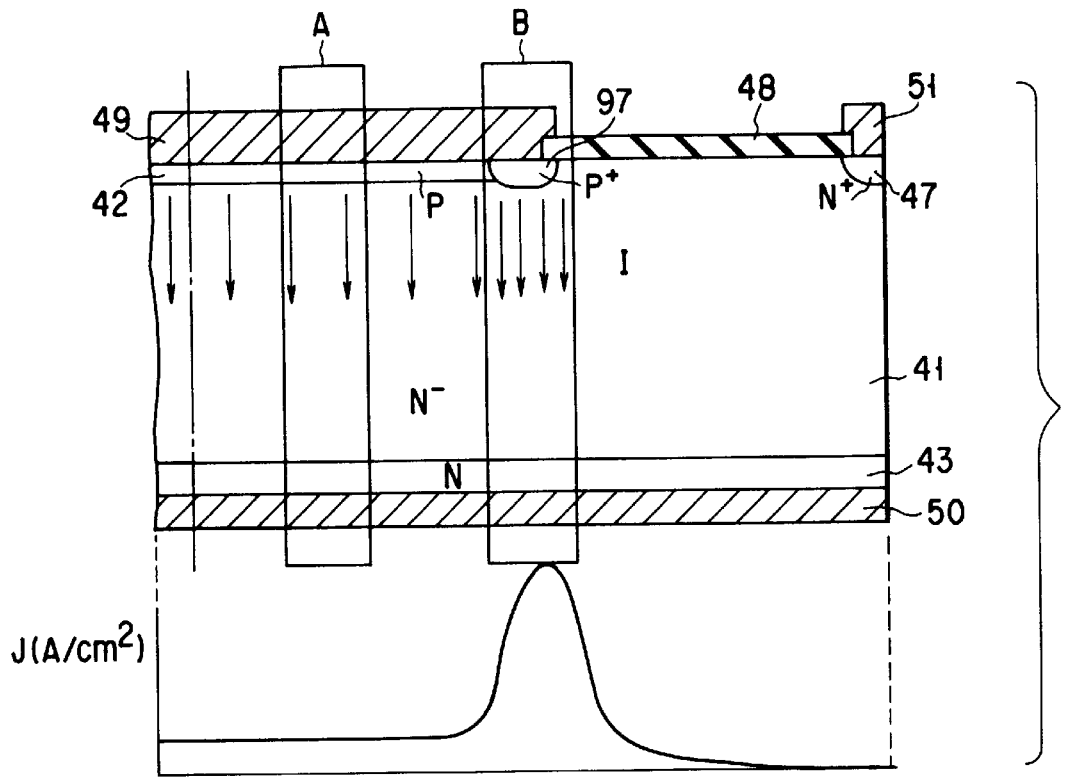
FIG. 29 is a cross sectional view for illustrating another problem of the conventional high-withstand voltage diode.

In the above first to eleventh embodiments, examples of the high-withstand voltage diode in which the P-type guard ring layers 52 or the $P^{-31}$-type RESURF layer 46 relaxes the electric field at the end portion of P-type emitter layer 42 are explained. In the conventional high-withstand voltage diode, a highly concentrated and deeply formed P-type guard ring layer is sometimes formed at the end portion of P-type emitter layer 42 which is so designed as a layer of relatively low concentration and shallow depth. FIG. 29 shows a cross section of the right half portion of the conventional high-withstand voltage diode together with the distribution of the current density J in the element in the ON state. For easy understanding, portions which are the same as those in the first to eleventh embodiments are denoted by the same reference numerals.

In FIG. 29, 41 denotes an N-type base layer of high resistance, a P-type emitter layer 42 is selectively formed by diffusion on the front surface of the N-type base layer 41, and an N-type emitter layer 43 is formed by diffusion on the rear surface of the N-type base layer 41. An anode electrode 49 is formed on the P-type emitter layer 42 and a cathode electrode 50 is formed on the N-type emitter layer 43.

Further, in the above high-withstand voltage diode, the following junction edge structure is formed. That is, a deep P-type guard ring layer 97 of high impurity concentration for enhancing the withstand voltage is formed in contact with the P-type emitter layer 42 to surround the P-type emitter layer 42 on the surface of the N-type base layer 41. Further, an N-type stopper layer 47 of high impurity concentration for preventing a depletion layer from being spread to the substrate end portion when a reverse bias voltage is applied between the anode and cathode is formed on the surface of the N-type base layer 41.

If a forward bias voltage is applied to the high-withstand voltage diode with the above structure to set the ON state, holes are injected also from the P-type guard ring layer 97 since the P-type guard ring layer 97 is electrically connected to the anode electrode 49. Further, since the impurity concentration of the P-type guard ring layer 97 is high and the impurity diffusion depth is deep, holes are injected from the P-type guard ring layer 97 with a higher injection efficiency than from the P-type emitter layer 42. Thus, the hole injection efficiency of the P-type guard ring layer 97 is enhanced, and as a result, a current I is concentrated in the P-type guard ring layer 97 and the current density in the P-type guard ring layer 97 is increased.

Figure 30:
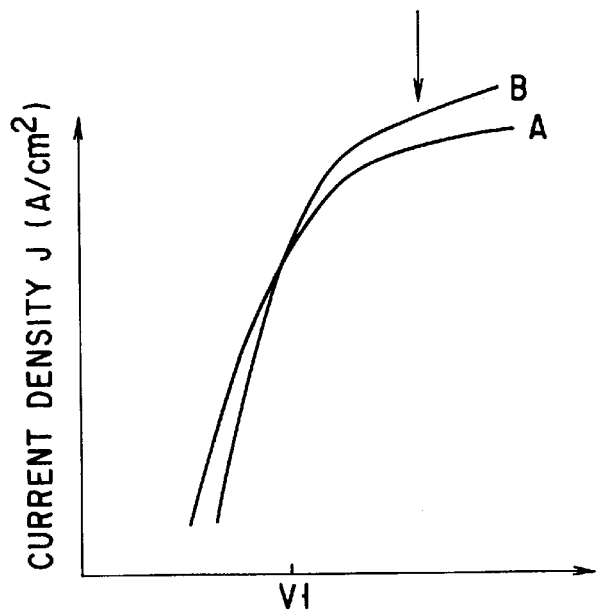
FIG. 30 is a characteristic diagram showing the relation between the current density J in the element portion of the diode and the junction edge portion of FIG. 29 and a voltage V between the anode and the cathode.

FIG. 30 is a characteristic diagram showing the relation between the current density J in the element portion A of the diode and the junction edge portion (P-type guard ring layer 97) B of FIG. 29 and a voltage V between the anode and the cathode. In FIG. 30, an arrow indicates a voltage which causes the current density distribution of FIG. 29.

In a voltage range (V<V1) in which the current density J is small, the current flows mainly in the element portion A as the voltage V is lower and the current flows uniformly in the whole element. On the other hand, in a voltage range (V>V1) in which the current density J is large, the current flows mainly in the junction edge portion B as the voltage V becomes higher, and as a result, the current is concentrated in the junction edge portion B. Therefore, as the voltage V is increased to cause a larger current, the current is more concentrated in the junction edge portion B.

When the state is changed from the ON state in which the current concentration occurs to the OFF state (reverse recovery), the junction edge portion is set into a high electric field/high current density state. Such a state may cause the element destruction. For this reason, there occurs a problem that it is impossible to raise the voltage V in the conventional high-withstand voltage diode and the stable operation region is significantly limited.

The following embodiments are made by taking the above condition into consideration and are examples of a high-withstand voltage diode having a stable operation region larger than in the conventional case.

TWELFTH EMBODIMENT

Figure 31:
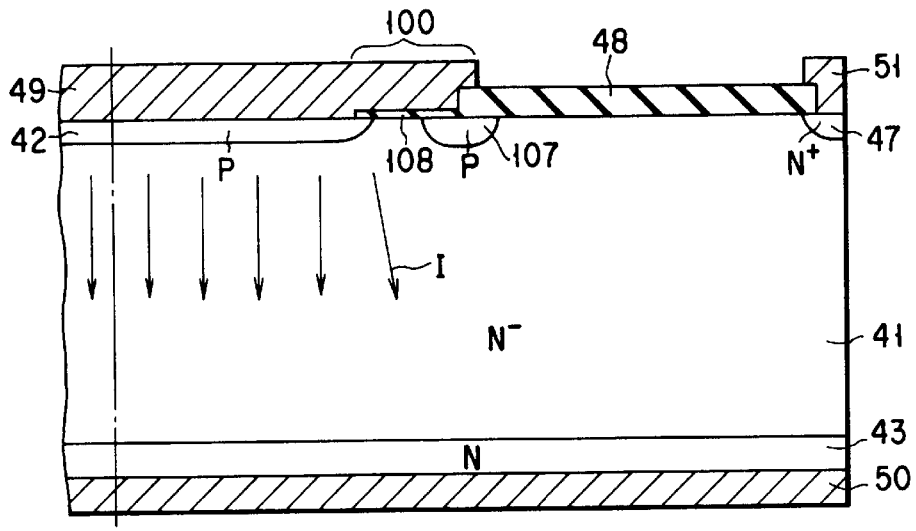
FIG. 31 is a cross sectional view showing the right half portion of a high-withstand voltage diode according to a twelfth embodiment of this invention.

FIG. 31 is a cross sectional view showing the right half portion of a high-withstand voltage diode according to a twelfth embodiment of this invention. In FIG. 31, 41 denotes an N-type base layer and a P-type emitter layer 42 is selectively formed by diffusion on the surface of the N-type base layer 41. Further, a P-type diffusion layer 107 is formed to surround the P-type emitter layer 42 on the surface of the N-type base layer 41. The P-type diffusion layer 107 is not formed in contact with the P-type emitter layer 42. An N-type stopper layer 47 of high impurity concentration is formed on the surface of a portion of the N-type base layer 41 which lies outside the P-type diffusion layer 107.

In this case, it is preferable to set the surface impurity concentration of the P-type diffusion layer 107 higher than the substantial surface impurity concentration of the P-type emitter layer 42. Further, it is preferable that the total amount of impurities in the P-type diffusion layer 107 is larger than the substantial total amount of impurities in the P-type emitter layer 42. In addition, it is preferable to form the P-type diffusion layer 107 deeper than the P-type emitter layer 42.

On the other hand, an N-type emitter layer 43 is formed on the rear surface of the N-type base layer 41. A cathode electrode 50 is formed on the N-type emitter layer 43. Further, an anode electrode 49 is formed on the P-type emitter layer 42.

Further, an electrode 100 is disposed over the N-type base layer 41 between the P-type emitter layer 42 and the P-type diffusion layer 107 with an insulating film 108 disposed therebetween and thus a MOS gate structure (P-channel MOSFET) for selectively short-circuiting the P-type emitter layer 42 and the P-type diffusion layer 107 is formed. In this case, it is preferable to use a thermal oxide film as the insulating film 108. Further, it is preferable to set the film thickness of the insulating film 108 equal to or less than 0.5 µm.

Further, the electrode 100 is formed integrally with the anode electrode 49. In other words, the anode electrode 49 is formed to extend out of the area of the P-type emitter layer 42 and the extending portion is used as a third electrode following the anode and cathode. It is not necessary to form the MOS gate structure in the entire peripheral portion of the P-type emitter layer 42. Further, a polycrystalline silicon layer may be formed between the electrode 100 and the insulating film 108 to decrease the interface level and stabilize a MOS characteristic.

If a forward bias voltage is applied to the high-withstand voltage diode with the above structure, the element is set into the ON state and a current flow in a path between the anode and the cathode. At this time, since the the potential of the P-type diffusion layer 107 is low and the P-channel MOSFET is set in the OFF state, the P-type emitter layer 42 and the P-type diffusion layer 107 are not short-circuited to each other and no current flows into the P-type diffusion layer 107. As a result, holes from the P-type diffusion layer 107 are not injected. Therefore, unlike the conventional case, the current I is not concentrated in the junction edge portion (the end portion of the P-type emitter layer 42, the surrounding portion of the P-type diffusion layer 107) in the ON state.

If a reverse bias voltage is applied in this state to change the state from the ON state to the OFF state, a P-type channel 109 is induced in a portion below the electrode 100, and the voltage of the P-type diffusion layer with respect to the electrode 100 is fixed to a voltage (the threshold voltage of the P-channel MOSFET) which causes the P-channel MOSFET to be turned ON. That is, since the P-channel MOSFET is a source follower, the potential of the P-type diffusion layer 107 is fixed to the threshold voltage of the P-channel MOSFET.

Figure 32:
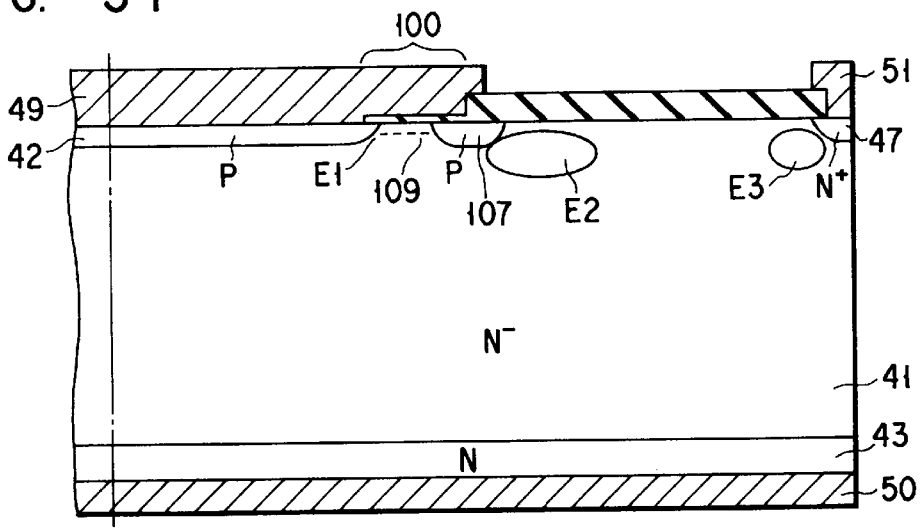
FIG. 32 is a view showing the state of the electric field in the element portion in the OFF state of the diode of FIG. 31.

FIG. 32 shows the state of the electric field in the element in the OFF state. In FIG. 32, 109 denotes a P-type channel. Electric fields E2, E3 having intense lateral components are created near the P-type diffusion layer 107 and N-type stopper layer 47 and an electric field E1 having a weak lateral component is created in the end portion of the P-type emitter layer 42.

This is because the P-type emitter layer 42 and the P-type diffusion layer 107 are short-circuited in the OFF state and the potential of the P-type diffusion layer 107 is kept at the threshold voltage (for example, the threshold voltage is approx. 4 V although a voltage between the source and the drain is several thousand V), and as a result, the P-type emitter layer 42 is shielded from the lateral electric field by the P-type diffusion layer 107 and becomes difficult to be influenced by the intense electric field E2.

Since the current of high current density flows at the end portion of the P-type emitter layer 42 in the ON state but the electric field E1 created in the end portion of the P-type emitter layer 42 is weak in the OFF state, the end portion of the P-type emitter layer 42 can be prevented from being set into a high electric field/high current density state when the state is change from the ON state to the OFF state (at the reverse recovery time).

On the other hand, since no current flows in the ON state although the intense electric field E2 is created in the end portion of the P-type diffusion layer 107 which lies on the opposite side of the P-type emitter layer 42 in the OFF state, the P-type diffusion layer 107 will not be set into the high electric field/high current density state at the reverse recovery time.

Therefore, according to this embodiment, since the junction edge portion is not set into the high electric field/high current density state at the reverse recovery time, the element destruction will not occur and the stable operation region can be made wider than in the conventional case.

Figure 33:
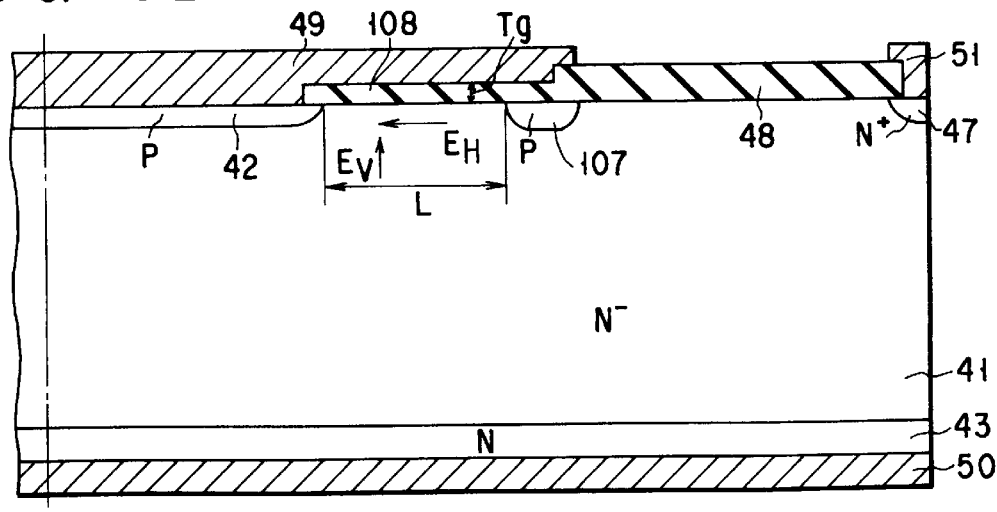
FIG. 33 is a view for illustrating the preferable relation between the film thickness Tg of an insulating film of the diode of FIG. 31 and a distance L from the P-type emitter layer to the P-type diffusion layer.

The preferable relation between the film thickness Tg of the insulating film 108 of the diode of FIG. 31 and a distance L from the P-type emitter layer 42 to the P-type diffusion layer 107 is illustrated with reference to FIG. 33. If the potential applied to the P-type diffusion layer 107 is V and the horizontal electric field applied to the P-type diffusion layer 107 is $E_H$, then $E_H=V/L$. It is preferable to set the relation of $E_H<0.1\ E_V$ in order to attain a sufficiently high withstand voltage. $E_V$ indicates the vertical electric field applied to the P-type diffusion layer 107.

The potential V can be expressed by $V=Tg \times Eg=Tg \times \epsilon_B \times E_H/\epsilon_g$ in a simple model. Eg indicates the electric field applied to the insulating film 108, $\epsilon_B$ indicates the dielectric constant of the N-type base layer 41, and $\epsilon_g$ indicates the dielectric constant of the insulating film 108.

Therefore, the inequality $E_H < 0.1\ E_V$ is changed to $Tg \times \epsilon_B E_V/(L \times \epsilon_g) < 0.1\ E_V$, and based on this inequality, the inequality $L > 10 \times \epsilon_B \times Tg/\epsilon_g$ can be derived.

If the material of the N-type base layer 41 is silicon and the material of the insulating film 108 is silicon oxide, the value of $10 \times \epsilon_B \times Tg/\epsilon_g$ is set to approx. 30 Tg. Therefore, it is preferable to set L larger than 30 Tg in order to attain a sufficiently high withstand voltage. In other words, the distance L between P-type emitter layer 42 and P-type diffusion layer 107 is preferably set to be more than 30 times the film thickness Tg of the insulating film 108.

THIRTEENTH EMBODIMENT

FIG. 34 is a cross sectional view showing the right half portion of a high-withstand voltage diode according to a thirteenth embodiment of this invention. The high-withstand voltage diode of this embodiment is similar to that of the twelfth embodiment except that N-type diffusion layers 111 are selectively formed on the surface of the P-type emitter layer 42 to reduce the hole injection efficiency of the P-type emitter layer 42 and enhance the operation speed of the element.

Like the twelfth embodiment, according to this embodiment, since the junction edge portion is not set into the high electric field/high current density state at the reverse recovery time, the element destruction will not occur and the stable operation region can be made wider than that in the conventional case. If the N-type diffusion layer 111 is formed so small that the current flow under it does not generate large voltage drop, a problem that the parasitic transistor (formed of the N-type diffusion layer 111, P-type emitter layer 42 and N-type base layer 41) is operated will not occur.

FOURTEENTH EMBODIMENT

FIG. 35 is a cross sectional view showing the right half portion of a high-withstand voltage diode according to a fourteenth embodiment of this invention. The high-withstand voltage diode of this embodiment is similar to that of the twelfth embodiment except that the anode electrode 49 is formed in contact with the N-type base layer 41 to make a Schottky junction and the diode is not constructed by the PN junction but by the Schottky junction.

In the case of the conventional Schottky diode, since the P-type diffusion layer 107 is formed in contact with the anode electrode 49, there occurs a problem that the stable operation region of the element is narrowed and a high-speed reverse recovery characteristic which is the feature of the Schottky diode will be deteriorated.

However, according to this embodiment, since the P-type diffusion layer 107 and the interface (Schottky junction plane) between the anode electrode 49 and the N-type base layer 41 are not short-circuited in the ON state and they are short-circuited in the OFF state, a current flows through the Schottky junction plane in the ON state and is not concentrated in the P-type diffusion layer 107. Therefore, like the former embodiment, the stable operation region is widened and the reverse recovery characteristic can be improved.

FIFTEENTH EMBODIMENT

FIG. 36 is a cross sectional view showing the right half portion of a high-withstand voltage diode according to a fifteenth embodiment of this invention. The high-withstand voltage diode of this embodiment is similar to that of the fourteenth embodiment except that a shallow P-type diffusion layer 113 is formed in the end portion of the anode electrode 49 or in the boundary portion between the anode electrode 49 and the electrode 100 to suppress a leak current from the corner of the anode electrode 49 in the OFF state. It is preferable to set the size of the shallow P-type diffusion layer 113 to such a value which will not cause the hole injection in the ON state.

SIXTEENTH EMBODIMENT

Figure 37:
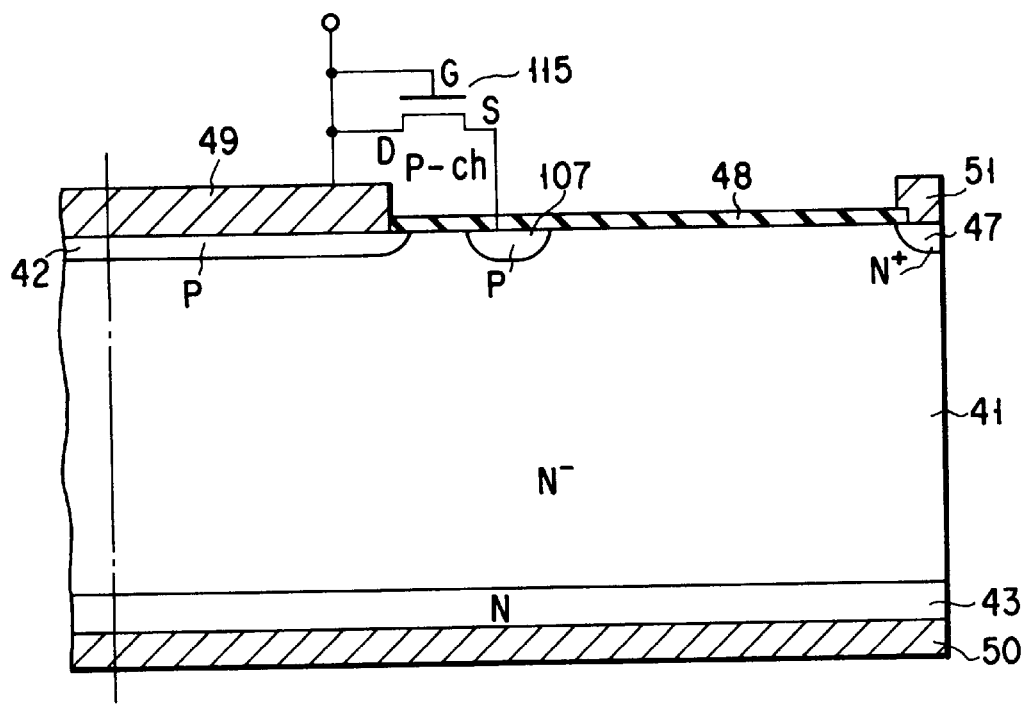
FIG. 37 is a cross sectional view showing the right half portion of a high-withstand voltage diode according to a sixteenth embodiment of this invention.

FIG. 37 is a cross sectional view showing the right half portion of a high-withstand voltage diode according to a sixteenth embodiment of this invention.

The high-withstand voltage diode of this embodiment is similar to that of the twelfth embodiment except that a P-channel MOSFET for selectively short-circuiting the anode electrode 49 to the P-type diffusion layer 107 is not formed in the junction edge portion but is formed in another region integrally. However, in FIG. 37, the FET 115 cannot be shown in the same cross sectional view and is shown by an equivalent circuit.

According to this embodiment, since the P-channel MOSFET is not influenced by concentration of the electric field in the junction edge portion, the potential of the P-type diffusion layer 107 is more stabilized and the effect of this invention can be further enhanced.

SEVENTEENTH EMBODIMENT

Figure 38:
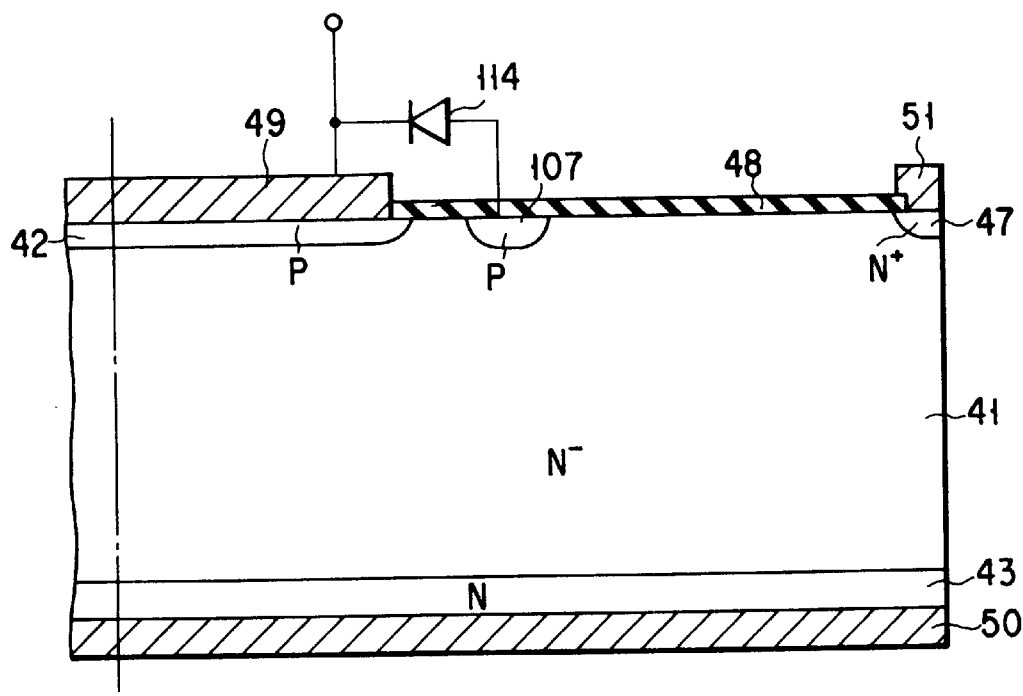
FIG. 38 is a cross sectional view showing the right half portion of a high-withstand voltage diode according to a seventeenth embodiment of this invention.

FIG. 38 is a cross sectional view showing the right half portion of a high-withstand voltage diode according to a seventeenth embodiment of this invention. The high-withstand voltage diode of this embodiment is similar to that of the twelfth embodiment except that the anode electrode 49 and the P-type diffusion layer 107 are selectively short-circuited via a diode 114 instead of the P-channel MOSFET. The diode 114 is formed of polysilicon, for example.

The anode side of the diode 114 is connected to the P-type diffusion layer 107 and the cathode side thereof is connected to the anode electrode 49. As a result, the diode 114 is reversely biased in the ON state and the P-type emitter layer 42 and the P-type diffusion layer 107 are not short-circuited, and the diode 114 is forwardly biased in the OFF state and the voltage of the P-type diffusion layer 107 is kept at substantially the threshold voltage of the diode 114. Therefore, since the diode 114 has the same function as the P-channel MOSFET constructed by the electrode 100 in the embodiment of FIG. 37, the same effect as in the embodiment of FIG. 37 can be attained.

In this embodiment, one diode is used, but a plurality of diodes serially connected in a forward direction may be used.

EIGHTEENTH EMBODIMENT

FIG. 39 is a cross sectional view showing the right half portion of a high-withstand voltage diode according to a eighteenth embodiment of this invention.

The high-withstand voltage diode of this embodiment is similar to that of the twelfth embodiment except that the end portion of the element is formed in a tapered form and the P-type diffusion layer 107 is formed to extend to the end portion of the junction edge portion. That is, in this embodiment, the withstand voltage is enhanced by the bevel structure instead of the N-type stopper layer 47.

NINETEENTH EMBODIMENT

FIG. 40 is a cross sectional view showing the right half portion of a high-withstand voltage diode according to a nineteenth embodiment of this invention. The high-withstand voltage diode of this embodiment is similar to that of the twelfth embodiment except that a P-type RESURF layer 118 is formed in contact with the P-type diffusion layer 107 on the surface of the N-type base layer 41. According to this embodiment, concentration of the electric field in the P-type diffusion layer 107 is alleviated by the P-type RESURF layer 118 and the withstand voltage can be further enhanced in comparison with the case of the twelfth embodiment.

TWENTIETH EMBODIMENT

FIG. 41 is a cross sectional view showing the right half portion of a high-withstand voltage diode according to a twentieth embodiment of this invention. The high-withstand voltage diode of this embodiment is similar to that of the twelfth embodiment except that P-type guard ring layers 119 are formed on the surface of the N-type base layer 41. According to this embodiment, concentration of the electric field in the P-type diffusion layer 107 is alleviated by the P-type guard ring layers 119 and the withstand voltage can be further enhanced in comparison with the case of the twelfth embodiment.

TWENTY-FIRST EMBODIMENT

Figure 42:
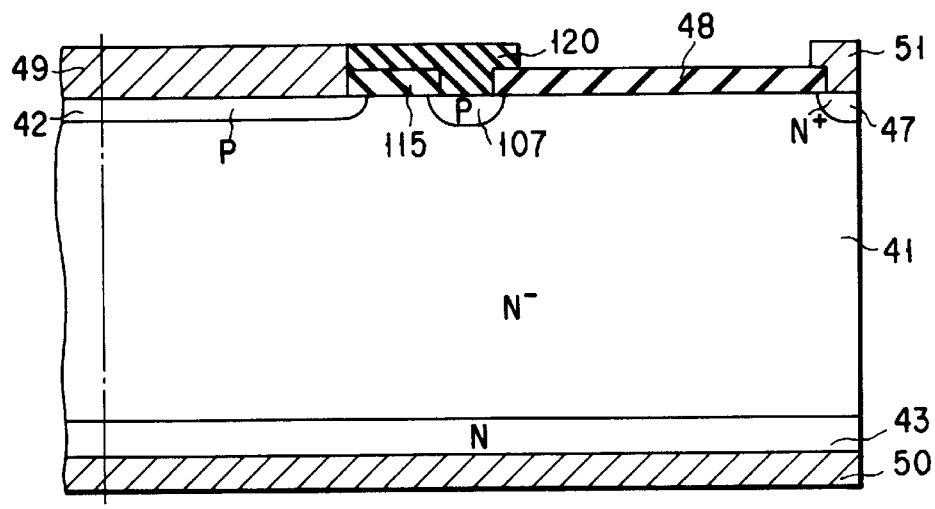
FIG. 42 is a cross sectional view showing the right half portion of a high-withstand voltage diode according to a twenty-first embodiment of this invention.

FIG. 42 is a cross sectional view showing the right half portion of a high-withstand voltage diode according to a twenty-first embodiment of this invention. The feature of this embodiment is that an attempt is made to attain the same effect as that of the P-channel MOSFET by connecting the P-type emitter layer 42 and the P-type diffusion layer 107 via a semi-insulative film 120 such as SIPOS (semi-insulating poly-crystalline silicon). In FIG. 42, 115 denotes an insulating film.

Since the anode-cathode path is made conductive in the ON state, the resistance between the anode and the cathode becomes lower than that of the semi-insulative film 120. Therefore, most of the current flows in the anode-cathode path and almost no current flows in the semi-insulative film 120 so that the P-type diffusion layer 107 and the P-type emitter layer 42 will not substantially be short-circuited.

On the other hand, almost no current flows in the anode-cathode path in the OFF state and a leak current flows in the semi-insulative film 120. That is, the current flowing in the semi-insulative film 120 is a minute current. As a result, a voltage drop in the semi-insulative film 120 is small and the voltage of the semi-insulative film 120 becomes low. Therefore, the semi-insulative film 120 has the same function as a gate electrode in the P-channel MOSFET like the electrode 100 in the twelfth embodiment and the same effect as that of the twelfth embodiment can be attained.

In the case of this embodiment, the P-type diffusion layer 107 is not necessarily required, and if the P-type diffusion layer 107 is not formed, the insulating film 115 becomes unnecessary. According to this embodiment, the same effect as that obtained in a case where the P-channel MOSFET is formed can be attained in a simple structure.

TWENTY-SECOND EMBODIMENT

Figure 43:
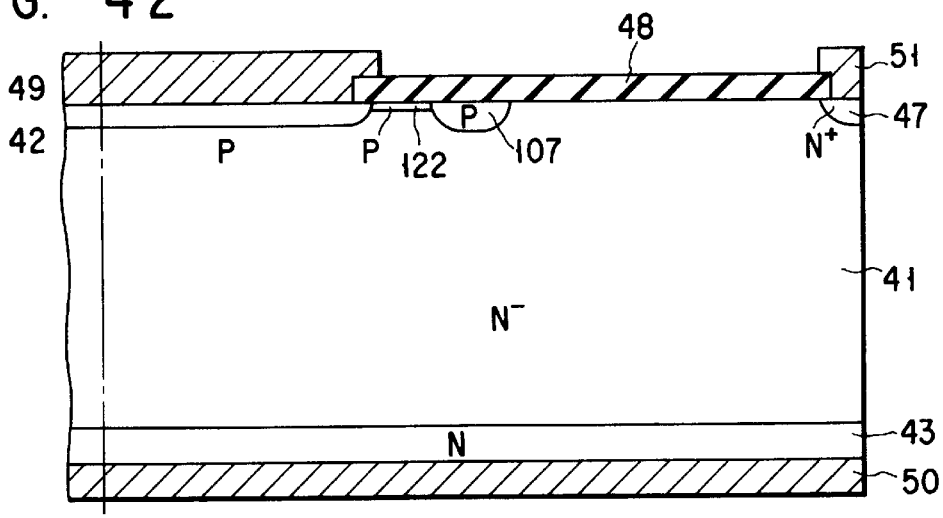
FIG. 43 is a cross sectional view showing the right half portion of a high-withstand voltage diode according to a twenty-second embodiment of this invention.

FIG. 43 is a cross sectional view showing the right half portion of a high-withstand voltage diode according to a twenty-second embodiment of this invention. The high-withstand voltage diode of this embodiment is similar to that of the twelfth embodiment except that the P-type emitter layer 42 is connected to the P-type diffusion layer 107 via a shallow P-type diffusion layer 122 instead of the semi-insulative film 120. Also, in this embodiment, the same effect as that obtained in the twenty-first embodiment can be attained.

TWENTY-THIRD EMBODIMENT

Figure 44:
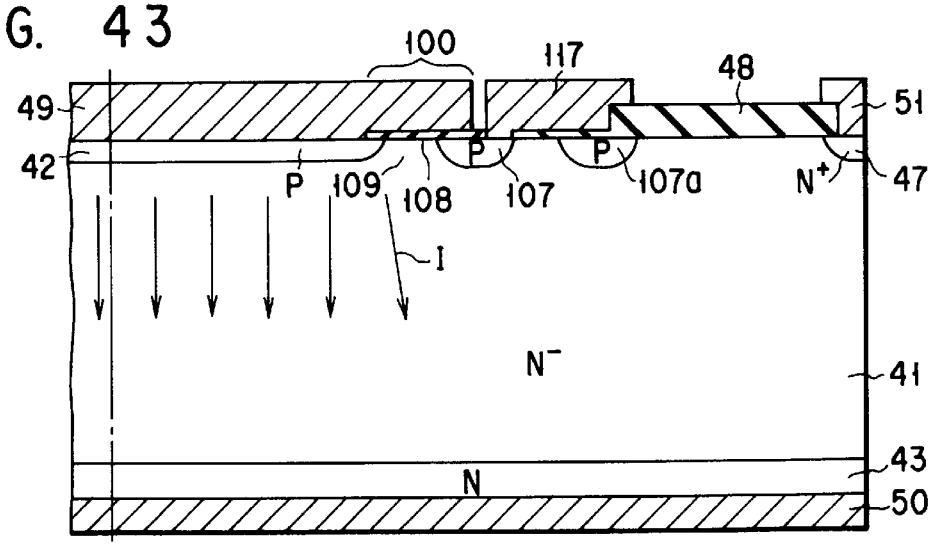
FIG. 44 is a cross sectional view showing the right half portion of a high-withstand voltage diode according to a twenty-third embodiment of this invention.

FIG. 44 is a cross sectional view showing the right half portion of a high-withstand voltage diode according to a twenty-third embodiment of this invention. The feature of this embodiment is that the P-type diffusion layer 107 of FIG. 31 is modified to have a multistage structure. That is, a P-type diffusion layer 107a is further formed outside the P-type diffusion layer 107 of FIG. 31 and a floating electrode 117 which extends to above the P-type diffusion layer 107a is formed on the P-type diffusion layer 107.

According to this embodiment, the potential can be fixed in a wider range and the effect of the twelfth embodiment can be further enhanced.

TWENTY-FOURTH EMBODIMENT

Figure 45:
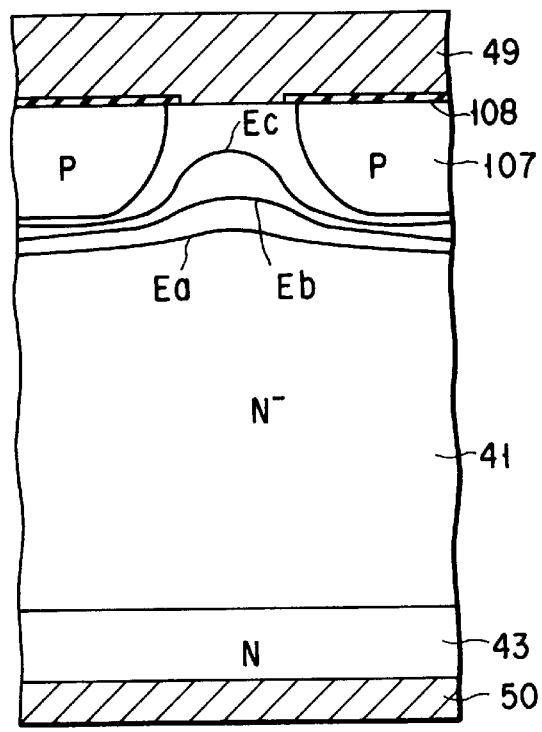
FIG. 45 is a cross sectional view showing the main portion of a high-withstand voltage diode according to a twenty-fourth embodiment of this invention.

FIG. 45 is a cross sectional view showing the element structure of part of a high-withstand voltage diode according to a twenty-fourth embodiment of this invention. In this embodiment, the P-type diffusion layers 107 and Schottky junction planes are alternately arranged and the structure of this embodiment is different from that of the high-withstand voltage diode of FIG. 35, that is, the structure in which the P-type diffusion layer 107 is formed in a ring form to surround the Schottky junction plane. The P-type diffusion layers and Schottky junction planes are formed in a stripe form, for example.

According to the study by the inventor of this application and others, it was proved that, with the above structure, equipotential lines Ea, Eb, Ec are created in the OFF state as shown in FIG. 45 and the density of the electric field below the Schottky junction plane is low.

Therefore, according to this embodiment, since the density of the electric field in the vertical direction in the Schottky junction plane can be alleviated, a leak current caused by a lowering in the Schottky barrier can be reduced. Further, since the leak current is thus reduced, the higher-temperature operation than in the conventional case can be effected. In the twelfth to twenty-third embodiments, the density of the electric field in the lateral direction is lowered.

Figure 46:
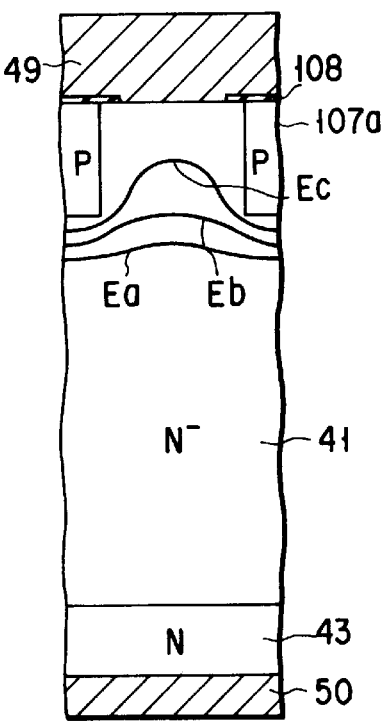
FIG. 46 is a cross sectional view showing the main portion of a high-withstand voltage diode according to a modification of the twenty-fourth embodiment of this invention.

FIG. 46 is a cross sectional view showing the element structure of part of a high-withstand voltage diode according to a modification of the twenty-fourth embodiment of this invention. In this modification, the P-type diffusion layer 107 is formed with a trench structure. That is, trench grooves are formed in the surface portion of the N-type base layer 41 and P-type semiconductor layers 107a such as polysilicon layers containing P-type impurity are formed in the trench grooves.

Like the above embodiment, in this embodiment, since the density of the electric field below the Schottky junction plane is lowered, the leak current can be improved and the high-temperature operation can be effected.

TWENTY-FIFTH EMBODIMENT

Figure 47:
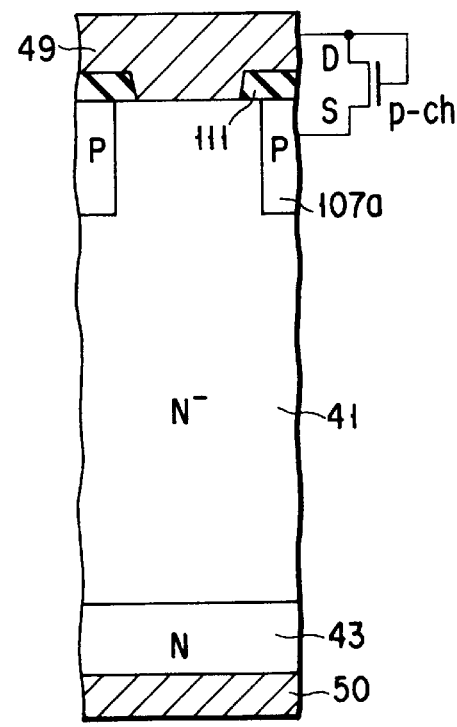
FIG. 47 is a cross sectional view showing the main portion of a high-withstand voltage diode according to a twenty-fifth embodiment of this invention.

FIG. 47 is a cross sectional view showing the element structure of part of a high-withstand voltage diode according to a twenty-fifth embodiment of this invention.

The high-withstand voltage diode of this embodiment is similar to that of the twenty-fourth embodiment except that a P-channel MOSFET for short-circuiting the P-type semiconductor layer 107a to the anode electrode 49 is formed in a portion apart from the P-type semiconductor layer 107a or only in part of the P-type semiconductor layer 107a. The reference numeral 111 denotes an insulating film.

According to this embodiment, since the P-channel MOSFET is not necessarily formed in the entire portion around the P-type semiconductor layer 107a, the element formation can be simplified.

TWENTY-SIXTH EMBODIMENT

Figure 48:
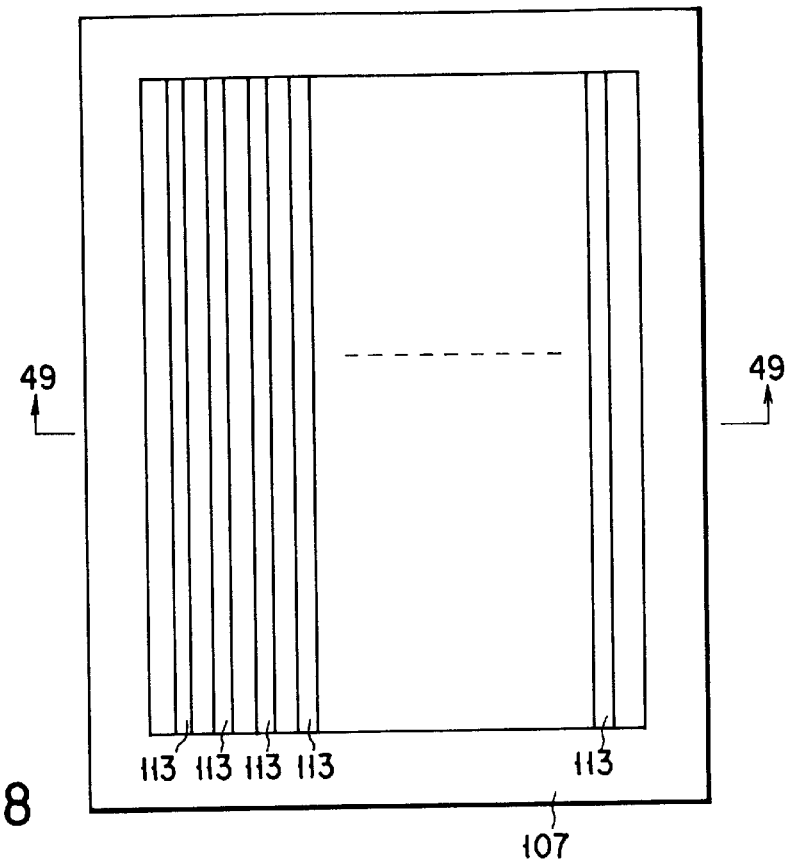
FIG. 48 is a plan view showing a high-withstand voltage diode according to a twenty-sixth embodiment of this invention.
Figure 49:
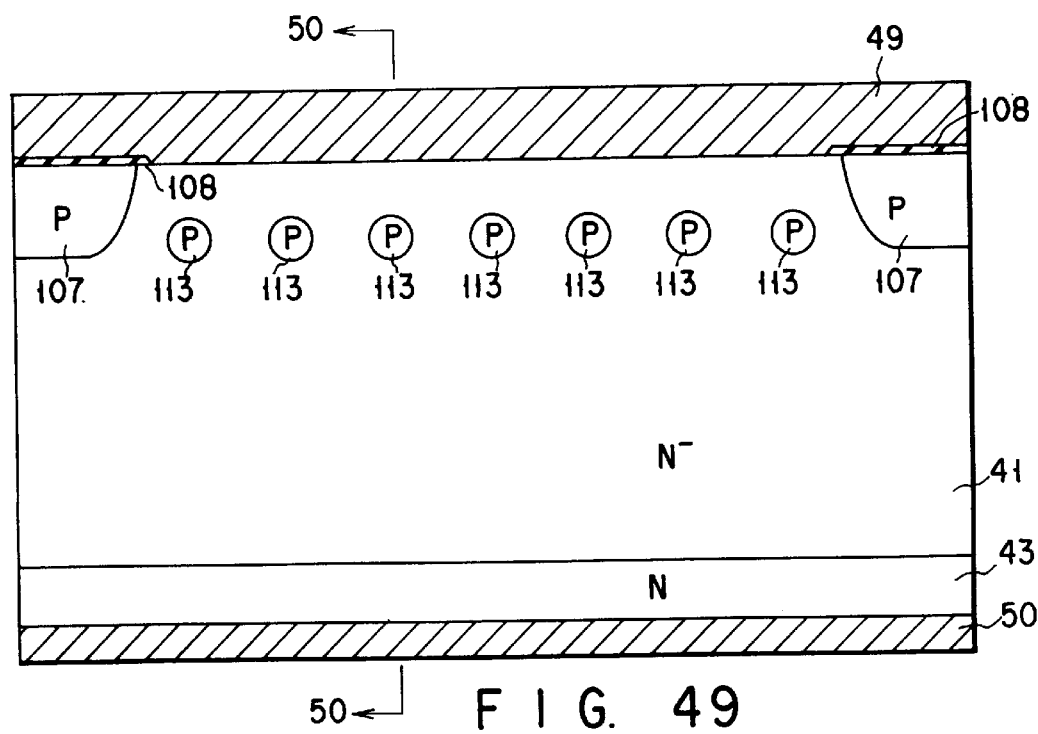
FIG. 49 is a cross sectional view taken along the line 49—49 of FIG. 48.

FIG. 48 is a plan view showing a high-withstand voltage diode according to a twenty-sixth embodiment of this invention, FIG. 49 is a cross sectional view taken along the line 49—49 of FIG. 48, and FIG. 50 is a perspective view showing the cross section taken along the line 50—50 of FIG. 49 together with the cross section of FIG. 49. The high-withstand voltage diode is a Schottky type diode having an anode electrode 49 formed in contact with an N-type base layer 41 to form the Schottky junction.

The high-withstand voltage diode of this embodiment is similar to that of the twenty-fourth embodiment except that buried P-type layers 113 connected to the P-type diffusion layer 107 are formed. The P-type buried layers 113 lower the vertical electric field applied to the Schottky junction plane. Since the P-type buried layer 113 can be formed with high density, the vertical electric field applied to the Schottky junction interface can be further lowered than in the case of the twenty-fourth embodiment. Further, since the Schottky junction area can be made sufficiently large, the effective area of the element can be made larger in comparison with the case of the former embodiment. Therefore, a high-withstand voltage diode (Schottky diode) having an effect improved over the effect of the twenty-fourth embodiment can be obtained.

TWENTY-SEVENTH EMBODIMENT

FIG. 51 is a cross sectional view showing the right half portion of a high-withstand voltage diode according to a twenty-seventh embodiment of this invention. The feature of this embodiment is that the element structure of FIG. 31 is formed of a lateral type by use of an SOI (silicon On Insulator) substrate.

The SOI substrate is formed of a supporting body 121, an SOI insulating film 122 and an N-type base layer (SOI semiconductor film) 123. The supporting body 121 may be omitted. Generally, the SOI insulating film 122 is formed of a silicon oxide film and the SOI semiconductor film 123 is formed of a silicon film, but they may be formed of another insulating film and another semiconductor film.

Further, in this embodiment, a field plate electrode 125 integrally formed with the electrode 100 and anode electrode 49, for enhancing the withstand voltage is disposed on an insulating film 124 which is disposed on a region including the P-type diffusion layer 107 and N-type base layer 123 and an interface between the P-type diffusion layer 107 and a portion of the N-type base layer 123 lying outside the P-type diffusion layer 107.

TWENTY-EIGHTH EMBODIMENT

FIGS. 52A, 52B are cross sectional views of the element structure of a lateral IGBT according to a twenty-eighth embodiment of this invention. FIG. 52A is a cross sectional view showing a non-IGBT section and FIG. 52B is a cross sectional view showing an IGBT section. Basically, the entire portion can be formed to have the element structure shown in FIG. 52B.

In the drawing, reference numerals 132, 126, 127, 128, 129 respectively denote a P-type drain layer, N-type buffer layer, N-type base layer (N-type drift layer), P-type base layer, and N-type source layer constituting the IGBT.

As shown in FIG. 52B, the source electrode 130 is formed in contact with both of the P-type base layer 128 and the N-type source layer 129. A drain electrode 131 is formed on the P-type drain layer 132.

An electrode 100 is formed on an insulating film 108 in an area extending from the N-type source layer 129 to the P-type diffusion layer 107. The electrode 100 constructs an N-channel MOSFET of the IGBT for selectively short-circuiting the N-type source layer 129 to the N-type base layer 127 and the P-channel MOSFET described so far. Further, the electrode 100 is integrally formed with the field plate electrode 125, but is isolated from the source electrode 130 by an insulating film (not shown) and is not integrally formed with the source electrode.

Further, as shown in FIG. 52A, an area in which the N-type source layer 129 is not formed, that is, the IGBT is not formed is partially provided, and in this area, the source electrode 130, electrode 100 and field plate electrode 125 are integrally formed.

A voltage which is positive with respect to the source electrode 130 is applied to the electrode 100 at the turn-ON time. As a result, the N-channel MOSFET is turned ON to short-circuit the N-type source layer 129 and the N-type base layer 127 so as to cause conductivity modulation, and the element is turned ON.

At this time, the P-channel MOSFET is not turned ON, and therefore, the P-type diffusion layer 107 and the P-type base layer 128 are not short-circuited. As a result, no current concentration occurs in the ON state as in the case of the twelfth embodiment.

On the other hand, a voltage which is negative with respect to the source electrode 130 is applied to the electrode 100 at the turn-OFF time. As a result, the N-channel MOSFET is turned OFF to interrupt injection of electrons from the N-type source layer 129 into the N-type base layer 127 so as to turn OFF the element.

At this time, since the P-channel MOSFET is turned ON, the P-type diffusion layer 107 and the P-type base layer 128 are short-circuited, and as a result, a weak electric field is created in the end portion of the P-type base layer 128 as in the case of the twelfth embodiment and no current concentration occurs in the ON state, and thus, the stable operation region becomes wider than in the conventional case.

Further, in this embodiment, a region in which the IGBT is not formed, that is, a region used only for selectively short-circuiting the P-type diffusion layer 107 and the P-type base layer 128 at the OFF time is formed. Since this region is free from the influence by the IGBT, the potential of the P-type diffusion layer 107 can be stably fixed at a low level and the same effect as that of the twelfth embodiment can be attained without fail.

The first to twenty-eighth embodiments are made to improve the element structure of the high-withstand voltage diode and prevent destruction of the element at the reverse recovery time. The following embodiments relate to a high-withstand voltage diode having a terminal used for detecting an indication of destruction before the element is destroyed by the remaining carrier in a peripheral portion of the element. The main point of this invention is to detect a rise in the potential of the peripheral portion of the P-type emitter layer of the high-withstand voltage diode due to current concentration and feed the result of detection back to the gate circuit of the main element such as an IGBT so as to control the speed of the reverse recovery operation and prevent destruction of the element. For this purpose, a detection terminal separated from the anode electrode is formed on the P-type emitter layer on the peripheral portion of the element.

TWENTY-NINTH EMBODIMENT

FIG. 53 is a cross sectional view showing the right half portion of a high-withstand voltage diode according to a twenty-ninth embodiment of this invention. In this embodiment, a $P^{-31}$-type RESURF layer 46 for alleviation of electric field designed to be completely depleted at the time of application of a reverse voltage is formed to attain the high-withstand voltage characteristic. The feature of this structure is that a detection electrode 60 which is independent from the anode electrode 49 is formed on the end portion of the P-type emitter layer 42. With this structure, if current concentration occurs in a portion near the D point at the reverse recovery time, a voltage drop at the lateral resistance 57 of the P-type emitter layer 42 caused by the concentrated current can be detected by the detection terminal 60 and thus occurrence of the current concentration can be detected. By using the signal in a manner as described later, it becomes possible to avoid the current concentration and prevent destruction of the diode.

Generally, an anode potential is applied to the electrode (field plate electrode) on the $P^{-31}$-type RESURF layer 46 to enhance the static withstand voltage, but in this embodiment, a case wherein a potential difference between the detection electrode 60 and the anode electrode 49 is not so large is considered and the potential of the detection electrode 60 is used for this purpose.

FIG. 54 is a circuit diagram showing an example of application of the diode of this embodiment. Generally, the diode of this embodiment is used in an inverter, but it is explained by using a chopper circuit shown in FIG. 54 for simplification of the explanation. The reverse recovery operation of a diode 71 is started by turning ON a main element 70 with a circulating current 74 flowing in the diode 71 and a load inductance 69. At this time, if current concentration occurs in the end portion of the P-type emitter layer 42 of the diode 71, the potential of the detection terminal rises based on the mechanism described before. If the potential is detected and fed back to the gate circuit 73 of the main element 70 via an insulating amplifier 72 to interrupt the turn-ON state of the main element, it becomes possible to prevent destruction of the diode 71 due to current concentration. Further, when current concentration occurs, the speed of the reverse recovery operation can be controlled and the device can be kept operative by setting a sequence to continuously change the gate voltage of the main element 70 according to the degree of the current concentration (detected electrode potential).

FIG. 55 is a cross sectional view showing the right half portion of a high-withstand voltage diode according to a modification of the above embodiment. This modification is similar to the above embodiment of FIG. 53 except that P-type guard ring layers 52 for alleviation of electric field are formed.

THIRTIETH EMBODIMENT

FIG. 56 is a cross sectional view showing the right half portion of a high-withstand voltage diode according to a thirtieth embodiment of this invention. The feature of this structure is that a $P^-$-type emitter layer 53 which is designed not to be completely depleted at the time of application of a reverse voltage is formed between a P-type emitter layer 42 and a $P^{-31}$-type RESURF layer 46, and the remaining portion is the same as a corresponding portion of FIG. 53. With this structure, since the lateral resistance 57 of the $P^-$-type emitter layer 53 is high, the current concentration can be easily detected.

THIRTY-FIRST EMBODIMENT

FIG. 57 is a cross sectional view showing the right half portion of a high-withstand voltage diode according to a thirty-first embodiment of this invention. The feature of this structure is that an N-type layer 56 for adjustment of the lateral resistance 57 is formed on the surface of the peripheral portion of the P-type emitter layer 42 and the remaining portion is the same as a corresponding portion of FIG. 53. A portion of the P-type emitter layer 42 which lies directly under the N-type layer 56 is designed not to be completely depleted at the time of application of a reverse voltage. With this structure, since the lateral resistance 57 of the P-type emitter layer 42 directly under the N-type layer 56 can be adjusted by adjusting the diffusion depth of the N-type layer 56, the sensitivity of detection of current concentration can be adjusted.

THIRTY-SECOND EMBODIMENT

FIG. 58 is a cross sectional view showing the right half portion of a high-withstand voltage diode according to a thirty-second embodiment of this invention. The feature of this structure is that the peripheral surface portion of the P-type emitter layer 42 is removed by a preset amount by RIE or the like and the remaining portion is the same as a corresponding portion of FIG. 53. A portion of the P-type emitter layer 42 which lies directly under the removed portion is designed not to be completely depleted at the time of application of a reverse voltage. With this structure, since the lateral resistance 57 of the P-type emitter layer 42 directly under the removed portion can be adjusted by adjusting the depth of the removed portion, the sensitivity of detection of current concentration can be adjusted.

THIRTY-THIRD EMBODIMENT

FIG. 59 is a cross sectional view showing the right half portion of a high-withstand voltage diode according to a thirty-third embodiment of this invention. The feature of this structure is that a $P^-$-type emitter layer 53 which is designed not to be completely depleted at the time of application of a reverse voltage is formed between the P-type emitter layer 42 and a P-type layer 65 and the remaining portion is the same as a corresponding portion of FIG. 53. With this structure, since the lateral resistance 57 of the $P^-$-type emitter layer 53 is high, the current concentration can be easily detected.

THIRTY-FOURTH EMBODIMENT

FIG. 60 is a cross sectional view showing the right half portion of a high-withstand voltage diode according to a thirty-fourth embodiment of this invention. The feature of this structure is that the P-type emitter layer 42 and the P-type layer 65 are completely separated from each other and electrically connected via a resistive film 67 and the remaining portion is the same as a corresponding portion of FIG. 53. With this structure, the current concentration can be easily detected by use of the resistance of the resistive film 67.

A case wherein the detection electrode 60 is used as the field plate electrode is explained in the twenty-ninth to thirty-fourth embodiments, and in the following embodiments, a case wherein the anode electrode 49 is used as a field plate electrode is explained.

THIRTY-FIFTH EMBODIMENT

Figure 61:
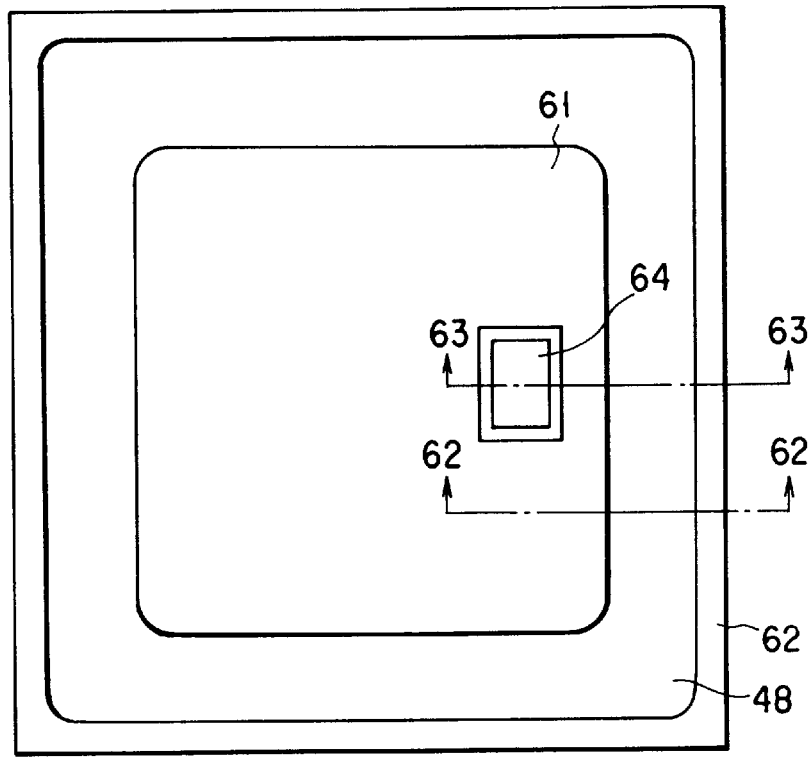
FIG. 61 is a plan view of a high-withstand voltage diode according to a thirty-fifth embodiment of this invention.
Figure 62:
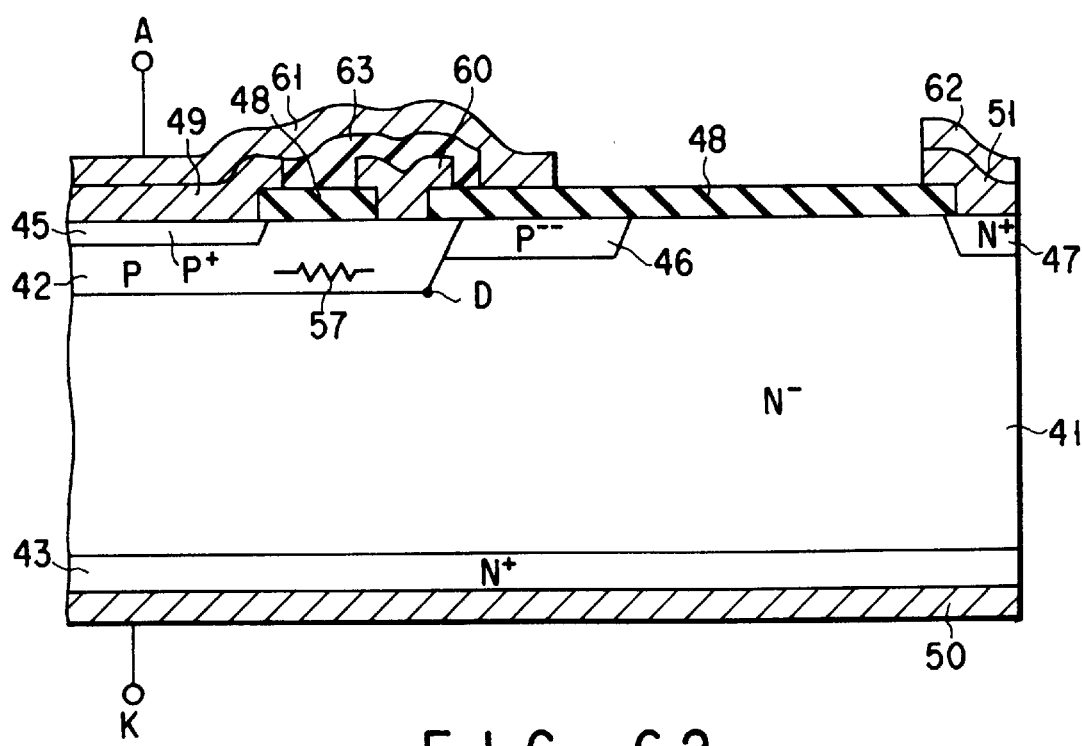
FIG. 62 is a cross sectional view taken along the line 62—62 of FIG. 61.

FIG. 61 is a plan view of a high-withstand voltage diode according to a thirty-fifth embodiment of this invention, and FIGS. 62 and 63 are cross sectional views taken along the lines 62—62 and 63—63 of FIG. 61, respectively. The feature of this structure is that the detection electrode 60 is covered with a second insulating film 63 so as to use the anode electrode 49 as a field plate electrode and an opening is partly formed in a second anode electrode 61 to monitor the potential of the detection electrode 60 and the remaining portion is the same as a corresponding portion of FIG. 53. A reference numeral 64 denotes a lead-out electrode for measuring the potential of the detection electrode 60.

THIRTY-SIXTH EMBODIMENT

FIGS. 64 nd 65 are cross sectional views showing a high-withstand voltage diode according to a thirty-sixth embodiment of this invention and respectively corresponding to the cross sectional views taken along the lines 62—62 and 63—63 of FIG. 61. The feature of this structure is that the detection electrode 60 is covered with a second insulating film 63 so as to use the anode electrode 49 as a field plate electrode and an opening is partly formed in a second anode electrode 61 to monitor the potential of the detection electrode 60 and the remaining portion is the same as a corresponding portion of FIG. 56.

THIRTY-SEVENTH EMBODIMENT

Figure 67:
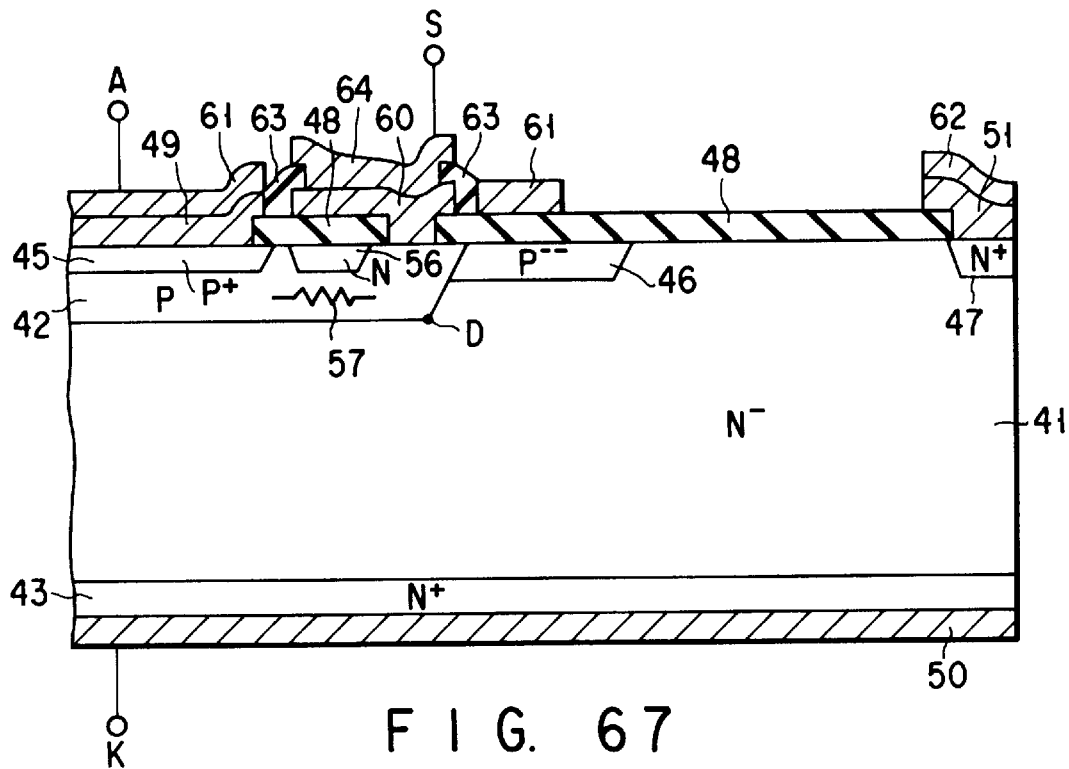
FIG. 67 is a cross sectional view showing the high-withstand voltage diode according to the thirty-seventh embodiment of this invention and corresponding to the cross sectional view taken along the line 63—63 of FIG. 61.

FIGS. 66 and 67 are cross sectional views showing a high-withstand voltage diode according to a thirty-seventh embodiment of this invention and respectively corresponding to the cross sectional views taken along the lines 62—62 and 63—63 of FIG. 61. The feature of this structure is that the detection electrode 60 is covered with a second insulating film 63 so as to use the anode electrode 49 as a field plate electrode and an opening is partly formed in a second anode electrode 61 to monitor the potential of the detection electrode 60 and the remaining portion is the same as a corresponding portion of FIG. 57.

THIRTY-EIGHTH EMBODIMENT

Figure 68:
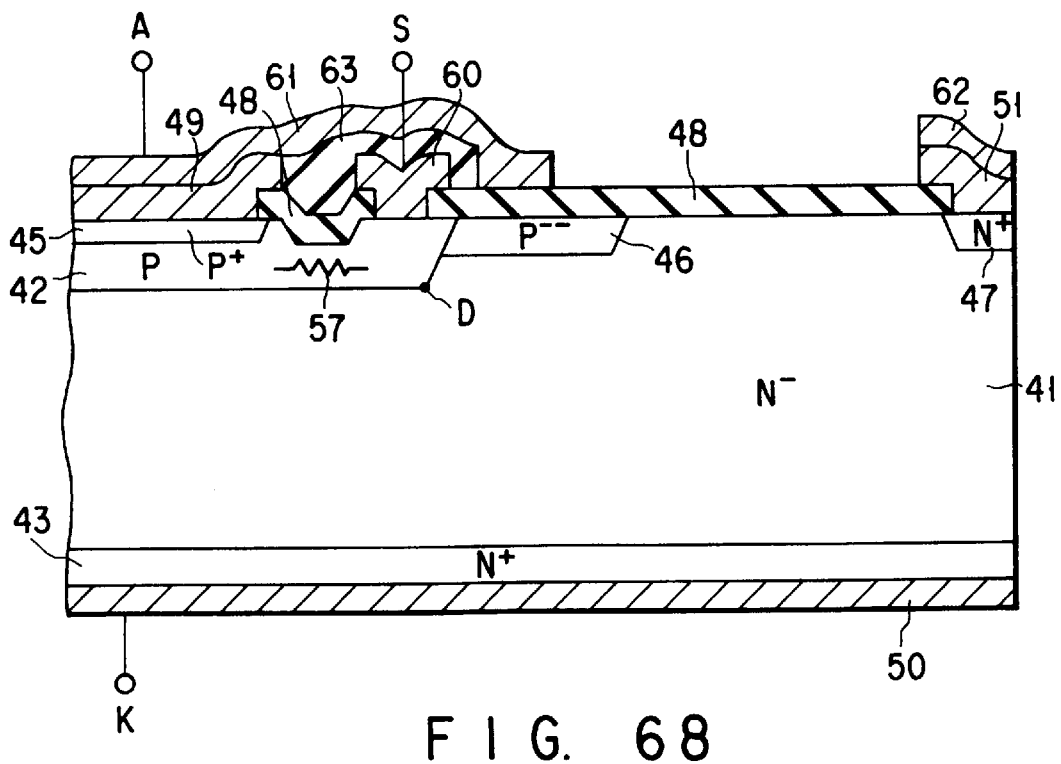
FIG. 68 is a cross sectional view showing a high-withstand voltage diode according to a thirty-eighth embodiment of this invention and corresponding to the cross sectional view taken along the line 62—62 of FIG. 61.
Figure 69:
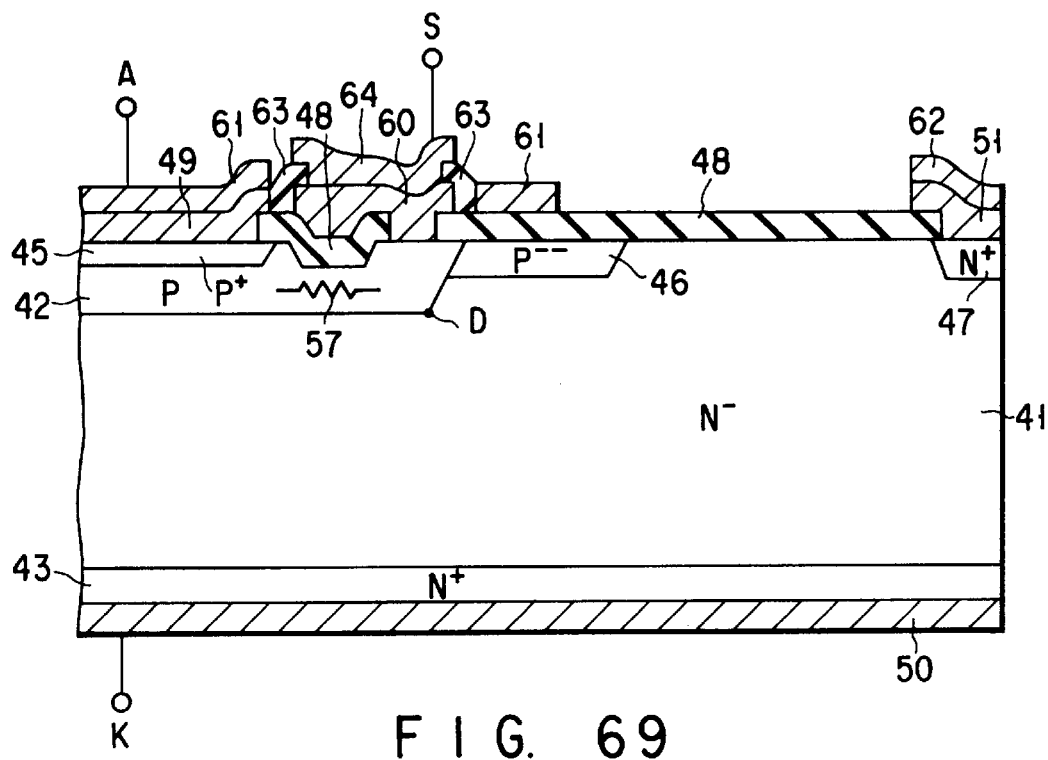
FIG. 69 is a cross sectional view showing the high-withstand voltage diode according to the thirtyeighth embodiment of this invention and corresponding to the cross sectional view taken along the line 63—63 of FIG. 61.

FIGS. 68 and 69 are cross sectional views showing a high-withstand voltage diode according to a thirty-eighth embodiment of this invention and respectively corresponding to the cross sectional views taken along the lines 62—62 and 63—63 of FIG. 61. The feature of this structure is that the detection electrode 60 is covered with a second insulating film 63 so as to use the anode electrode 49 as a field plate electrode and an opening is partly formed in a second anode electrode 61 to monitor the potential of the detection electrode 60 and the remaining portion is the same as a corresponding portion of FIG. 58.

THIRTY-NINTH EMBODIMENT

Figure 70:
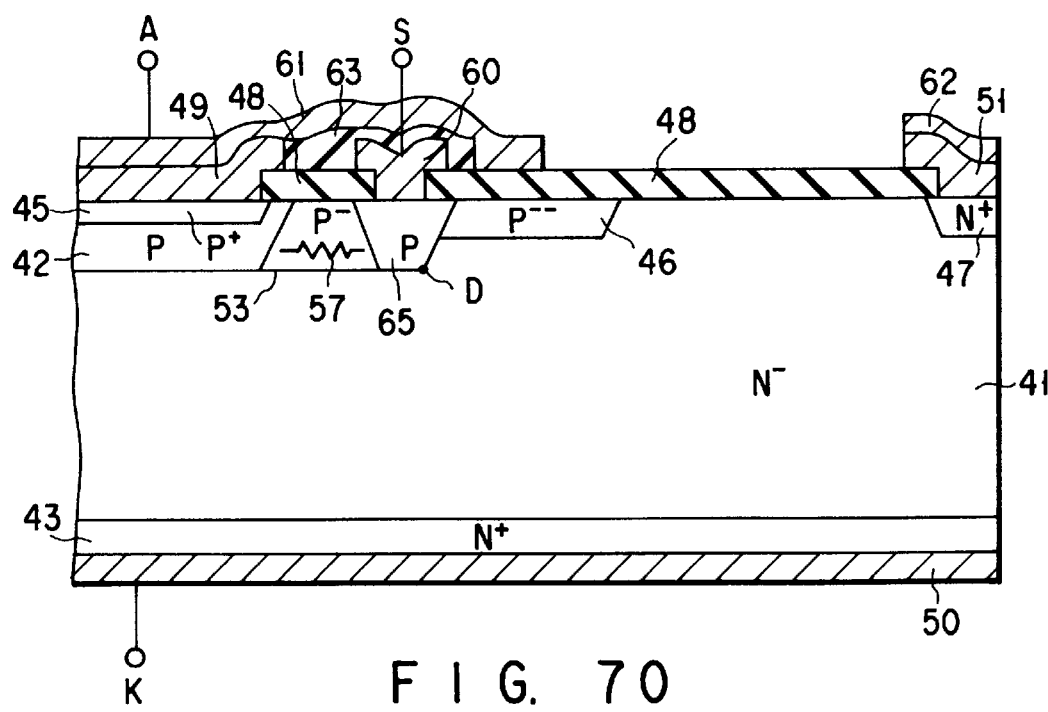
FIG. 70 is a cross sectional view showing a high-withstand voltage diode according to a thirty-ninth embodiment of this invention and corresponding to the cross sectional view taken along the line 62—62 of FIG. 61.
Figure 71:
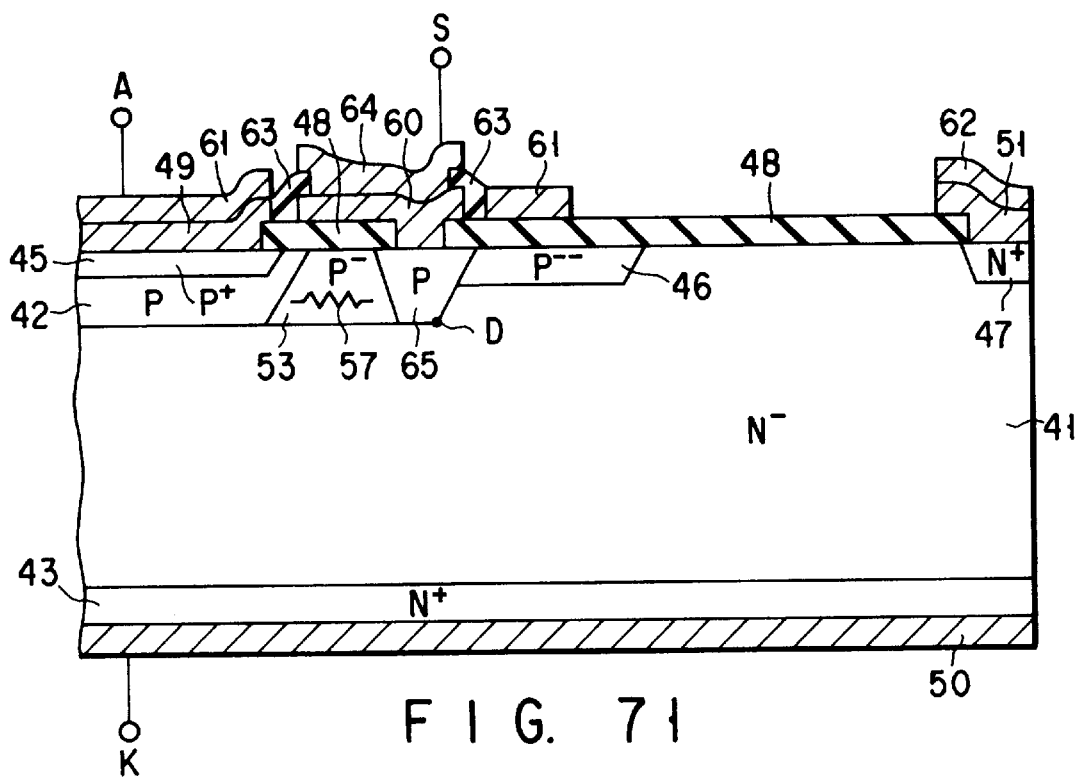
FIG. 71 is a cross sectional view showing the high-withstand voltage diode according to the thirty-ninth embodiment of this invention and corresponding to the cross sectional view taken along the line 63—63 of FIG. 61.

FIGS. 70 and 71 are cross sectional views showing a high-withstand voltage diode according to a thirty-ninth embodiment of this invention and respectively corresponding to the cross sectional views taken along the lines 62—62 and 63—63 of FIG. 61. The feature of this structure is that the detection electrode 60 is covered with a second insulating film 63 so as to use the anode electrode 49 as a field plate electrode and an opening is partly formed in a second anode electrode 61 to monitor the potential of the detection electrode 60 and the remaining portion is the same as a corresponding portion of FIG. 59.

FORTIETH EMBODIMENT

Figure 72:
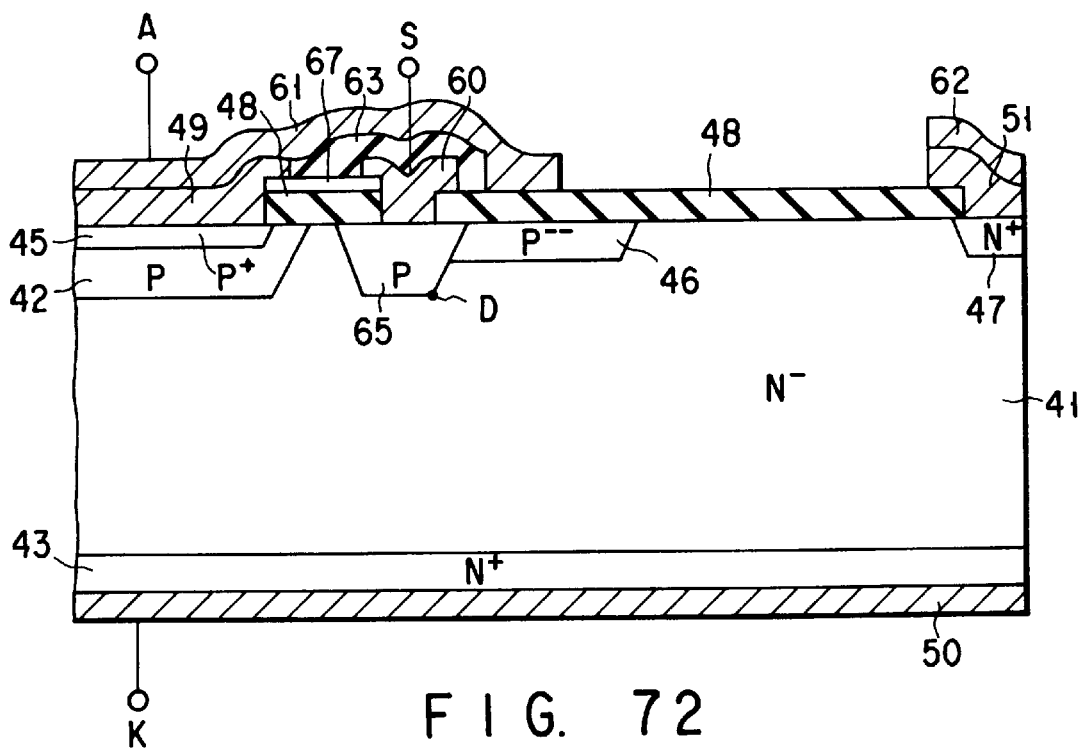
FIG. 72 is a cross sectional view showing a high-withstand voltage diode according to a fortieth embodiment of this invention and corresponding to the cross sectional view taken along the line 62—62 of FIG. 61.
Figure 73:
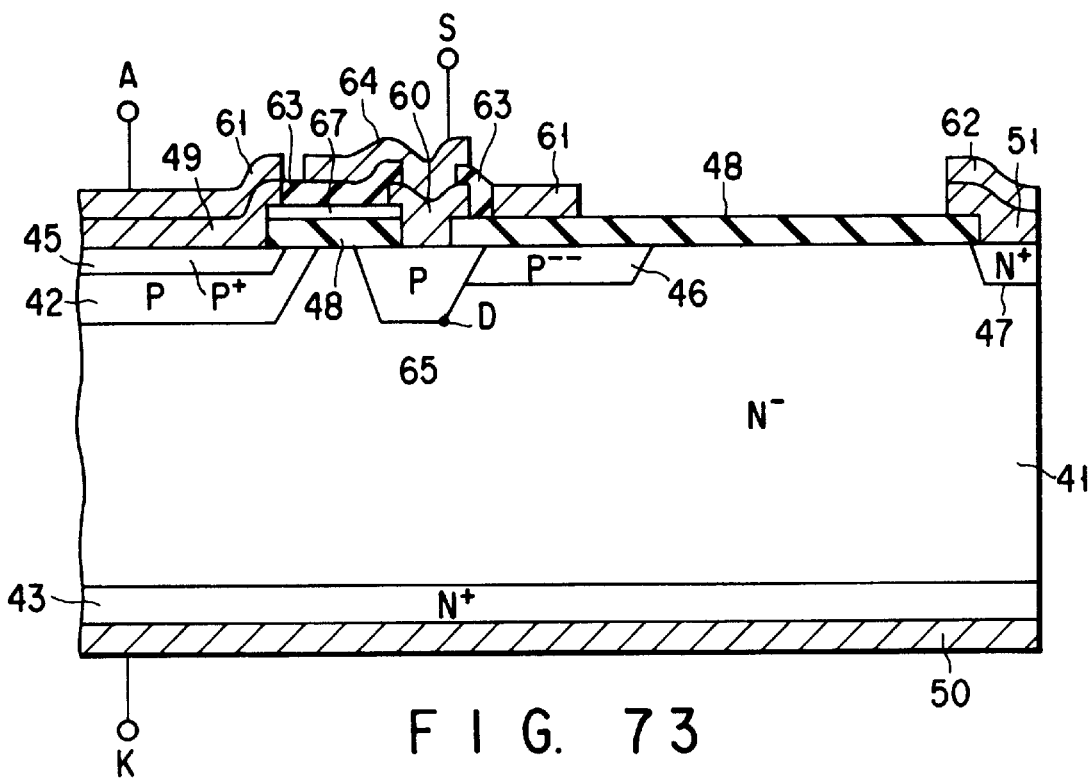
FIG. 73 is a cross sectional view showing the high-withstand voltage diode according to the fortieth embodiment of this invention and corresponding to the cross sectional view taken along the line 63—63 of FIG. 61.

FIGS. 72 and 73 are cross sectional views showing a high-withstand voltage diode according to a fortieth embodiment of this invention and respectively corresponding to the cross sectional views taken along the lines 62—62 and 63—63 of FIG. 61. The feature of this structure is that the detection electrode 60 is covered with a second insulating film 63 so as to use the anode electrode 49 as a field plate electrode and an opening is partly formed in a second anode electrode 61 to monitor the potential of the detection electrode 60 and the remaining portion is the same as a corresponding portion of FIG. 60.

FORTY-FIRST EMBODIMENT

Figure 74:
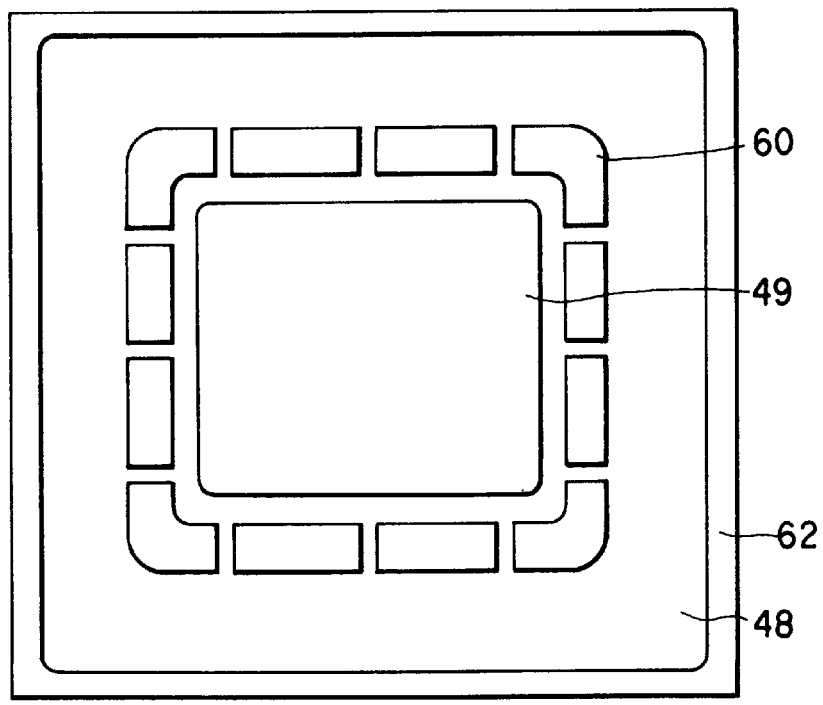
FIG. 74 is a plan view showing a high-withstand voltage diode according to a forty-first embodiment of this invention.

FIG. 74 is a plan view showing a high-withstand voltage diode according to a forty-first embodiment of this invention. The feature of this structure is that the detection electrode 60 is divided into plural portions and the potentials of the detection electrode portions can be measured. This structure has an advantage that the current concentration can be detected with high sensitivity even if local current concentration occurs. Since the current concentration occurs in the corner portion in many cases, it is possible to set portions actually used for detection to only four corner portions.

The embodiments described so far mainly relate to the improvement of the breakdown strength of the high-withstand voltage diode or prevention of destruction by detection of the indication of destruction. The following embodiments relate to a reduction in the electric power loss at the reverse recovery time. Before explaining the concrete embodiments, the power loss in the conventional high-withstand voltage diode is explained.

Figure 75A:
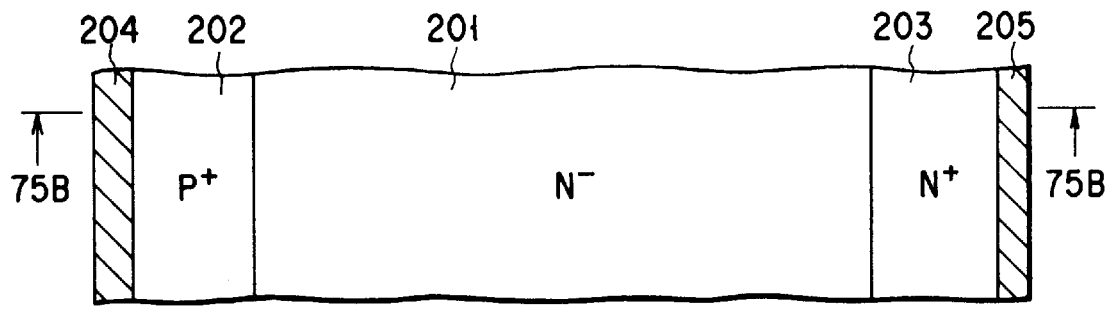
FIGS. 75A to 75C are a cross sectional view of the main portion of a first conventional high-withstand voltage diode and diagrams for respectively illustrating the impurity concentration distribution in the element portion and the carrier concentration distribution in the ON state.
Figure 75B:
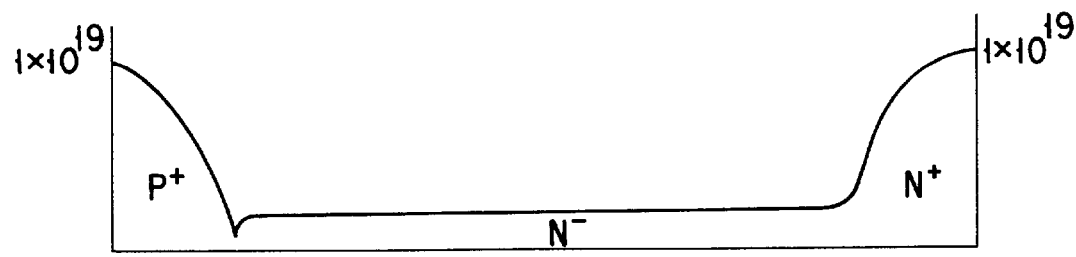
Figure 75C:
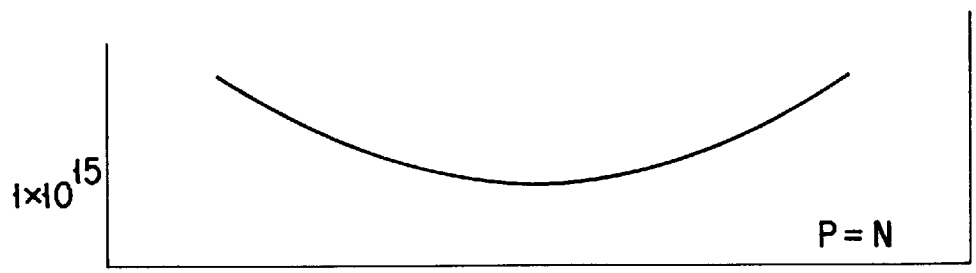

FIG. 75A is a cross sectional view of the main portion of the conventional high-withstand voltage diode (first conventional high-withstand voltage diode), FIG. 75B shows the impurity concentration distribution in the device along the line 75B—75B of FIG. 75A, and FIG. 75C shows the carrier concentration distribution in an $N^-$-type layer in the ON state.

The above diode is the diode explained in the "Background of the Invention", and an anode electrode 204 is formed on a $P^+$-type anode layer 202 which is formed on one surface of an $N^-$-type base layer 201 of high resistance formed of $N^-$-type silicon, and a cathode electrode 205 is formed over the other surface thereof with an $N^+$-type cathode layer 203 disposed therebetween.

As described before, in the case of a high-withstand voltage diode with a blocking voltage of 4500 V class, the impurity concentrations and the dimensions of the respective portions are set such that the impurity concentration of the $N^-$-type base layer 201 is set to $1.0 \times 10^{13}$ to $1.8 \times 10^{13}/cm^3$ and the thickness thereof is set to 450 to 900 $\mu m$, and the surface impurity concentration of each of the $P^+$-type anode layer 202 and $N^+$-type cathode layer 203 is set to $1.0 \times 10^{19}/cm^3$ and the thickness thereof is set to 14 and 70 $\mu m$, respectively.

In the high-withstand voltage diode with the above structure, a large amount of carriers are stored in the $N^-$-type base layer 201 in the highly injected state. The carrier distribution is set as shown in FIG. 75C. Particularly, the carrier concentration becomes high in portions near the $N^+$-type cathode layer 203 and $P^+$-type anode layer 202 from which electrons and holes are injected.

Thus, a large amount of carriers are stored, and as a result, a large reverse recovery current flows when a reverse bias voltage is applied and the OFF state is set. For example, in the case of the above-described element parameters, a large reverse recovery current of approx. 100 A/cm$^2$ flows when the OFF state is set by a reverse bias voltage 1000 V and current variation rate di/dt=−200 A/cm$^2$. Therefore, a large electric power is consumed by the reverse recovery current and a large amount of heat is generated. This may prevent the high-speed switching operation.

As a method for improving the reverse recovery characteristic of the high-withstand voltage diode, a method effected by lowering the surface impurity concentration of the $P^+$-type anode layer 202 and reducing the thickness thereof is provided, but if the surface impurity concentration of the $P^+$-type anode layer 202 is lowered, it becomes difficult to sufficiently lower the ohmic contact resistance with the anode electrode 204. Further, if the impurity concentration of the $P^+$-type anode layer 202 is lowered and the thickness thereof is reduced, the depletion layer which extends into the $P^+$-type anode layer 202 at the time of application of the reverse bias voltage may almost reach the anode electrode 204, thereby making it impossible to attain a sufficiently high-withstand voltage characteristic.

In order to solve the problem of the first conventional high-withstand voltage diode, another high-withstand voltage diode (second conventional high-withstand voltage diode) is proposed.

Figure 76A:
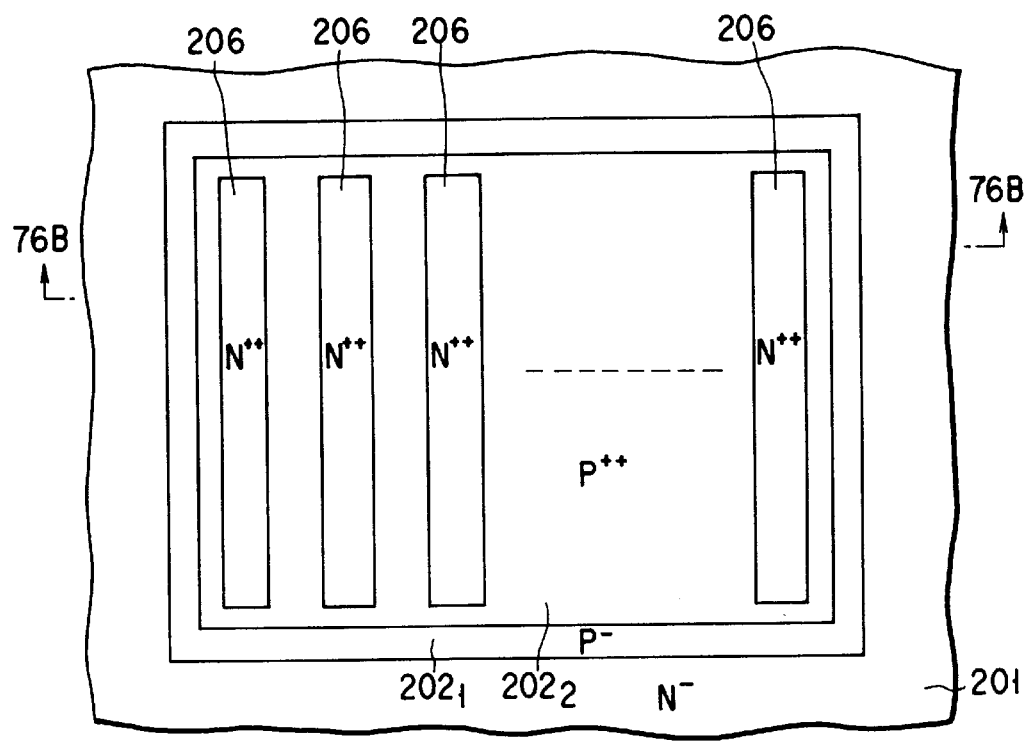
FIGS. 76A and 76B are a plan view of a second conventional high-withstand voltage diode and a cross sectional view taken along the line 76B—76B of FIG. 76A.
Figure 76B:
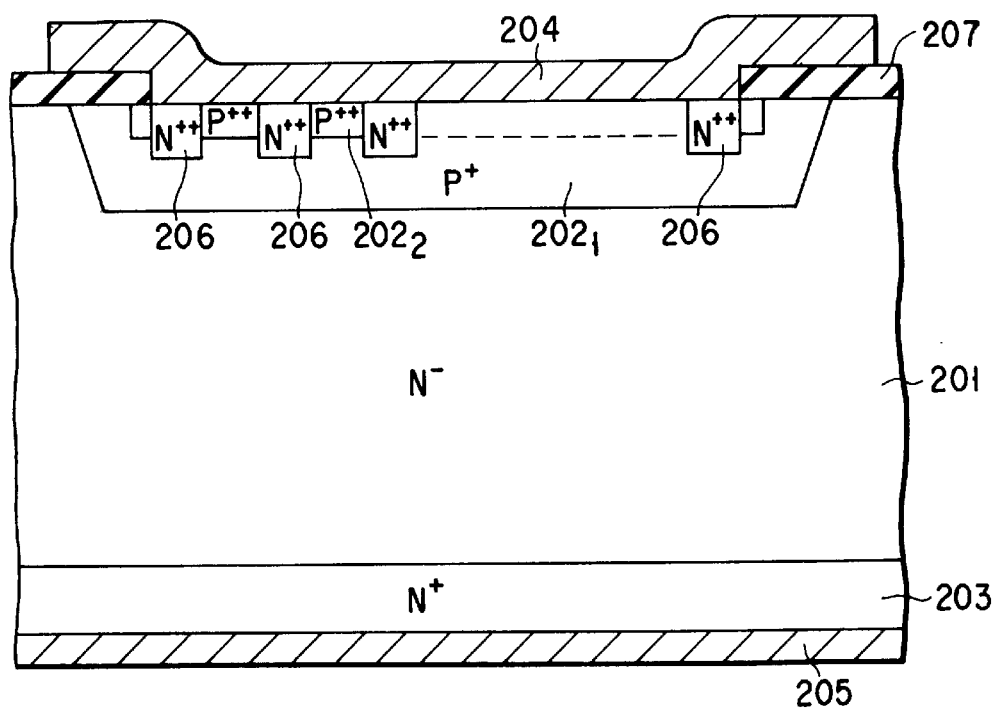

FIG. 76A is a plan view of a second conventional high-withstand voltage diode on the anode side, FIG. 76B is a cross sectional view taken along the line 76B—76B of FIG. 76A.

A P-type anode layer (emitter layer) of high impurity concentration is selectively formed by diffusion on one surface of an $N^-$-type base layer 201 of high resistance. The anode layer is constructed by a $P^+$-type layer 202$_1$ which is a main body of the $P^+$-type anode layer ($P^+$-type emitter layer) formed by diffusion on the $N^-$-type base layer 201 and a $P^{++}$-type layer 202$_2$ of higher impurity concentration formed by diffusion on the surface portion thereof.

Further, as shown in FIG. 76A, a plurality of $N^{++}$-type layers 206 of high impurity concentration having a stripe pattern are formed by diffusion in the $P^{++}$-type layer 202$_2$. An anode electrode 204 is formed in contact with both of the $P^{++}$-type layer 202$_2$ and $N^{++}$-type layers 206.

The $P^{++}$-type layer 202$_2$ is a contact layer formed to permit the anode electrode 204 to be formed in ohmic contact with the anode layer. Further, the $N^{++}$-type layer 206 is a current blocking layer for reducing the area of hole injection from the anode layer into the $N^-$-type base layer 201 and emitting electrons. Therefore, the $P^{++}$-type layer 202$_2$ and the $N^{++}$-type layer 206 are separately formed with a preset area ratio based on a suitable balance of forward voltage drop and reverse recovery current.

On the other hand, an $N^+$-type cathode layer 203 of high impurity concentration is formed on the entire surface of the other surface of the $N^-$-type base layer 201 and a cathode electrode is formed on the cathode layer. The surface portion of the $N^-$-type base layer 201 which is exposed to the anode side is covered with an oxide film 207.

Figure 77A:
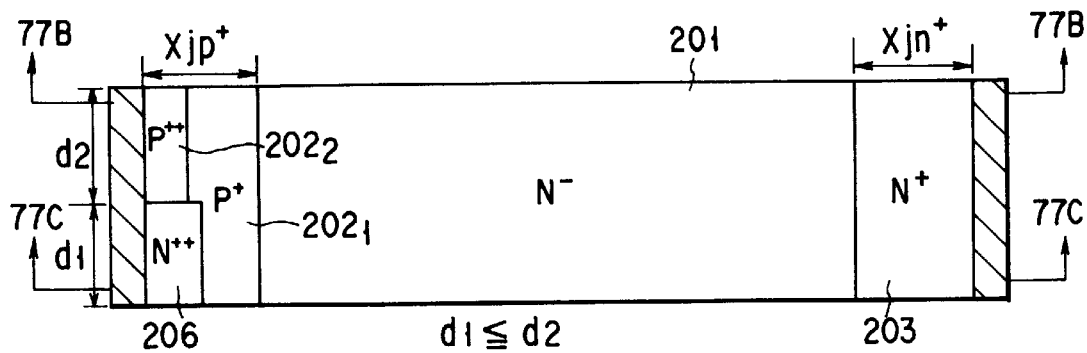
FIGS. 77A to 77D are a cross sectional view of the basic constituting portion of the second conventional high-withstand voltage diode and diagrams for illustrating the impurity concentration distribution in the element portion and the carrier concentration distribution in the ON state.
Figure 77B:
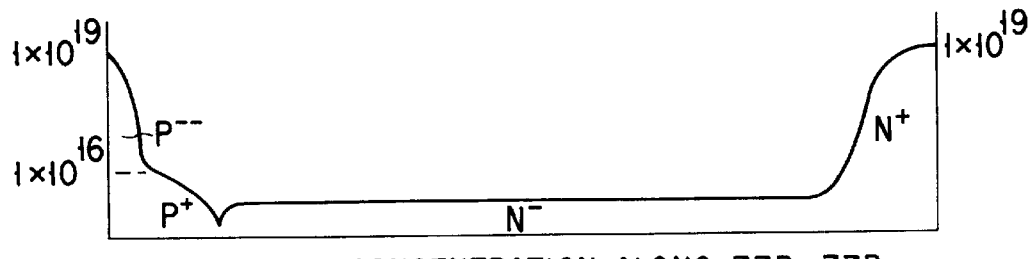
Figure 77C:
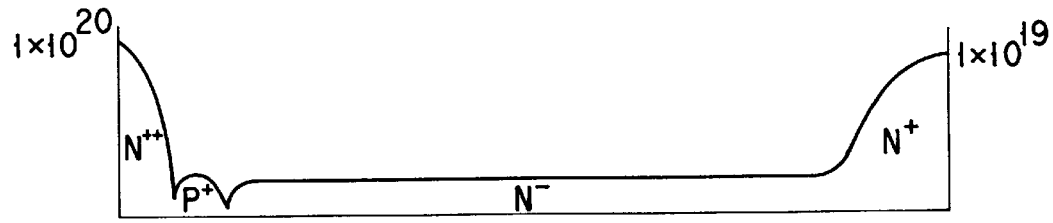

More concrete impurity concentrations and shapes of the respective portions are explained. FIG. 77A is a cross sectional view of a first basic constituting portion constructed by the $P^{++}$-type layer 202$_2$ on the anode side of the second conventional diode and the $N^{++}$-type layer 206 adjacent to the $P^{++}$-type layer 202$_2$, FIG. 77B shows the impurity concentration distribution in the cross section taken along the line 77B—77B of FIG. 77A, and FIG. 77C shows the impurity concentration distribution in the cross section taken along the line 77C—77C of FIG. 77A.

The thickness of the $N^-$-type layer 201 is 450 $\mu$m and the impurity concentration thereof is $1\times10^{13}$/cm3, the diffusion depth of the $P^+$-type layer 202$_1$ is 1.5 $\mu$m and the surface impurity concentration thereof is $1\times10^{17}$/cm$^3$, the diffusion depth of the $P^{++}$-type layer 202$_2$ is 0.3 $\mu$m and the surface impurity concentration thereof is $1\times10^{19}$/cm$^3$, the diffusion depth of the $N^{++}$-type layer 206 is 0.4 $\mu$m and the surface impurity concentration thereof is $1\times10^{20}$/cm$^3$, and the diffusion depth of the $N^+$-type cathode layer 203 is 15 $\mu$m and the surface impurity concentration thereof is $1\times10^{19}$/cm$^3$.

The sheet resistance p of a portion of the $P^+$-type layer 202$_1$ which lies under the $N^{++}$-type layer 206 is preferably set in a range of 500$\Omega$/□<$\rho$<20000$\Omega$/□.

The width d$_1$ of the $N^{++}$-type layers 206 arranged in a stripe form and the width d$_2$ of portions of the $P^{++}$-type layer 202$_2$ which are alternately arranged with the $N^{++}$-type layers are set to satisfy the relation of d$_1 \leq$d$_2$, but in this conventional case, d$_1$=d$_2$. Further, it is preferable to set the relation of d$_1$<15 $\mu$m when taking the current concentration at the reverse recovery time into consideration. As a result, the breakdown strength can be enhanced.

Figure 77D:
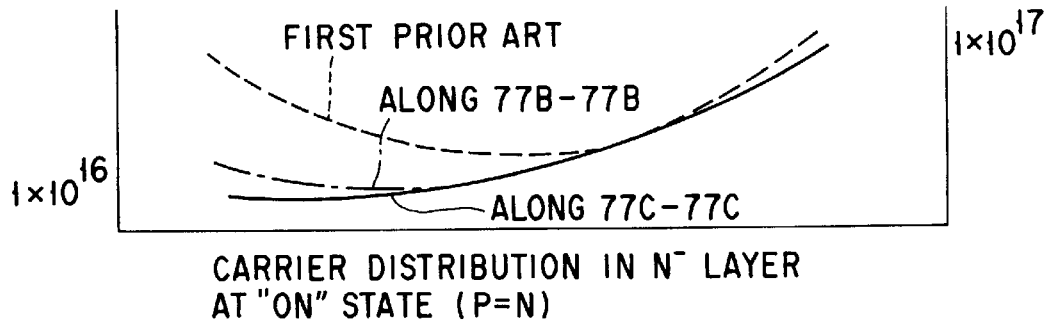

FIG. 77D shows the carrier concentration distribution in the $N^-$-type base layer 201 in the ON state (highly injected state) of the high-withstand voltage diode having the impurity concentration distributions, shapes and sizes set as described above together with that (indicated by broken lines) of the first conventional high-withstand voltage diode. In the region shown in FIG. 77D, the P-type carrier concentration and the N-type carrier concentration are equal to each other and the ordinate indicates the concentration of one of them.

According to the second conventional high-withstand voltage diode, the anode layer is mainly formed of the $P^+$-type layer 202$_1$ of lower impurity concentration in comparison with the conventional case and the $N^{++}$-type layer 206 is formed as a blocking layer for suppressing the hole injection from the anode layer. As a result, as shown in FIG. 77D, in the highly injected state, the carrier concentration distribution in the $N^-$-type base layer 201 becomes $1\times10^{17}$/cm$^3$ on the cathode side but becomes approx. $1\times10^{16}$/cm$^3$ which is smaller than the former value by an order of magnitude on the anode side. Thus, the carrier concentration in the $N^-$-type base layer 201 on the anode side becomes small and the reverse recovery characteristic can be improved.

Figure 78:
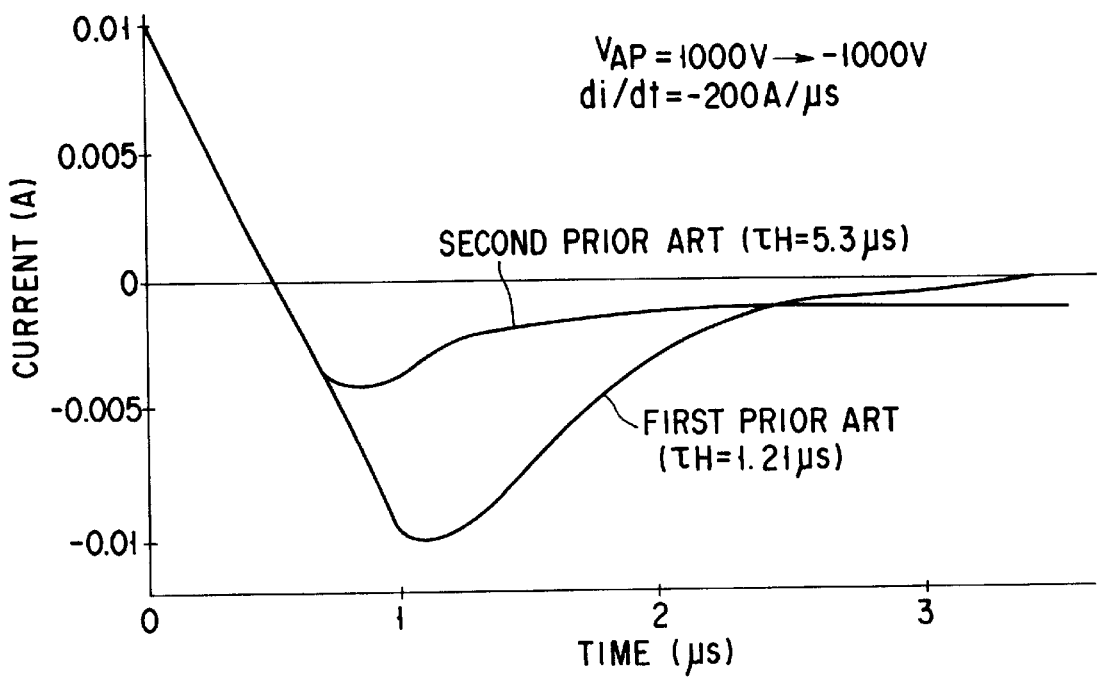
FIG. 78 is a diagram showing the reverse recovery characteristic of the second conventional high-withstand voltage diode in comparison with that of the first conventional high-withstand voltage diode.

FIG. 78 shows the reverse recovery characteristic of the second conventional high-withstand voltage diode in comparison with that of the first conventional high-withstand voltage diode. The waveforms of FIG. 78 are obtained with the current density of 100 A/cm$^2$ (ON voltage 2.6 V), applied voltage of 1000 V, and di/dt=−200 A/$\mu$s. As is understood from FIG. 78, the reverse recovery current can be kept small according to the second conventional high-withstand voltage diode and the reverse recovery characteristic can be improved.

Figure 79:
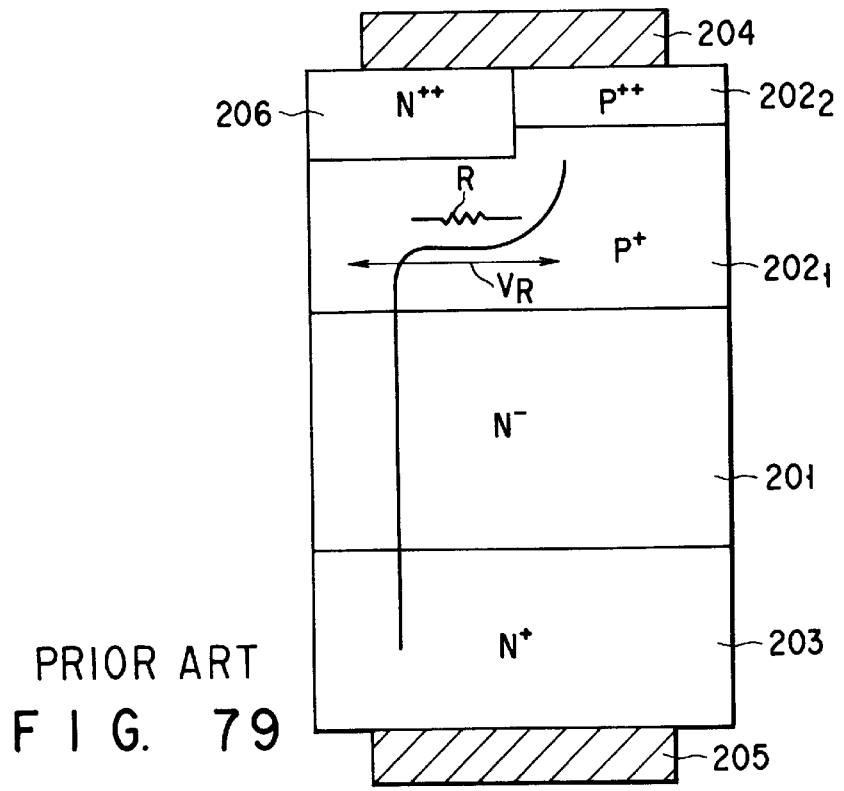
FIG. 79 is a schematic view for illustrating the parasitic transistor effect of the second conventional high-withstand voltage diode.

There may occur a possibility that a parasitic transistor effect will occur at the reverse recovery time because the $N^{++}$-type layer 206 is formed as an injection blocking layer in the anode layer. This occurs when the reverse recovery current flows in the P$^+$-type layer $202_1$ of the anode layer in the lateral direction as shown in FIG. 79 and the junction between the P$^+$-type layer $202_1$ and the N$^{++}$-type layer 206 is forwardly biased by a voltage higher than the built-in voltage (0.5 V). Therefore, it is necessary to suppress this phenomenon.

The value of a lateral voltage drop VR in the P$^+$-type layer $202_1$ directly under the N$^{++}$-type layer 206 can be expressed by VR=$\rho_{p+}$(i/2)(d$^{12}$/4) by use of the sheet resistance $\rho_{p+}$ of the P$^+$-type layer $202_1$ directly under the N$^{++}$-type layer 206, the density i of current flowing in the P$^+$-type layer $202_1$ directly under the N$^{++}$-type layer 206 and the width $d_1$ of the N$^{++}$-type layer 206.

If the voltage VR is lower than the built-in voltage (0.5 V), the parasitic transistor of N$^{++}$P$^+$N$^-$N$^+$ is not operated and the switching loss is reduced. The condition for preventing the operation of the parasitic transistor may be generally explained as follows by taking the every possible cases of separate arrangement of the P$^+$-type layer $202_1$ and N$^{++}$-type layer 206 into consideration.

First, assume that the density of a current flowing in the element is i [A/cm$^2$], the sheet resistance of the P$^+$-type layer $202_1$ directly under the N$^{++}$-type layer 206 is $\rho_{p+}$[Ω/□], a set of points in the area of the N$^{++}$-type layer 206 is A(a), and a set of points on the boundary between the area of the P$^{++}$-type layer $202_2$ and the area of the N$^{++}$-type layer 206 is B(b).

Figure 80:
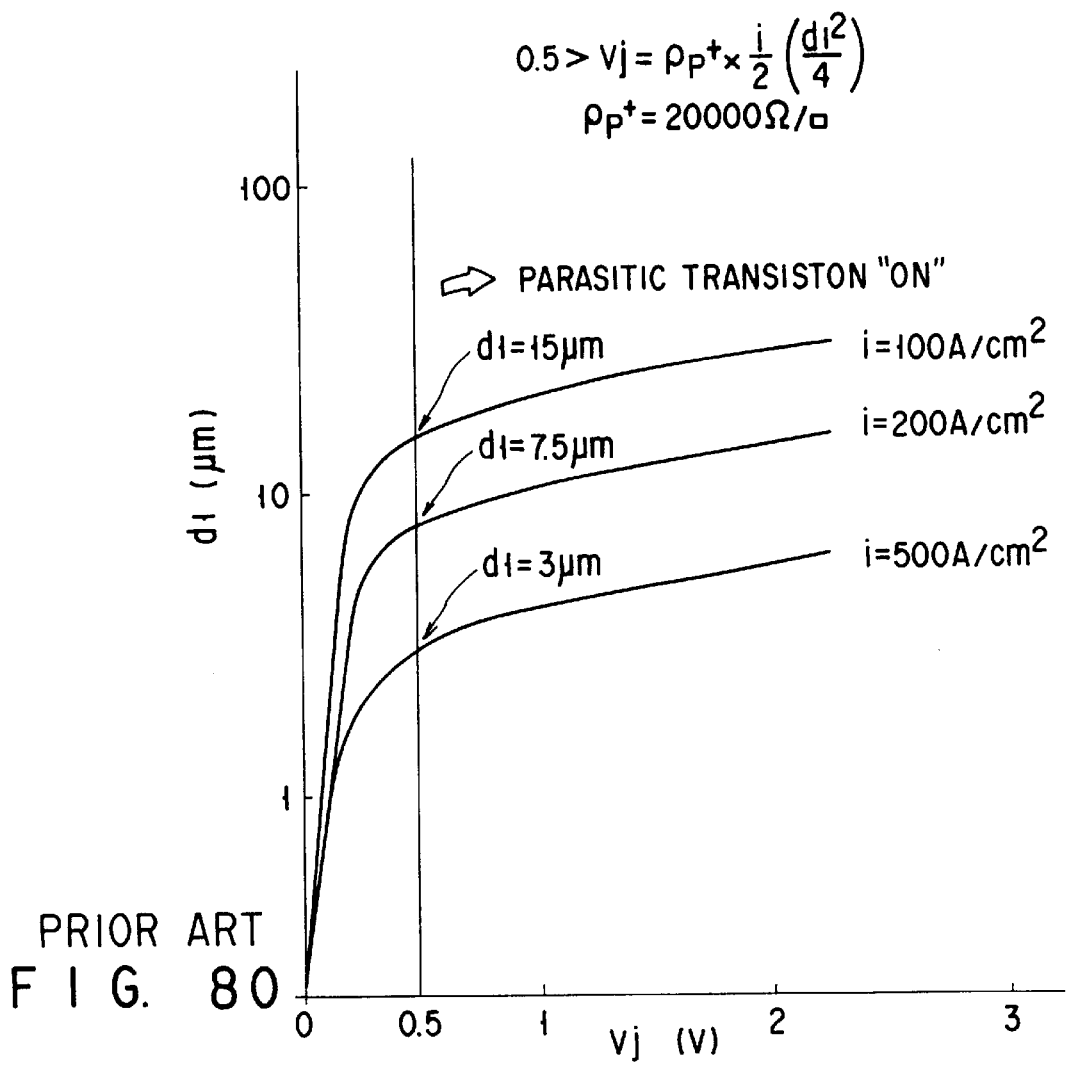
FIG. 80 is a diagram for illustrating the range of the sheet resistance and the width of an N++-type layer which is desired for suppressing the parasitic transistor effect of the second conventional high-withstand voltage diode.

When the distance from a desired point a to another point b is $d_{ab}$, a distance D is set to satisfy D=max. (min $d_{ab}$) and the junction voltage between the N$^{++}$-type layer 206 and the P$^+$-type layer $202_1$ is Vj [V], then the relation of Vj>$\rho_{p+}$(i/2)D$^2$ may be satisfied. FIG. 80 shows the condition that the parasitic transistor is operated by use of the relation between the sheet resistance $\rho_{p+}$ and the width $d_1$ of the N++-type layer 206.

When the sheet resistance of the P$^+$-type layer $202_1$ of the anode layer is 2000Ω/□ and the current density (which is equal to the maximum current value when the current concentration occurs) is 100 A/cm$^2$, Vj=0.5 V with $d_1$=15 μm. Based on this fact, it becomes necessary to set $d_1$<15 μm in order to suppress the parasitic transistor effect. When the current density is 200 A/cm$^2$, $d_1$ is set smaller than 7.5 μm, and when the current density is 500 A/cm$^2$, $d_1$ is set smaller than 3 μm.

When the element area is small and the possibility of current concentration is weak, it becomes possible to seth $d_1$ to a relatively large value. On the other hand, when the element area is large and the possibility of current concentration is strong, it is preferable to set $d_1$ smaller than 3 μm, for example.

In the second conventional high-withstand voltage diode improved, d1 must be set to as small a value as 3 μm in order to suppress the parasitic transistor effect. Therefore, there occurs a problem that the storage amount of carriers in a portion directly under the P$^{++}$-type layer $202_2$ is set to a value slightly larger than that in a portion directly under the N$^{++}$-type layer 206 and a relatively high ON voltage is generated when the current density becomes high. Thus, in the second conventional high-withstand voltage diode, it is difficult to simultaneously attain the improvement of the ON characteristic (for example, a reduction in the ON voltage) and the improvement of the reverse recovery characteristic (for example, a reduction in the reverse recovery current).

Further, as shown in FIG. 78, if an attempt is made to set the same ON voltage as in the first conventional high-withstand voltage diode, the carrier life time must be made long, and therefore, the tail current flows for a long time to cause large power loss although the reverse recovery current can be reduced at the reverse recovery time.

Figure 81A:
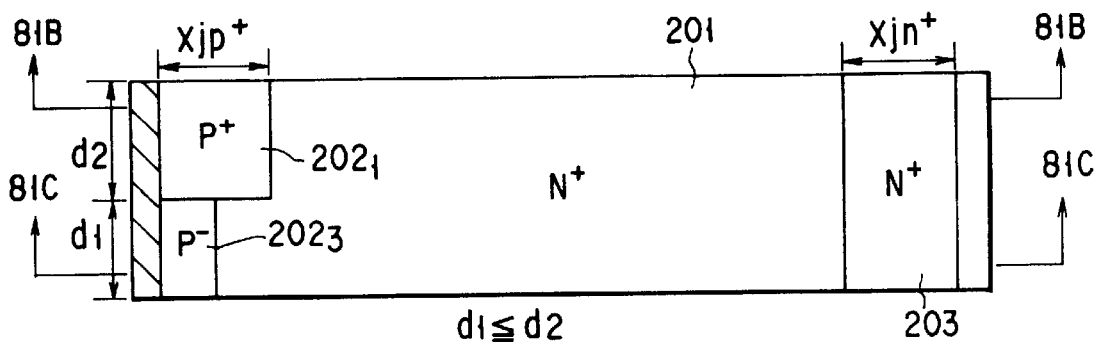
FIGS. 81A to 81D are a cross sectional view of the main portion of a third conventional high-withstand voltage diode and diagrams for illustrating the impurity concentration distribution in the element portion and the carrier concentration distribution in the ON state.
Figure 81B:
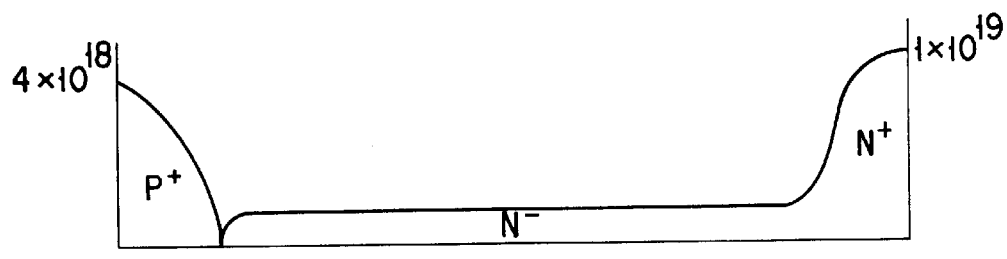
Figure 81C:
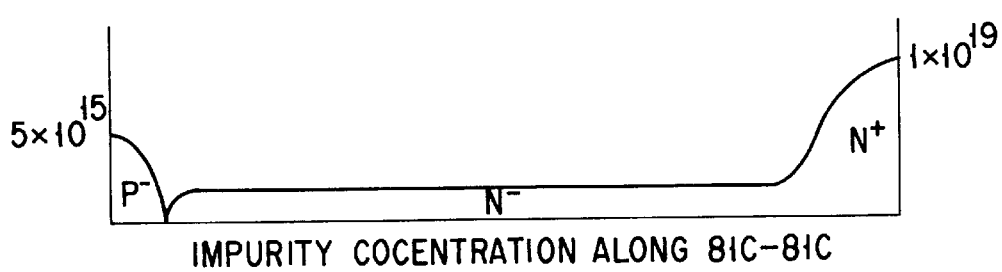

FIG. 81A is a cross sectional view of a basic constituting portion of a third conventional high-withstand voltage diode which is obtained by improving the first conventional high-withstand voltage diode, FIG. 81B shows the impurity concentration distribution in the cross section taken along the line 81B—81B of FIG. 81A, and FIG. 81C shows the impurity concentration distribution in the cross section taken along the line 81C—81C of FIG. 81A.

In the third conventional high-withstand voltage diode, P$^-$-type anode layers $202_3$ whose surface impurity concentration is lowered and whose thickness is reduced are formed by diffusion in regions in which the N$^{++}$-type layers 206 are formed in the second conventional high-withstand voltage diode.

More specifically, the P$^+$-type anode layer $202_1$ has a diffusion depth 5 μm and surface impurity concentration 4×10$^{18}$/cm$^3$, and the P$^-$-type anode layer $202_3$ has a diffusion depth 1 μm and surface impurity concentration 5×10$^{15}$/cm$^3$. Further, it is preferable to set the sheet resistance p of the P$^-$-type anode layer $202_3$ in the range of 500Ω/□<ρ<20000 Ω/□.

The width $d_1$ of the P$^-$-type anode layers $202_3$ arranged in a stripe form and the width $d_2$ of portions of the P$^{++}$-type anode layer $202_1$ which are alternately arranged with the P$^-$-type layers are set to satisfy the relation of $d_1 \leq d_2$, but in the third conventional high-withstand voltage diode, $d_1$=$d_2$.

Figure 81D:
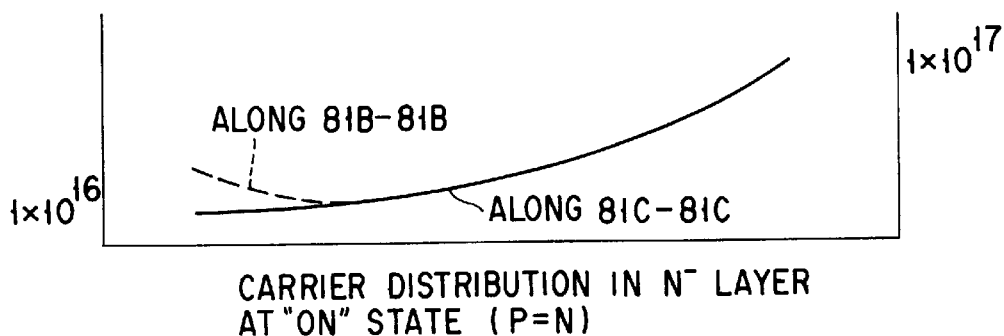

FIG. 81D shows the carrier concentration distribution in the N$^-$-type base layer 201 in the cross sections taken along the lines 81B—81B and 81C—81C in the ON state (highly injected state) of the high-withstand voltage diode having the impurity concentration distributions, shapes and sizes set as described above. Also, in the third conventional high-withstand voltage diode, the carrier concentration on the anode side is lowered, and therefore, the reverse recovery characteristic is improved.

If the width $d_1$ of the P$^-$-type anode layer $202_3$ is increased, a depletion layer is widely spread in the P$^-$-type anode layer $202_3$ and a leak current becomes large at the time of application of the reverse bias voltage as in the case where the surface impurity concentration of the P$^-$-type anode layer 202 is lowered in the first conventional high-withstand voltage diode.

Figure 82:
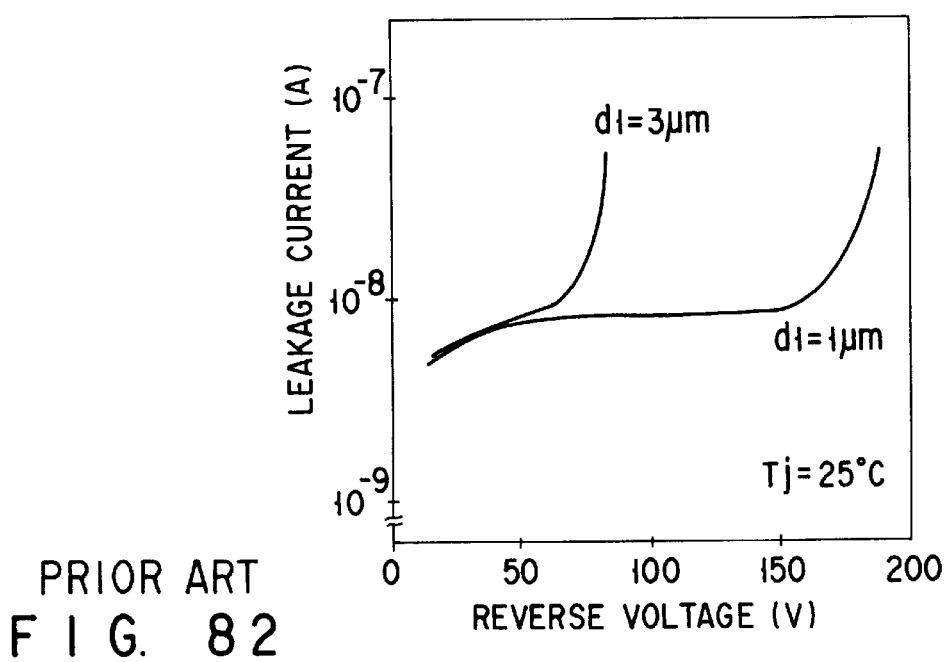
FIG. 82 is a diagram showing the relation between the reverse bias voltage and the leak current of the third conventional high-withstand voltage diode with d1 used as a parameter.

FIG. 82 is a diagram showing the relation between the reverse bias voltage and the leak current with $d_1$ used as a parameter. When $d_1$ is small, the P$^-$-type anode layer $202_3$ is shielded by a depletion layer which extends from the P$^+$-type anode layer $202_1$ so as to reduce the leak current. However, when $d_1$=3 μm, the shielding effect is reduced and the leak current becomes large.

Thus, even in the third conventional high-withstand voltage diode, $d_1$ must be set to as small a value as 3 μm in order to reduce the leak current at the time of application of the reverse bias voltage. However, if $d_1$ is set to a small value, the same carrier profile as in the first conventional case is obtained to cause a problem that the reverse recovery characteristic cannot be improved. Therefore, even in the third conventional high-withstand voltage diode, it is difficult to simultaneously attain the improvement of the ON characteristic and the improvement of the reverse recovery characteristic.

Figure 83A:
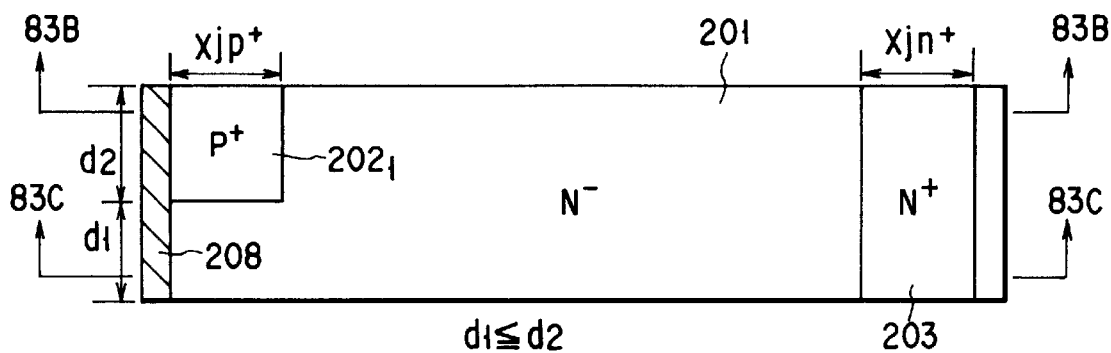
FIGS. 83A to 83D are a cross sectional view of the main portion of a fourth conventional high-withstand voltage diode and diagrams for illustrating the impurity concentration distribution in the element portion and the carrier concentration distribution in the ON state.
Figure 83B:
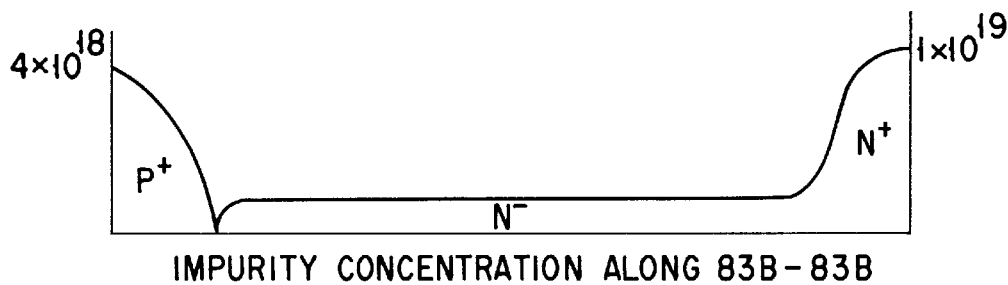
Figure 83C:
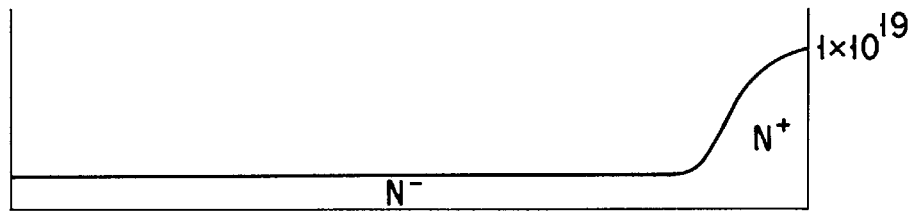
Figure 83D:
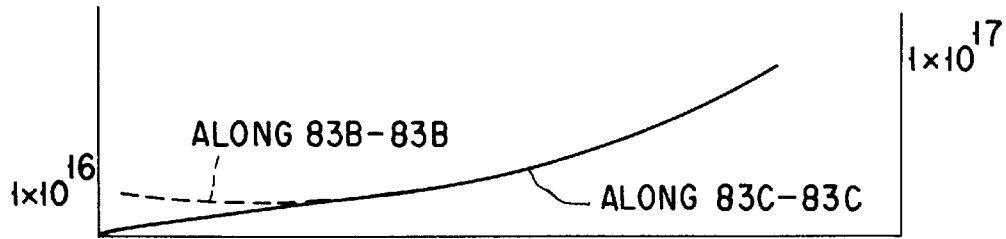

FIG. 83A is a cross sectional view of a basic constituting portion of a fourth conventional high-withstand voltage diode which is obtained by improving the first conventional high-withstand voltage diode, FIGS. 83B, 83C show the impurity concentration distributions in the cross sections taken along the lines 83B—83B, 83C—83C of FIG. 83A, and FIG. 83D shows the carrier concentration distribution in the ON state.

In the fourth conventional high-withstand voltage diode, no diffusion layer is formed in regions in which the $N^{++}$-type layers 206 are formed in the second conventional high-withstand voltage diode so that Schottky contacts 208 will be formed and only an electron current can flow.

In the fourth conventional high-withstand voltage diode, since the carrier concentration on the anode side is reduced, the reverse recovery characteristic is improved, but like the case of the third conventional high-withstand voltage diode, if $d_1$ is increased, a leak current increases at the time of application of the reverse bias voltage.

However, like the case of the third conventional high-withstand voltage diode, if $d_1$ is set to a small value, the storage amount of carriers in the cross section taken along the line 83B—83B is set to a value slightly larger than that in the cross section taken along the line 83C—83C, and therefore, a relatively high ON voltage is generated when the current density becomes high. Thus, in the fourth conventional high-withstand voltage diode, it is difficult to simultaneously attain the improvement of the ON characteristic and the improvement of the reverse recovery characteristic.

In the third and fourth conventional high-withstand voltage diodes, if an attempt is made to set the same ON voltage as in the first conventional high-withstand voltage diode, the carrier life time must be made longer as in the case of the second conventional high-withstand voltage diode, and therefore, the tail current flows for a long time to generate large power loss although the reverse recovery current flowing at the reverse recovery time is small.

As described above, various types of high-withstand voltage diodes are proposed and corresponding effects can be expected, but each of the conventional high-withstand voltage diodes has a problem that it is difficult to simultaneously attain the improvement of the reverse recovery characteristic and the improvement of the ON characteristic (improvement of loss). The following embodiments solve the above problem.

FORTY-SECOND EMBODIMENT

Figure 85A:
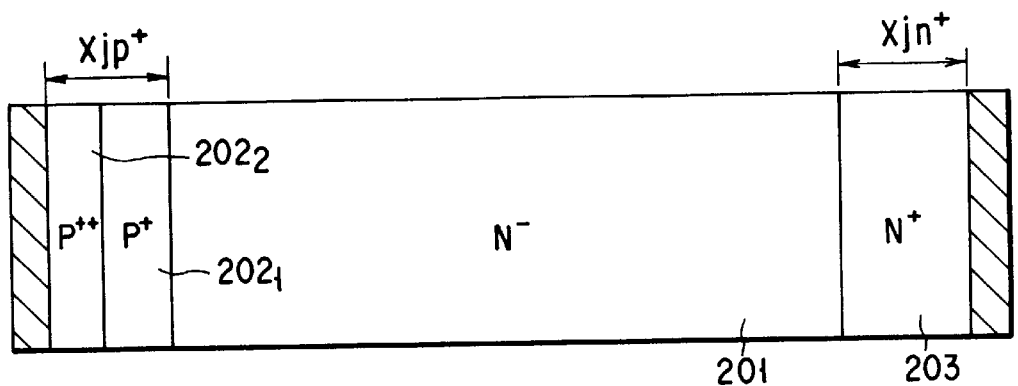
FIGS. 85A to 85C are cross sectional views of the main portion of the high-withstand voltage diode according to the forty-second embodiment and a diagram for illustrating the carrier concentration distribution in the ON state.
Figure 85B:
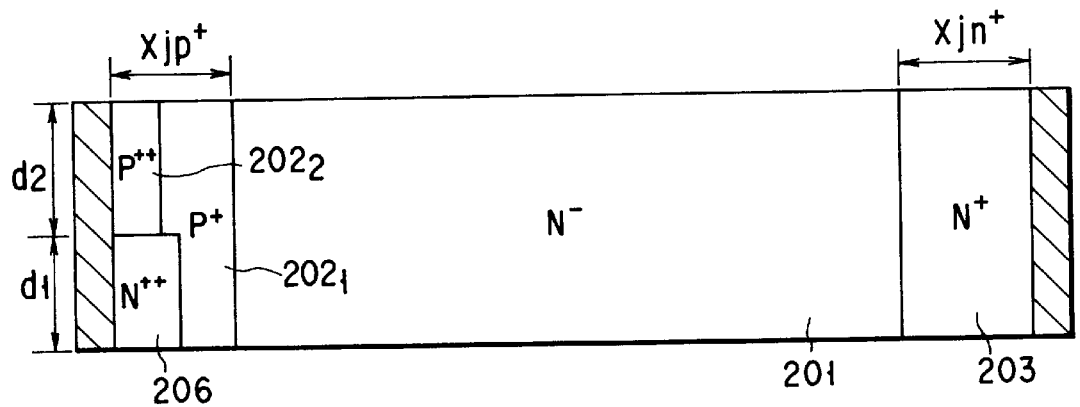
Figure 85C:
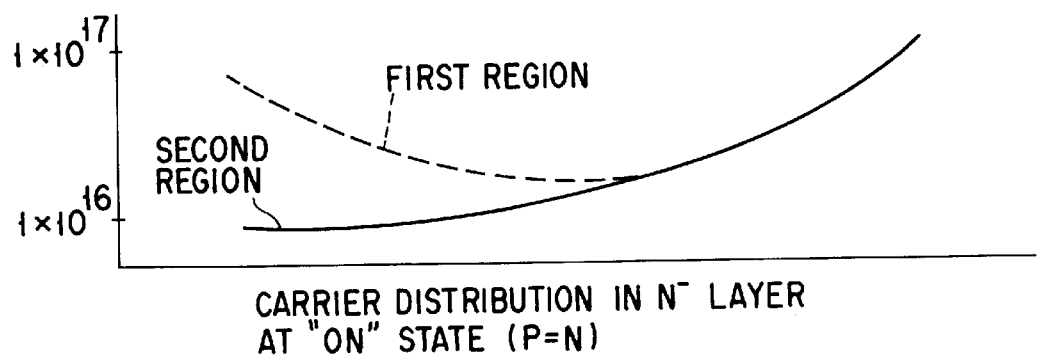

FIG. 84A is a plan view showing the element structure on the anode side of a high-withstand voltage diode according to a forty-second embodiment of this invention, and FIG. 84B is a cross sectional view taken along the line 84B—84B of FIG. 84A. FIGS. 85A and 85B are cross sectional views showing the structure of the main portion of the above high-withstand voltage diode, and FIG. 85C is a diagram showing the carrier concentration distribution in the ON state.

The high-withstand voltage diode of this embodiment utilizes the basic element structure of the second conventional high-withstand voltage diode as its basic element structure, portions corresponding to those of FIGS. 76A, 76B, FIGS. 77A to 77D are denoted by the same reference numerals and the repetitive explanation therefor is omitted.

In this embodiment, as shown in FIG. 84A, first injection regions 209 (first emitter injection regions) of high emitter injection efficiency having the basic structure of FIG. 85A and second injection regions 210 (second emitter injection regions) of low emitter injection efficiency having the basic structures of FIG. 85B formed at regular intervals are alternately arranged.

In the second region 210, the width $d_1$ of an $N^{++}$-type layer (current blocking layer) 206 is set to, for example, 3 μm or less to prevent the parasitic transistor from being operated. If the carrier diffusion length La in an $N^-$-type base layer 201 in the highly injected state is 130 μm, for example, an increase in the ON voltage can be effectively suppressed by setting the width $W_2$ of the second region 210 to 390 μm which is three times the carrier diffusion length or less.

According to this embodiment, since the widths of the first and second regions 209 and 210 can be set to relatively large values, a large difference occurs between the concentration distributions of carriers stored in the first and second regions 209 and 210 as shown in FIG. 85C.

That is, a large amount of carriers are stored in the $N^-$-type base layer 201 in the first region 209 as in the case of the first conventional high-withstand voltage diode (FIGS. 75A to 75C), and the carrier concentration in the $N^-$-type base layer 201 on the anode side is lowered in the second region 210 as in the case of the second conventional high-withstand voltage diode (FIGS. 77A to 77D). As a result, even if the current density becomes high, a sufficiently low ON voltage can be attained by the carriers stored in the first region 209.

Figure 86:
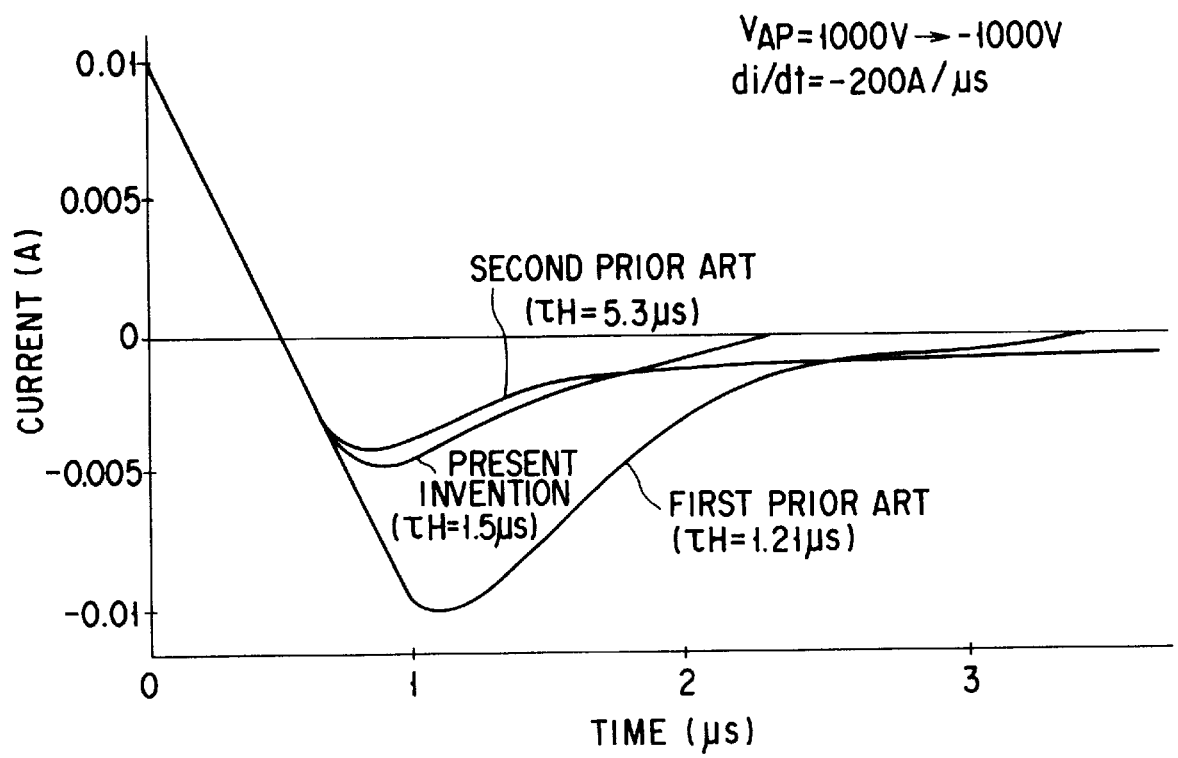
FIG. 86 is a diagram showing the reverse recovery characteristic of the high-withstand voltage diode of the forty-second embodiment in comparison with those of the first and second conventional high-withstand voltage diodes.

FIG. 86 shows the reverse recovery characteristic of the high-withstand voltage diode of this embodiment in comparison with those of the first conventional high-withstand voltage diode (first prior art) and the second conventional high-withstand voltage diode (second prior art). It is understood from FIG. 86 that, according to this embodiment, time taken for the reverse recovery current (anode current) to become 0 is shorter than in the cases of the second and third prior arts and the peak value of the reverse recovery current becomes smaller than in the case of the first prior art.

This is because the two-dimensional re-distribution of a current occurs between the first and second regions 209 and 210 at the reverse recovery time in the diode of this embodiment. Further, since the ON voltage can be lowered even when the carrier life time is shortened, a period of time for which the tail current flows at the reverse recovery time can be shortened and the power loss can be reduced.

Figure 87:
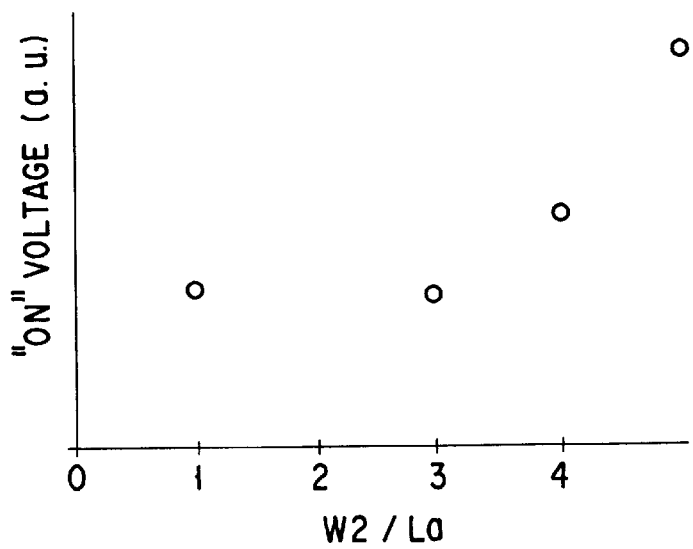
FIG. 87 is a characteristic diagram showing the relation between the ON voltage and the ratio of the width of the second region of the high-withstand voltage diode of the forty-second embodiment to the carrier diffusion length in the N⁻-type base layer.
Figure 88A:
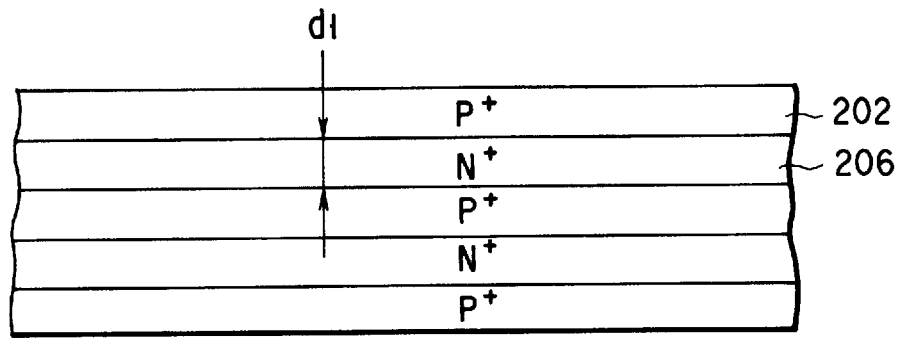
FIGS. 88A to 88E are plan views showing other examples of the anode side pattern of the second region of the high-withstand voltage diode of the forty-second embodiment.
Figure 88B:
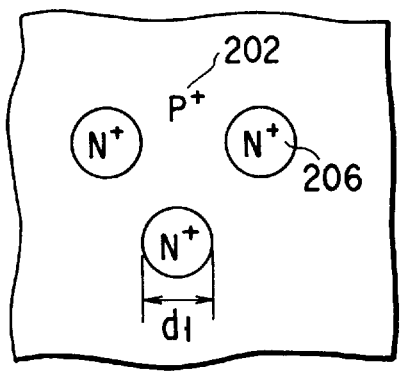
Figure 88C:
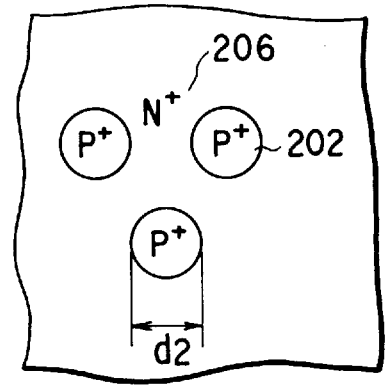
Figure 88D:
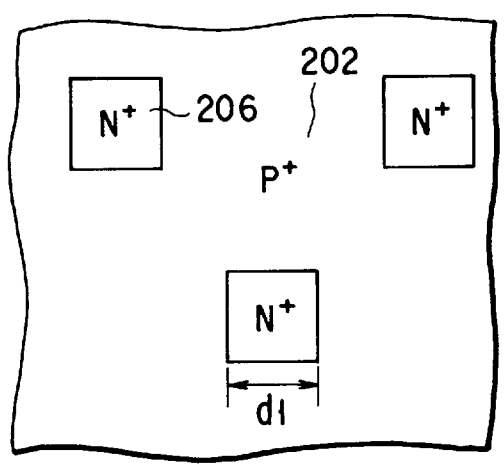
Figure 88E:
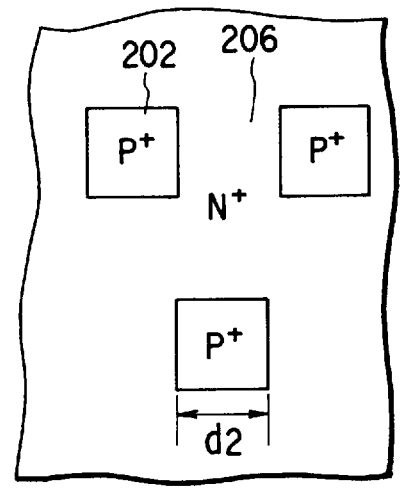

FIG. 87 is a characteristic diagram showing the relation between the ON voltage and the ratio W2/La of the width W2 of the second region 210 of the high-withstand voltage diode of the present embodiment to the carrier diffusion length La in the $N^-$-type base layer. As shown in FIG. 87, if the width W2 of the second region 210 is less than three times the carrier diffusion length La in the $N^-$-type base layer 201, an increase in the ON voltage will not occur. Therefore, in order to suppress an increase in the ON voltage, it is preferable to set W2/La <3.

FIGS. 88A to 88E are plan views showing examples of the anode side pattern in the second region 210 of the diode of the above embodiment. When one of the above patterns is selected, it is always important to suppress occurrence of a parasitic transistor by taking the condition explained in the description of the second prior art into consideration.

In FIG. 84A, the first regions 209 of stripe form and the second regions 210 of stripe form are alternately arranged, but the shapes and the arrangement pattern of the regions can be variously modified. In FIG. 89, the first regions 209 of rectangular form are arranged in the second region 210. Further, as shown in FIGS. 88A to 88E, the shapes of the regions may be stripe form, rectangular form or polka dot form.

Further, in FIGS. 84A and 89, the second region 210 of low emitter injection efficiency is arranged on the end portion of the diode region to lower the current density in a portion near the junction edge portion, but the arrangement can be variously changed. The dimensions of the region and the interval at which the regions are arranged can be changed according to the requirement of the element characteristic.

Further, in the above examples, the uniform P$^+$-type anode layer 202 is formed in the first region 209 as shown in FIG. 85A, but even if the basic structure shown in FIG. 85B is formed in the first region 209, the same effect can be attained by setting the widths d$_1$, d$_2$ to set the injection efficiency higher than that in the second region 210.

In this case, the breakdown strength can be enhanced by setting the injection efficiency in a portion of the second region 210 which is disposed in the end portion of the diode region lower than that in a portion of the second region 210 which is disposed in the central portion of the diode region.

Further, the same effect can be attained and a further strict requirement can be satisfied by using the basic structure of the second region 210, forming regions having three or more injection efficiencies by changing the widths d$_1$, d$_2$, and arranging the regions while changing the dimensions, shapes and arrangement pattern of the regions.

FORTY-THIRD EMBODIMENT

FIG. 90 is a cross sectional view showing the element structure of a high-withstand voltage diode according to a forty-third embodiment of this invention.

The high-withstand voltage diode of this embodiment which is similar to that of the forty-second embodiment is that the first and second regions are formed not only on the anode side but also on the cathode side. That is, the cathode layer is formed of an N$^+$-type layer 203$_1$ and N$^{++}$-type layers 203$_2$ with higher impurity concentration formed as first regions having a high electron injection efficiency and P$^{++}$-type layers (current blocking layers) 211 formed as second regions having a low electron injection efficiency and alternately arranged with the N$^{++}$-type layers 203$_2$.

According to this embodiment, since the carrier concentration in the N$^-$-type base layer 201 in the highly injected state becomes lower in both of the anode side and cathode side than in the conventional case, the reverse recovery characteristic is further improved. Further, in this embodiment, as shown in FIG. 90, the first regions of high emitter injection efficiency are not formed and only the second regions of low emitter injection efficiency are formed on the surface on the cathode side (lower side in the drawing) of the junction edge portion so as to lower the current density in the junction edge portion and enhance the breakdown strength at the reverse recovery time of the diode.

In this embodiment, those of the second regions (second regions of low hole injection efficiency) of low emitter injection efficiency on the anode side are formed to face those of the second regions ((second regions of low electron injection efficiency) of low emitter injection efficiency on the cathode side, but the positional relation can be variously changed. Further, it is possible to form only the second regions on one surface and set the injection efficiency of those of the second regions 210 which are disposed in the end portion of the diode region lower than the injection efficiency of those of the second regions 210 which are disposed in the central portion of the diode region to enhance the breakdown strength at the reverse recovery time of the diode.

FORTY-FOURTH EMBODIMENT

FIG. 91 is a cross sectional view showing the element structure of a high-withstand voltage diode according to a forty-fourth embodiment of this invention. This embodiment is a combination of the forty-second embodiment and the fourth embodiment. That is, the high-withstand voltage diode of this embodiment is obtained by forming a P$^-$-type emitter layer 53 of low impurity concentration around and in contact with the P-type emitter layer 202$_1$ in the high-withstand voltage diode of FIG. 84B.

In this case, like the fourth embodiment, the impurity concentration of the P$^-$-type emitter layer 53 is suppressed in such a range that the P$^-$-type emitter layer will not be completely depleted at the time of application of the reverse voltage so as to lower the injection efficiency. According to this embodiment, the effect that the breakdown strength can be enhanced by forming the P$^-$-type emitter layer 53 can be attained in addition to the effect of the forty-second embodiment.

FORTY-FIFTH EMBODIMENT

FIG. 92 is a cross sectional view showing the element structure of a high-withstand voltage diode according to a forty-fifth embodiment of this invention. This embodiment is a combination of the forty-second embodiment and the first embodiment. That is, the high-withstand voltage diode of this embodiment is obtained by setting the end portion of the N-type emitter layer 203 on the inner side with respect to the end portion of the P-type emitter layer 202$_1$ in the high-withstand voltage diode of FIG. 84B. It is possible to set the above two end portions to correspond in position to each other.

According to this embodiment, the following effect can be attained in addition to the effect of the forty-second embodiment. That is, even when the highest electric field point occurs in a portion near the end portion of the P-type emitter layer 202$_1$, no avalanche current due to carrier concentration occurs and the breakdown strength can be enhanced.

FORTY-SIXTH EMBODIMENT

Figure 93:
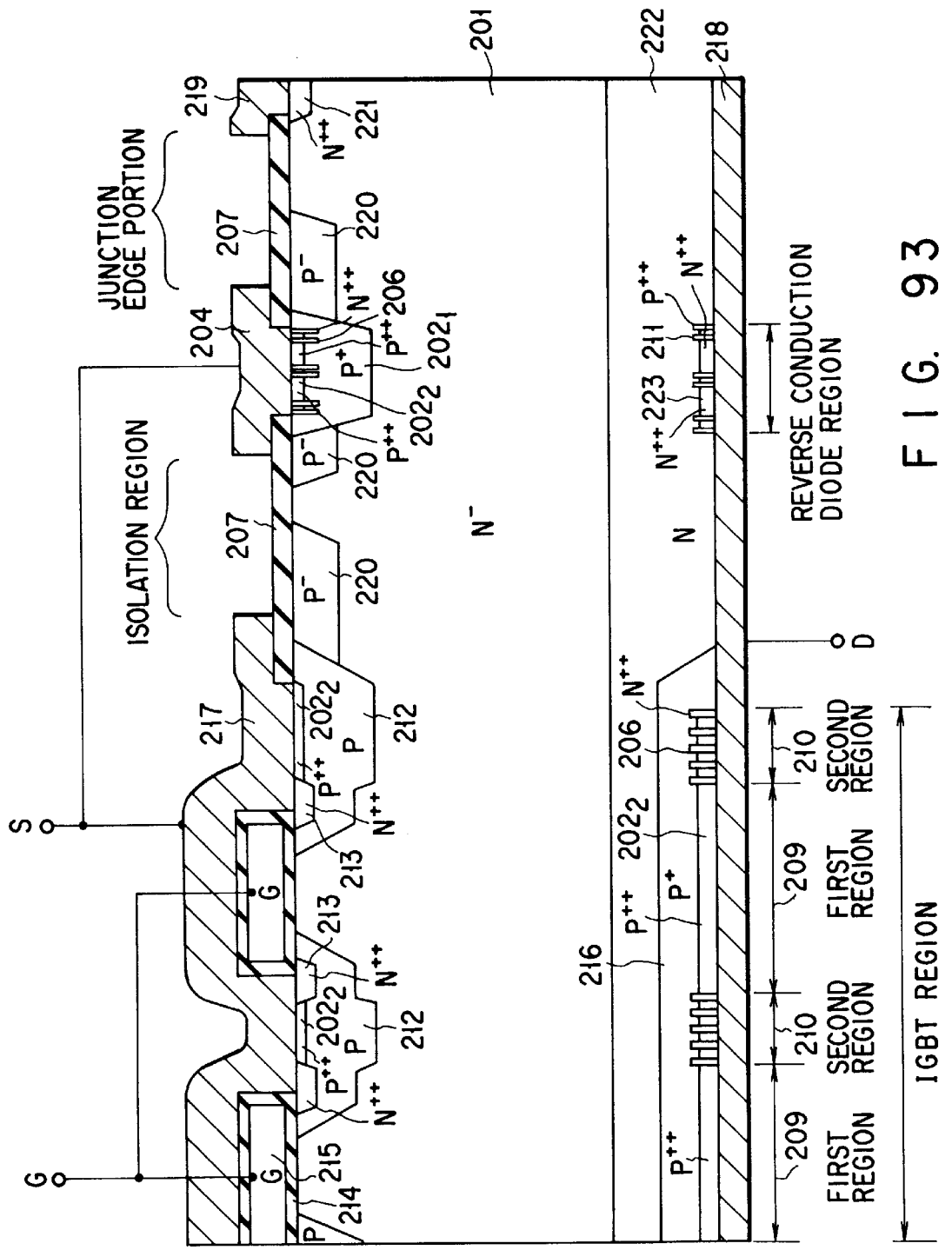
FIG. 93 is a cross sectional view showing the element structure of a reverse-conducting IGBT according to a forty-sixth embodiment of this invention.

FIG. 93 is a cross sectional view showing the element structure of a reverse-conducting IGBT according to a forty-sixth embodiment of this invention. The reverse-conducting IGBT of this embodiment is roughly divided into an IGBT region and a reverse-conducting diode region.

First, the IGBT region is explained. P-type layers (P base layers) 212 are selectively formed on the surface of an N$^-$-type base layer 201 and N$^{++}$-type layers (source layers) 213 are formed in the surface portions of the P-type layers. Gate electrodes 215 are formed on gate insulating films 214 which are each formed on a portion of the P-type layer (P base layer) which lies between the N$^{++}$-type layer (source layer) 213 and the N$^-$-type base layer 201. A high-impurity concentration portion of the P-type layer (P base layer) 212 is formed by diffusion to extend to the N$^{++}$-type layer (source layer) 213 so as to prevent the latch-up operation of the IGBT. A P$^{++}$-type layer 202$_2$ is formed on the surface of the P-type layer (P base layer) 212 and the P$^{++}$-type layer 202$_2$ as well as an N$^{++}$-type layer (source layer) 213 is formed in ohmic contact with a source electrode 217.

On the other hand, an N buffer layer 222 is formed on the rear surface of the N$^-$-type base layer 201 and a P$^+$-type layer (drain layer) 216 is selectively formed in the N buffer layer. The N buffer layer 222 and P$^+$-type layer 216 are formed in ohmic contact with a drain electrode 218.

In this embodiment, the same structure as that formed on the surface on the anode side of the high-withstand voltage diode of the forty-second embodiment is formed in the P⁺-type layer (drain layer) 216. That is, second regions 210 whose injection efficiency is lowered by N⁺⁺-type layers (current blocking layers) 206 and first regions 209 with high injection efficiency are formed in the surface portion of the P⁺-type layer (drain layer) 216.

In this embodiment, the first regions 209 with high injection efficiency are formed in portions which lie below the gate electrodes 215 and act as main current paths in the ON state and the second regions 210 with low injection efficiency are disposed in the other portions so as to prevent unnecessary carrier storage.

Next, the reverse-conducting diode region is explained. P-type layers $202_1$ are selectively formed on the surface of the N⁻-type base layer 201, first and second regions for controlling the injection efficiency are formed in the surface portion of the P-type layer, and an anode electrode 204 of the reverse-conducting diode is formed in ohmic contact with the first and second regions.

Further, second regions whose emitter injection efficiency is lowered by P⁺⁺-type layers (current blocking layers) 211 and first regions with high emitter injection efficiency are formed on the surface of the N-type buffer layer 222 which is formed on the rear surface of the N⁻-type base layer 201. The first and second regions are set in ohmic contact with the drain electrode 218 of the IGBT. The drain electrode 218 of the IGBT acts as the cathode electrode of the reverse-conducting diode.

Further, an isolation region which is sufficiently longer than the carrier diffusion length is formed between the IGBT region and the reverse-conducting diode region to prevent the remaining carriers in the reverse-conducting diode region from being diffused into the IGBT region.

With the above structure, even if the polarity of a voltage applied between the source electrode 217 and the drain electrode 218 is inverted immediately after a reverse-conducting diode current has flowed, a leak current discharged from the source electrode 217 of the IGBT can be suppressed to a sufficiently small value.

In order to prevent the withstand voltage from being lowered in the isolation region, P⁻-type layers (RESURF layers) 220 are formed to alleviate the electric field. For the same reason, P⁻-type layers (RESURF layers) 220 are formed in the junction edge portion to attain the high withstand voltage. An N⁺⁺-type layer 221 is a channel stopper layer for stopping the expansion of the depletion layer.

According to this embodiment, injection of holes from the drain layer is suppressed in the IGBT region and storage of carriers in a portion near the drain electrode 218 is suppressed to improve the turn-OFF characteristic.

Further, in the reverse-conducting diode region, since the injection efficiency on the cathode side can be freely determined by the first and second regions, the diode characteristic can be set independently from the IGBT characteristic.

Generally, in a method such as an electron beam irradiation method for controlling the carrier life time of the semiconductor device, it is difficult to separately control the carrier life times in the IGBT region and the reverse-conducting diode, and therefore, the method of this invention by which the injection efficiency can be determined by the pattern is an extremely effective method because the characteristics of respective elements of a composite device can be independently and adequately determined.

In the forty-second to forty-sixth embodiments, the structure of FIG. 85B is used as the basic structure constituting the second region, but the same effect can be attained by using the structure of FIGS. 81A, 83A or modified structure thereof instead of the above structure.

Further, the characteristic can be further enhanced by using a combination of heavy metal diffusion, electron beam irradiation and proton or helium doping in the structure of the above embodiments to change the carrier life time in the element.

As shown in the embodiment in which this invention is applied to the reverse-conducting IGBT, the trade-off between the turn-OFF loss (reverse recovery characteristic) and the ON voltage can be improved by applying the emitter structure (anode structure of the diode) of this invention to the emitter of various types of semiconductor devices.

This invention is not limited to the above embodiments. For example, in the above embodiments, the high-withstand voltage diode is mainly explained, but this invention can be applied to a high-withstand voltage semiconductor device such as a thyristor, bipolar power transistor, IGBT having the same diode structure as the above device.

Further, in the above embodiments, a case wherein the N-type base substrate is used is explained, but it is possible to use a P-type base substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A high-withstanding voltage semiconductor device comprising:

a first semiconductor layer of a first conductivity type having a first and a second main surface;

a second semiconductor layer of a second conductivity type selectively formed on the first main surface of said first semiconductor layer and directly surrounded by at least one of a fourth semiconductor layer of a second conductivity type and said first semiconductor layer on the first main surface thereof, said second semiconductor layer having a first region having a relatively high injection efficiency and a second region having a relatively low injection efficiency, said first region being surrounded by said second region, and said fourth semiconductor layer having a lower injection efficiency than that of said second region;

a third semiconductor layer of the first conductivity type formed on the second main surface of said first semiconductor layer;

a first electrode formed on said second semiconductor layer of the second conductivity type and connected to said first region and said second region of said second semiconductor layer; and a second electrode formed on said third semiconductor layer of the first conductivity type.

2. A semiconductor device according to claim 1, wherein said second region of said second semiconductor layer has an impurity concentration lower than that of said first region.

3. A semiconductor device according to claim 1, wherein a thickness of said first region of said second semiconductor layer is set equal or greater than a thickness of said second region of said second semiconductor layer.

4. A high-withstanding voltage semiconductor device according to claim 1, wherein said second region of said semiconductor layer contacts said fourth semiconductor layer and said first semiconductor layer, and is surrounded by said fourth semiconductor layer and said first semiconductor layer.

5. A high-withstanding voltage semiconductor device according to claim 1, further comprising a fifth semiconductor layer of the second conductivity formed on the first main surface of said first semiconductor layer so as to be apart from and surround said second semiconductor layer, wherein said second region of said second semiconductor layer contacts said first semiconductor layer and is surrounded by said first semiconductor layer.

* * * * *